United States Patent [19]

Okudaira et al.

[11] Patent Number: 5,418,388
[45] Date of Patent: May 23, 1995

[54] SEMICONDUCTOR DEVICE HAVING A CAPACITOR WITH AN ADHESION LAYER

[75] Inventors: Tomonori Okudaira; Takeharu Kuroiwa, both of Hyogo, Japan

[73] Assignee: Mitsubishi Denki Kabushiki Kaisha, Tokyo, Japan

[21] Appl. No.: 214,512

[22] Filed: Mar. 18, 1994

[30] Foreign Application Priority Data

Jun. 18, 1993 [JP] Japan .................. 5-147992

[51] Int. Cl.$^6$ ........................................ H01L 29/78
[52] U.S. Cl. ............................ 257/295; 257/310; 257/752; 257/753
[58] Field of Search .............. 257/306, 310, 295, 752, 257/753

[56] References Cited

U.S. PATENT DOCUMENTS

| | | | |
|---|---|---|---|
| 5,005,102 | 4/1991 | Larson | 257/295 |
| 5,046,043 | 9/1991 | Miller et al. | 257/295 |
| 5,081,559 | 1/1992 | Fazan et al. | 257/306 |
| 5,187,638 | 2/1993 | Sandhu et al. | 257/310 |
| 5,335,138 | 8/1994 | Sandhu et al. | 257/310 |

FOREIGN PATENT DOCUMENTS 2-83978 3/1990 Japan .................. 257/763
3-256358 11/1991 Japan .

OTHER PUBLICATIONS

Etched Shape Control of Single Crystalline Silicon in Reactive Ion Etching Containing Chlorine, Masaaki Sato et al. 1985 Dry Process Symposium, pp. 102–107.
"A Stacked Capacitor with $(Ba_xSr_{1-x})TiO^3$ For 256M DRAM", Kuniaki Koyama et al., 1991 IEEE, pp. 32.1.1–32.1.4.

*Primary Examiner*—Robert P. Limanek
*Attorney, Agent, or Firm*—Lowe, Price, LeBlanc & Becker

[57] ABSTRACT

In a semiconductor device and a method of manufacturing the same, adhesion between a capacitor dielectric film made of material having a high dielectric constant and an interlayer insulating film located thereunder is improved, and a leak current from a capacitor lower electrode is effectively prevented. In the semiconductor device, an adhesion layer (11) made of $TiO_2$, $ZrO_2$, $Ta_2O_5$, $Si_3N_4$ or $Al_2O_3$ is interposed between the interlayer insulating film made of a silicon oxide film and the capacitor dielectric film made of material having a high dielectric constant. The adhesion layer improves adhesion between the interlayer insulating film and the capacitor dielectric film.

11 Claims, 49 Drawing Sheets

SEMICONDUCTOR DEVICE HAVING A CAPACITOR WITH AN ADHESION LAYER

BACKGROUND OF THE INVENTION

1. Field of the Invention

The present invention relates to a semiconductor device and a method of manufacturing the same, and in particular to a dynamic random access memory (DRAM) and a method of manufacturing the same.

2. Description of the Background Art

A demand for semiconductor memory devices is rapidly increasing as information equipments such as computers have come to be widely used. Functionally, devices having large storage capacity and capable of high speed operation are in great demand. Correspondingly, technique has been developed for improving degree of integration, higher responsiveness and reliability of the semiconductor memory device.

DRAMs (Dynamic Random Access Memories) are well known as semiconductor memory devices which allow random input and output of storage information. In general, the DRAM includes a memory cell array which is a storage region storing a large number of storage information and a peripheral circuitry for external input and output.

FIG. 71 is a block diagram showing a structure of a conventional DRAM. Referring to FIG. 71, a DRAM 150 includes a memory cell array 151 storing data of storage information, a row and column address buffer 152 externally receiving an address signal which is used for selecting a memory cell forming a unit storage circuit, row and column decoders 153 and 154 decoding the address signal and thereby designating the memory cell, a sense refresh amplifier 155 amplifying and reading a signal stored in the designated memory cell, data-in and data-out buffers 156 and 157 for input and output of data, and a clock generator 158 generating a clock signal.

The memory cell array 151 which occupies a large area on the semiconductor chip is formed of a plurality of memory cells which are arranged in a matrix form and each are adapted to store the unit storage information. FIG. 72 is an equivalent circuit diagram showing the memory cells for four bits in the memory cell array 151. Referring to FIG. 72, each memory cell is formed of one MOS (Metal Oxide Semiconductor) transistor and one capacitor connected thereto. The memory of the above structure is called a memory cell of one-transistor/one-capacitor type. Since the memory cell of this type has a simple structure, degree of integration of the memory cell array can be easily increased, so that they are widely used in DRAMs of a large capacity.

The memory cells of the DRAMs utilize several types of capacitors, which are distinguished from each other according to their structures. Among these, in a stacked type capacitor, a major portion of the capacitor is extended up to positions above a gate electrode and a field isolating film for increasing opposing areas of electrodes in the capacitor. This increases a capacitance of the capacitor. The stacked type capacitor having the above feature ensures a sufficient capacitor capacitance even if elements are miniaturized in accordance with high integration of the semiconductor device. Consequently, the stacked type capacitors have been widely used in accordance with high integration of the semiconductor devices.

The semiconductor devices are now being improved to achieve higher degree of integration, and correspondingly the stacked type capacitors are now being developed. More specifically, in order to ensure sufficient capacitor capacitances required for storage operations of further miniaturized elements, there has been proposed a DRAM in which bit lines are buried and capacitor insulating films are formed of dielectric films, which are made of material having a high dielectric constant (referred to as "highly dielectric films" hereinafter).

FIG. 73 is a cross section showing the DRAM proposed in the prior art. In this DRAM, a silicon substrate 201 is provided at a predetermined region on its main surface with an element isolating oxide film 202 for isolating elements. The element isolating oxide film 202 surrounds a region in which source/drain regions 206a, 206b, 206c and 206d spaced by a predetermined distance are formed with channel regions 221 therebetween. Gate electrodes (word lines) 204b and 204c are formed on the channel regions 221 with a gate oxide film 205 therebetween. Word lines (gate electrodes) 204d and 204e are formed on the element isolating oxide film 202 with a predetermined space between each other.

The gate electrodes 204b, 204c, 204d and 204e are covered with an insulating film 207. The source/drain region 206a is electrically connected to a buried bit line 208, which is covered with an insulating film 209. An interlayer insulating film 210 having a flat surface is formed to cover the entire surface. The interlayer insulating film 210 is provided at predetermined regions with contact holes 210a. A polysilicon plug 211 which is electrically connected to the source/drain regions 206b, 206c or 206d is disposed in each contact hole 210a.

Adhesion layers 212 made of Ti are formed on the interlayer insulating film 210 and polysilicon plugs 211, and are electrically connected to the polysilicon plugs 211. Barrier layers 213 made of TiN are formed on the adhesion layers 212. Platinum layers 214 forming capacitor lower electrodes are formed on the barrier layers 213. The platinum layers 214 are covered with a highly dielectric film 215 which is made of $SrTiO_3$ or the like and is formed on the platinum layers 214 and the interlayer insulating film 210. The highly dielectric film 215 is covered with a platinum layer 216 forming a capacitor upper electrode.

An interlayer insulating film 217 having a flat surface is formed on the platinum layer 216. Aluminum interconnections 218 are formed on the interlayer insulating film 217 with a predetermined space between each other. The aluminum interconnections 218 are covered with a protection film 219, on which an aluminum interconnection 220 is formed.

The platinum layer 214, highly dielectric film 215 and platinum layer 216 form a capacitor 250. The source/drain regions 206a and 206c and the gate electrode 204b form one of transfer gate transistors 203. The source/drain regions 206a and 206b and the gate electrode 204c form another one of transfer gate transistors 203.

The adhesion layers 212 are provided for the purpose of improving adhesion between the platinum layers 214 and the interlayer insulating film 210. The barrier layers 213 are provided for the purpose of preventing silicide reaction of the polysilicon plugs 211 and the platinum layers 214.

FIGS. 74–82 are cross sections showing a process for manufacturing the conventional DRAM shown in FIG.

73. The process for manufacturing the DRAM in the prior art will be described below.

As shown in FIG. 74, an element isolating oxide film 202 made of a silicon oxide film is formed in the predetermined region on the main surface of the silicon substrate 201 by an LOCOS (Local Oxidation of Silicon) method. Then, the gate oxide film 205 is formed, e.g., by thermal oxidation. The gate electrodes (word lines) 204b, 204c, 204d and 204e, which are made of polysilicon doped with a large amount of phosphorus, are selectively formed on the gate oxide film 205 and the element isolating oxide film 202. The insulating films 207 covering the gate electrodes 204b, 204c, 204d and 204e are formed. Ion implantation of impurity is carried out using the insulating films 207 as a mask to form the source/drain regions 206a, 206b, 206c and 206d.

A polysilicon layer is formed on the whole surface, and then is patterned into a predetermined configuration to form the buried bit line 208 which is in direct contact with the source/drain region 206a. The insulating film 209 covering the buried bit line 208 is formed. Thereafter, the interlayer insulating film 210 of about 5000 to 10000 Å in thickness is formed on the whole surface by the CVD method.

As shown in FIG. 75, a resist 222 is formed in predetermined regions on the surface of the interlayer insulating film 210. Using the resist 222 as a mask, anisotropic etching is effected on the interlayer insulating film 210 to form the contact holes 210a as shown in FIG. 76.

As shown in FIG. 77, a polysilicon layer 211a of a predetermined thickness filling the contact holes 210a is formed on the interlayer insulating film 210. Etchback is effected on the polysilicon layer 211a to form the polysilicon plugs 211 as shown in FIG. 78.

As shown in FIG. 79, a titanium layer 212a, a TiN layer 213a and a platinum layer 214a are sequentially formed on the polysilicon plugs 211 and interlayer insulating film 210. A resist 223 is formed on predetermined regions 223 on the platinum layer 214a. Using the resist 223 as a mask, anisotropic etching is effected on the platinum layer 214a, TiN layer 213 and titanium layer 212a to form the adhesion layers 212, barrier layers 213 and platinum layers (i.e., capacitor lower electrodes) as shown in FIG. 80.

Then, as shown in FIG. 81, the high dielectric film 215 covering the platinum layers 214 is formed on the platinum layers 214 and interlayer insulating film 210 by the sputter method or the like. The highly dielectric film 215 is made of $SrTiO_3$, $Pb(Zr, Ti)O_3$ or the like. The platinum layer 216 forming the capacitor upper electrode is formed to cover the highly dielectric film 215 by the sputter method.

As shown in FIG. 82, the interlayer insulating film 217 covering the platinum layer 216 is formed by the CVD method. The aluminum interconnections 218, which correspond to the word lines 204b, 204c, 204d and 204e, respectively and are spaced by a predetermined distance from each other, are formed on the interlayer insulating film 217.

Finally, as shown in FIG. 73, the protection film 219 made of a silicon oxide film and covering the aluminum interconnections 218 are formed by the CVD method. The aluminum interconnection 220 is formed on the protection film 219. In this manner, the conventional DRAM is formed.

In the conventional DRAM shown in FIG. 73, the adhesion layer 212 made of Ti can achieve good adhesion between the interlayer insulating film 210 and the platinum layer 214 forming the capacitor lower electrode.

In the conventional structure, however, good adhesion cannot be obtained between the highly dielectric film 215 and the interlayer insulating film 210. This problem is peculiar to the case where the capacitor dielectric film is made of a material having a high dielectric constant and a high melting point. If the capacitor dielectric film is formed of a silicon oxide film or the like having a low dielectric constant, good adhesion is obtained between the capacitor dielectric film and the silicon oxide film disposed under the same, so that no problem is caused relating to the adhesion of the capacitor dielectric film. However, in the case where the capacitor dielectric film is formed of the highly dielectric film described above, a problem arises in connection with the adhesion between the capacitor dielectric film and the interlayer insulating film 210 made of the silicon oxide film and located under the same. If good adhesion is not obtained between the highly dielectric film 215, i.e., capacitor dielectric film and the interlayer insulating film 210, the high dielectric film 215 may be separated, resulting in reduction of the overall reliability of the capacitor.

In the conventional structure shown in FIG. 73, the adhesion layer 212 is interposed between the platinum layer 214 and the interlayer insulating film 210 for improving the adhesion between the platinum layer 214 and the interlayer insulating film 210. This unpreferably increases a difference in level at a stepped portion including the adhesion layer 212, barrier layer 213 and platinum layer 214.

SUMMARY OF THE INVENTION

An object of the invention is to provide a semiconductor device, in which adhesion between a capacitor dielectric film made of material of a high dielectric constant and an interlayer insulating film disposed thereunder is improved.

Another object of the invention is to provide a semiconductor device, in which a difference in level at a region of a capacitor lower electrode is reduced.

Still another object of the invention is to provide a method of manufacturing a semiconductor device, in which adhesion between a capacitor dielectric film made of material of a high dielectric constant and an interlayer insulating film disposed thereunder is improved.

According to an aspect of the invention, a semiconductor device includes a semiconductor substrate, an interlayer insulating film formed on the semiconductor substrate and being provided at a predetermined region with an opening reaching the semiconductor substrate, a plug electrode making electrical contact in the opening with the semiconductor substrate and filling the opening, a capacitor lower electrode formed on the plug electrode and the interlayer insulating film and electrically connected to the plug electrode, a capacitor dielectric film made of material having a high dielectric constant, being formed on the capacitor lower electrode and the interlayer insulating film and covering the capacitor lower electrode, and a capacitor upper electrode formed on the capacitor dielectric film. In the semiconductor device, an adhesion layer is formed at least between the interlayer insulating film and the capacitor dielectric film. The adhesion layer is made of material which has a good adhesion property with respect to at least the interlayer insulating film and the capacitor dielectric film.

Preferably, the adhesion layer is extended to a position between the interlayer insulating film and the capacitor lower electrode. More preferably, at least a region of the plug electrode at the side of the capacitor lower electrode includes at least one material selected from the group consisting of a metal of a high melting point and a metal nitride of a high melting point.

In the semiconductor device of the above aspect, good adhesion is obtained between the capacitor dielectric film and the interlayer insulating film because the adhesion layer made of material having a good adhesion property with respect to at least the capacitor dielectric film and the interlayer insulating film is formed at least between the capacitor dielectric film made of the material having a high dielectric constant and the interlayer insulating film. The adhesion layer may be extended to the position between the interlayer insulating film and the capacitor lower electrode, in which case good adhesion can also be obtained between the capacitor lower electrode and the interlayer insulating film. Thereby, it is possible to eliminate an adhesion layer which is made of metal and is provided for ensuring adhesion between the capacitor lower electrode and the interlayer insulating film in the prior art. Further, at least the region of the plug electrode at the side of the capacitor lower electrode may contain at least one material selected from the group consisting of a metal of a high melting point and a metal nitride of a high melting point, in which case the plug electrode can function also as a barrier layer. Thereby, it is possible to eliminate a barrier layer, which is provided independently from the plug electrode in the prior art.

According to another aspect of the invention, a semiconductor device includes a semiconductor substrate, an interlayer insulating film, a plug electrode, a capacitor lower electrode, a capacitor dielectric film and a capacitor upper electrode, all of which are the same as those in the aspect described before. The semiconductor device further includes a first adhesion layer interposed between the interlayer insulating film and the capacitor dielectric film, and a second adhesion layer interposed between the interlayer insulating film and the capacitor lower electrode. An isolating trench is formed between the first and second adhesion layers. Preferably, a side wall insulating film which fills the isolating trench is formed on a side wall of the capacitor lower electrode.

According to this semiconductor device, electric charges accumulated in the capacitor lower electrode are effectively prevented from leaking to the capacitor lower electrode of an adjacent capacitor through the second and first adhesion layers, because the isolating trench is formed between the first and second adhesion layers which are interposed between the interlayer insulating film and the capacitor dielectric film and between the interlayer insulating film and the capacitor lower electrode, respectively. Further, the side wall filling the isolating trench may be formed on the side wall of the capacitor lower electrode, in which case a leak current from the capacitor lower electrode can be further prevented effectively. Also in this semiconductor device, the first adhesion layer improves the adhesion between the interlayer insulating film and the capacitor dielectric film.

A method of manufacturing a semiconductor device according to an aspect of the invention includes the steps of forming an interlayer insulating film on a semiconductor substrate, forming an adhesion layer made of insulating material on the interlayer insulating film, forming an opening at predetermined regions in the adhesion layer and the interlayer insulating film, forming a plug electrode filling the opening, forming a capacitor lower electrode at a predetermined region on the adhesion layer with the capacitor lower electrode being electrically connected to the plug electrode, forming a capacitor dielectric film on the capacitor lower electrode and the adhesion layer with the capacitor dielectric film covering the capacitor lower electrode and being made of material having a high dielectric constant, and forming a capacitor upper electrode on the capacitor dielectric film.

According to the method of the above aspect, good adhesion can be obtained between the capacitor dielectric film and the interlayer insulating film, because the adhesion layer made of the insulating material is formed on the interlayer insulating film, and the capacitor dielectric film covering the capacitor lower electrode and made of the material having the high dielectric constant is formed on the adhesion layer and the capacitor lower electrode.

A method of manufacturing a semiconductor device of another aspect of the invention includes the steps of forming an interlayer insulating film in a predetermined region on a semiconductor substrate, the interlayer insulating film having an opening reaching the semiconductor substrate, forming a first adhesion layer on the interlayer insulating film, forming a capacitor lower electrode on the first adhesion layer, forming a second adhesion layer in a region on the interlayer insulating film not bearing the capacitor lower electrode, forming a capacitor dielectric film, which is made of material having a high dielectric constant, on the capacitor lower electrode and the second adhesion layer, and forming a capacitor upper electrode on the capacitor dielectric film.

According to the method of the above aspect, the first adhesion layer is formed on the interlayer insulating film, the capacitor lower electrode is formed on the first adhesion layer, the second adhesion layer is formed in the region on the interlayer insulating film not bearing the capacitor lower electrode, and the capacitor dielectric film made of the material having a high dielectric constant is formed on the second adhesion layer and the capacitor lower electrode. Therefore, good adhesion can be obtained between the capacitor dielectric film and the interlayer insulating film owing to the second adhesion layer having a good adhesion property with respect to both the interlayer insulating film and the capacitor dielectric film. At the same time, the first adhesion layer can achieve the good adhesion between the capacitor lower electrode and the interlayer insulating film.

A method of manufacturing a semiconductor device of still another aspect of the invention includes the steps of forming an interlayer insulating film in a predetermined region on the semiconductor substrate, the interlayer insulating film having an opening reaching the semiconductor substrate, forming a first adhesion layer on an interlayer insulating film, forming an etching mask in a predetermined region on the first adhesion layer, effecting sputter etching on the first adhesion layer using the etching mask as a mask and thereby forming an isolating trench between a region in the first adhesion layer not bearing the etching mask and a region in the first adhesion layer bearing the etching mask, and forming a second adhesion layer by oxidizing or nitriding the first adhesion layer in the region not bearing the etching mask.

According to the above aspect, the first adhesion layer is formed on the interlayer insulating film, the etching mask is formed in the predetermined region on the first adhesion layer, the sputter etching is effected on the first adhesion layer using the etching mask as a mask, and thereby the isolating trench is formed between the first adhesion layer in the region not bearing the etching mask and the first adhesion layer in the region bearing the etching mask. The first adhesion layer in the region not bearing the etching mask is oxidized or nitrided to form the second adhesion layer. Therefore, the first adhesion layer which forms an adhesion layer between the capacitor lower electrode and the interlayer insulating film is isolated from the second adhesion layer which forms an adhesion layer between the capacitor dielectric film and the interlayer insulating film. Thereby, electric charges accumulated in the capacitor lower electrode is effectively prevented from leaking to an adjacent capacitor through the first and second adhesion layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Figure 1:
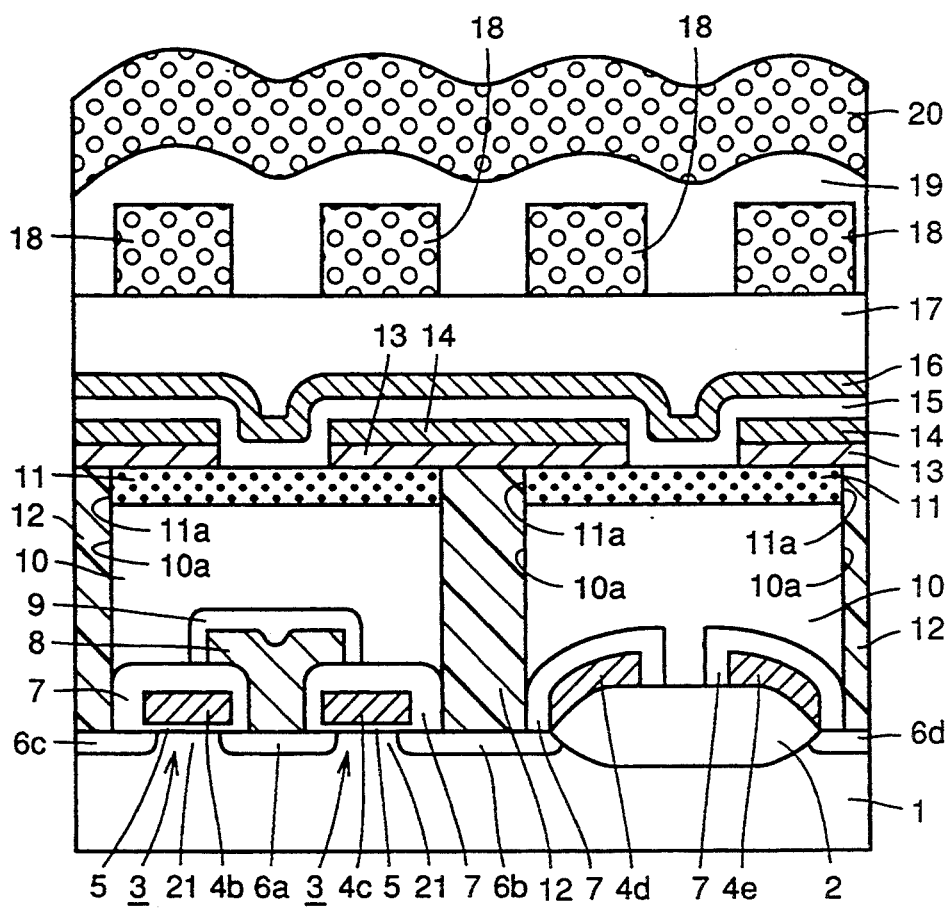
FIG. 1 is a cross section showing a DRAM of a first embodiment of the invention.

In a DRAM of the first embodiment shown in FIG. 1, a silicon substrate 1 is provided at a predetermined region on its main surface with an element isolating oxide film 2 for isolating elements. The element isolating oxide film 2 surrounds a region in which source/drain regions 6a, 6b, 6c and 6d spaced by a predetermined distance are formed with channel regions 21 interposed therebetween. Gate electrodes (word lines) 4b and 4c are formed on the channel regions 21 with a gate oxide film 5 therebetween. Word lines (gate electrodes) 4d and 4e are formed on the element isolating oxide film 2 with a predetermined space between each other. The source/drain regions 6a and 6c and the gate electrode 4b form one of transfer gate transistors 3. The source/drain regions 6a and 6b and the gate electrode 4c form the other transfer gate transistor 3.

The gate electrodes 4b, 4c, 4d and 4e are covered with an insulating film 7 made of a silicon oxide film. The source/drain region 6a is electrically connected to a buried bit line 8, which is covered with an insulating film 9 made of a silicon oxide film.

Substantially the whole surface of the structure described above is covered with an interlayer insulating film 10 having a flat surface. The interlayer insulating film 10 is made of a silicon oxide film and has a thickness of about 5000 to about 15000 Å. An adhesion layer 11 is formed on the interlayer insulating film 10. The adhesion layer 11 is made of $TiO_2$, $ZrO_2$, $Ta_2O_5$, $Si_3N_4$, $Al_2O_3$ or the like and has a thickness of about 50 to about 5000 Å.

The interlayer insulating film 10 and the adhesion layer 11 are provided with contact holes 10a and 11a reaching up to the source/drain regions 6b, 6c and 6d. The contact holes 10a and 11a are filled with polysilicon plugs 12.

Barrier layers 13, which are made of TiN, WN, Ta or the like and have a thickness of about 50 to about 2000 Å, are formed on the adhesion layer 11 and polysilicon plugs 12, and are electrically connected to the polysilicon plugs 12. Capacitor lower electrode layers 14, which are made of platinum or platinum-titanium alloy and have a thickness of about 250 to 1500 Å, are formed on the barrier layers 13. A high dielectric film 15 covering the capacitor lower electrode layers 14 is formed on the capacitor lower electrode layers 14 and adhesion layer 11. The high dielectric film 15 is made of $SrTiO_3$, $(Ba, Sr)TiO_3$, $Pb(Zr, Ti)O_3$, $(Pb, La)(Zr, Ti)O_3$ or the like, and has a thickness of about 500 to 1500 Å. A capacitor upper electrode layer 16, which is made of platinum, aluminum, titanium nitride, tungsten, molybdenum or the like and has a thickness of about 1000 to about 2000 Å, is formed on the high dielectric film.

An interlayer insulating film 17 having a flat top surface is formed on the capacitor upper electrode layer 16. Aluminum interconnections 18 corresponding to the gate electrodes 4b, 4c, 4d and 4e are formed on the interlayer insulating film 17 with a predetermined space between each other. The aluminum interconnections 18 are covered with a protection film 19, on which an aluminum interconnection 20 is formed.

In this first embodiment, the adhesion layer 11 is formed on the whole surface of the interlayer insulating film 10 as described above. Thereby, good adhesion can be obtained between the interlayer insulating film 10 and the high dielectric film 15. As a result, separation of the high dielectric film 15 from the interlayer insulating film 10, which may be caused in the prior art, can be effectively prevented, resulting in increase of the mechanical strength and reliability of the capacitor.

Figure 73:
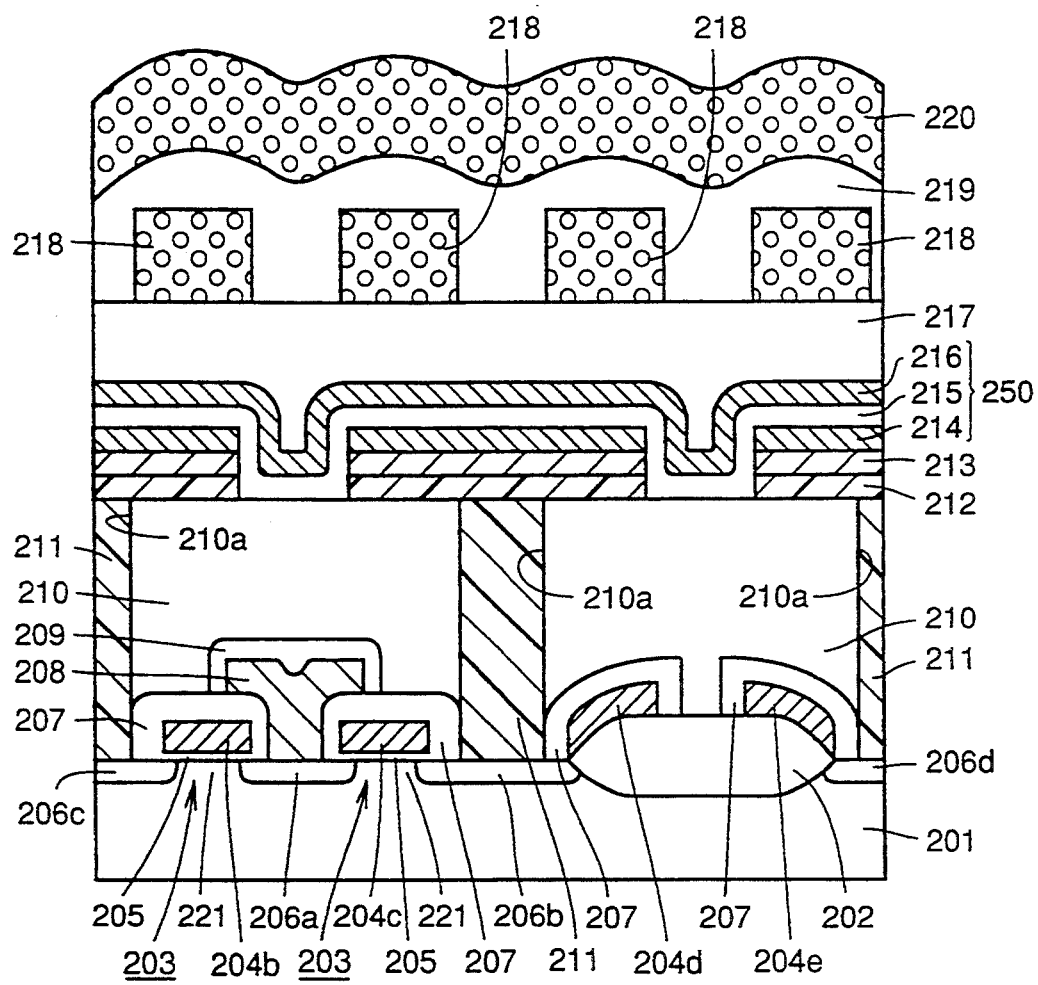
FIG. 73 is a cross section showing a DRAM in the prior art.
Figure 74:
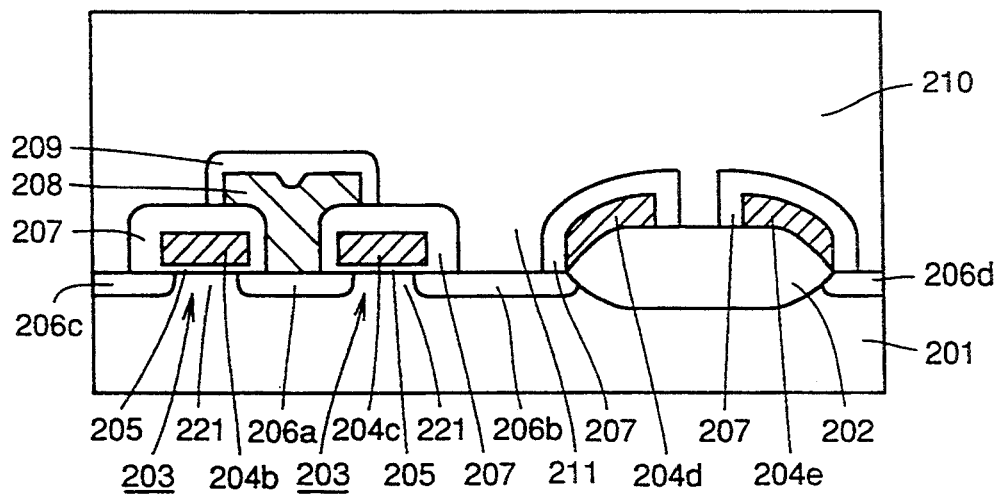
FIGS. 74 to 82 are cross sections showing 1st to 9th steps in a process for manufacturing the DRAM in the prior art shown in FIG. 73.
Figure 75:
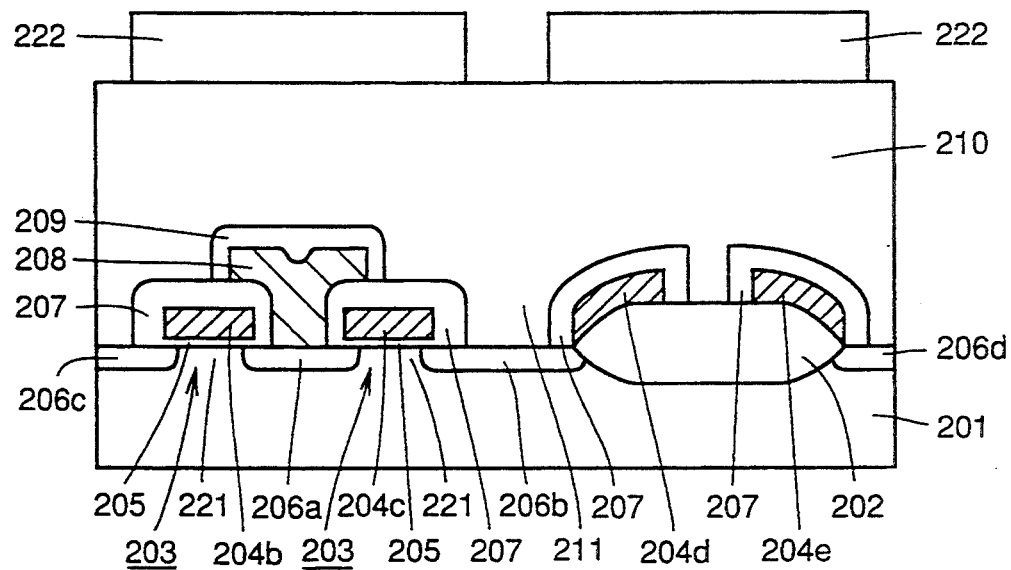
Figure 76:
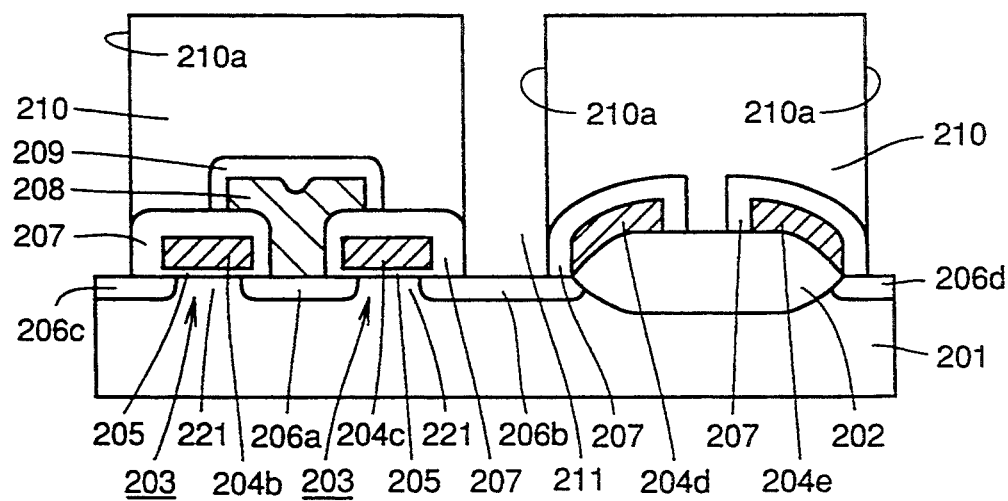
Figure 77:
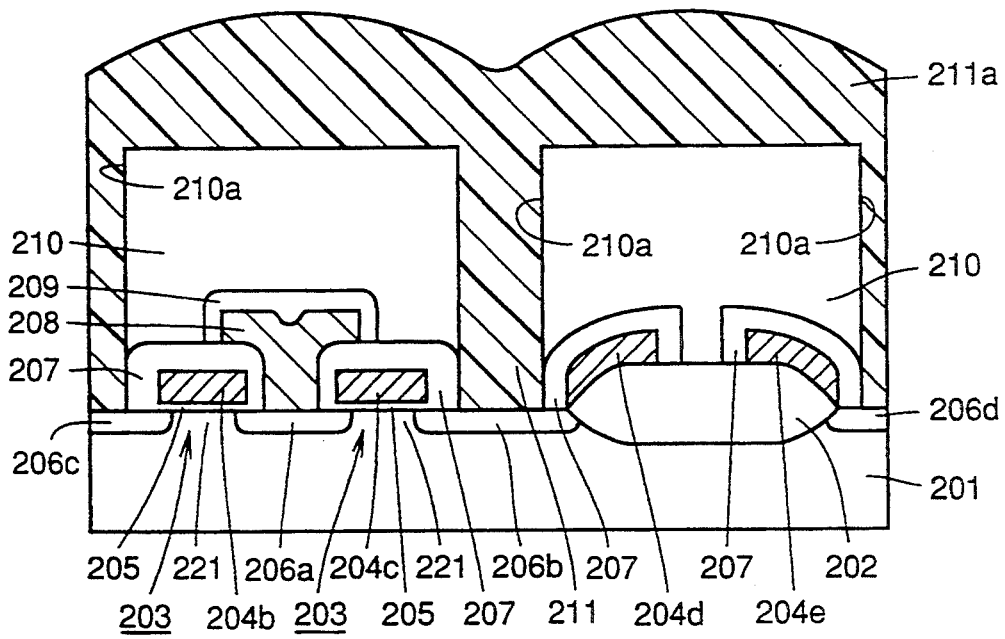
Figure 78:
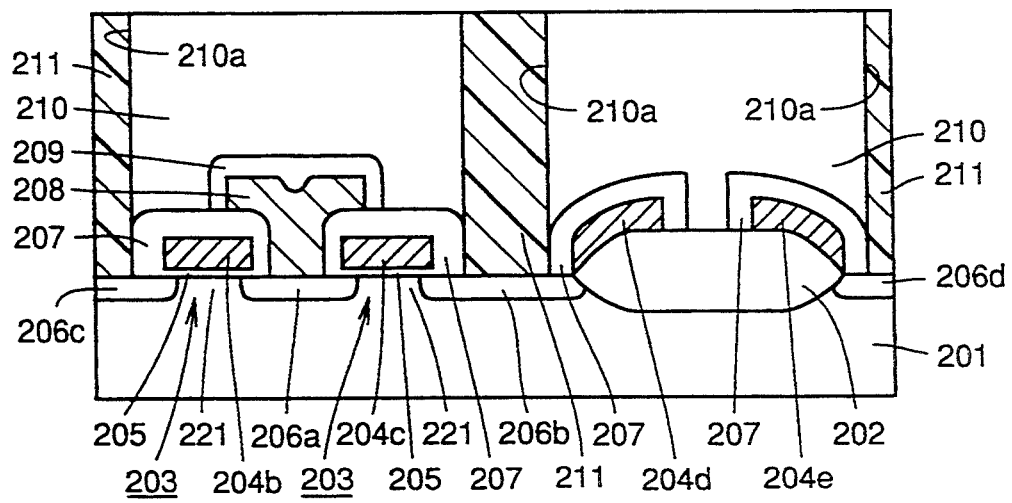
Figure 79:
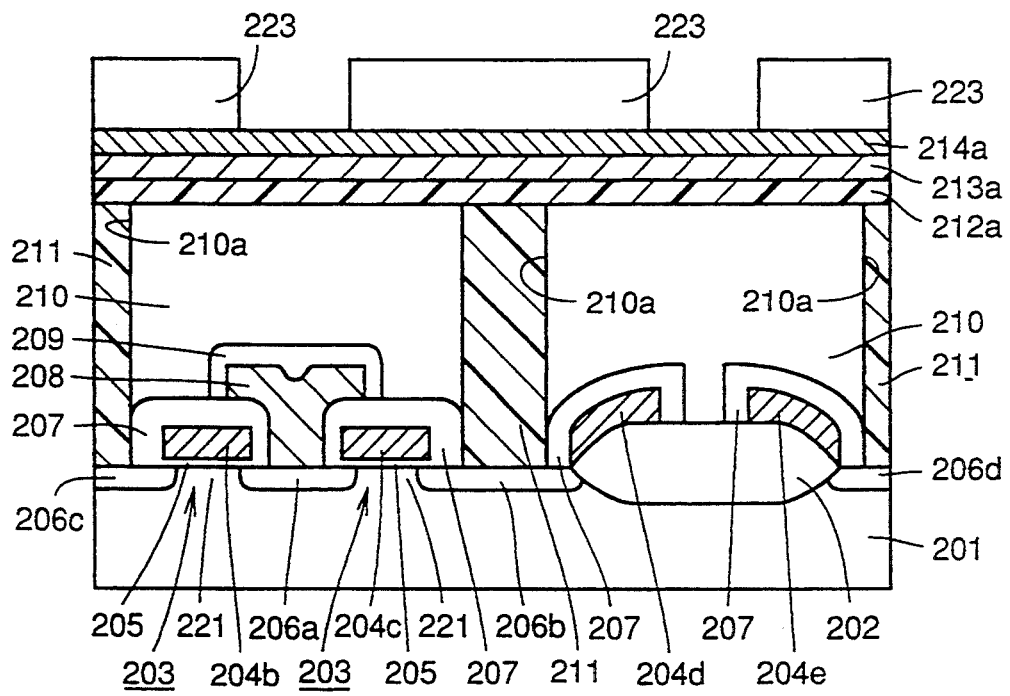
Figure 80:
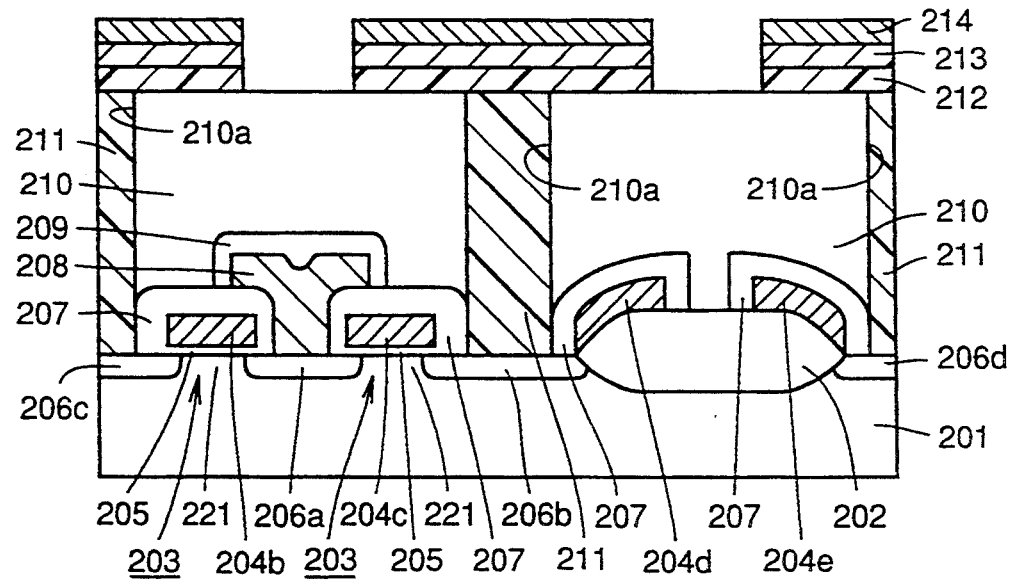
Figure 81:
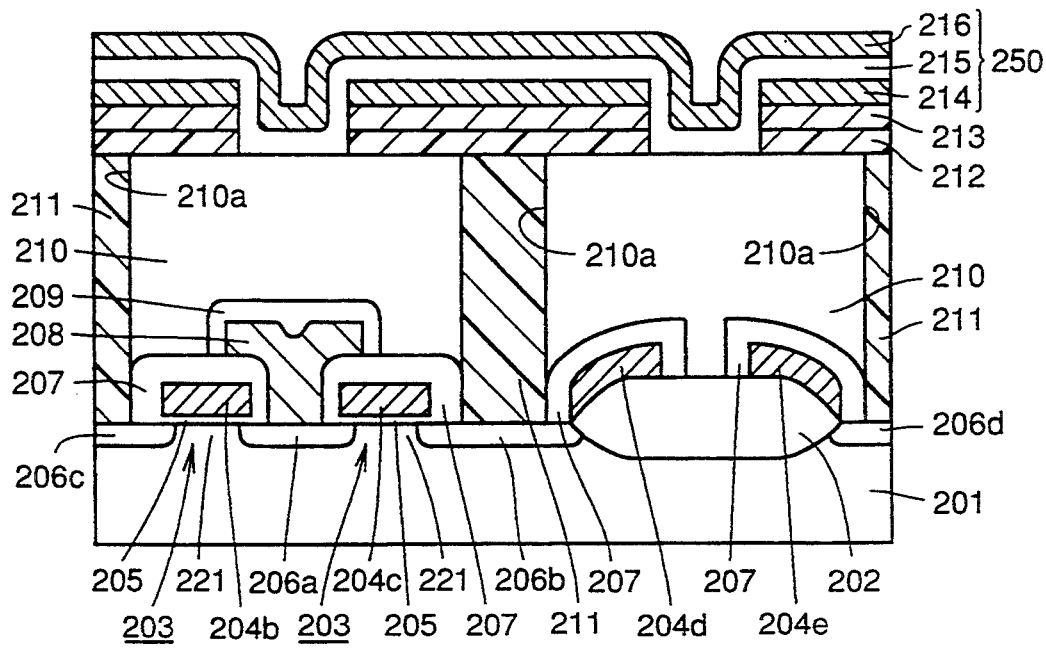
Figure 82:
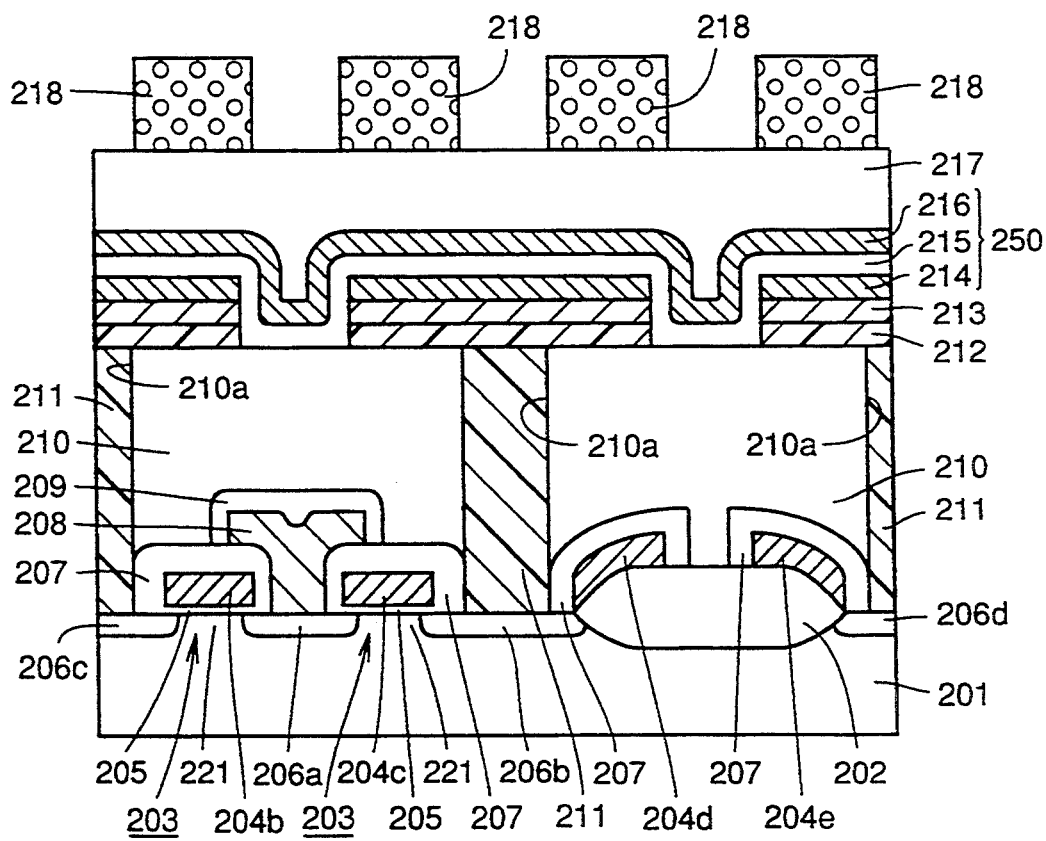

Since the adhesion layer 11 is formed under the capacitor lower electrode layer 14, good adhesion between the barrier layer 13 and the interlayer insulating film 10 can also be obtained. Thereby, it is not necessary to provide an adhesion layer, which is made of a metal layer and is required in the prior art as shown in FIG. 73, between the interlayer insulating film and the capacitor lower electrode layer. As a result, a difference in level at the capacitor lower electrode region can be reduced compared with the conventional structure shown in FIG. 73. Thereby, a coverage characteristic in a later step can be improved, and a manufacturing process can be facilitated.

Referring to FIGS. 2-10, a process of manufacturing the DRAM of the first embodiment will be described below.

Figure 2:
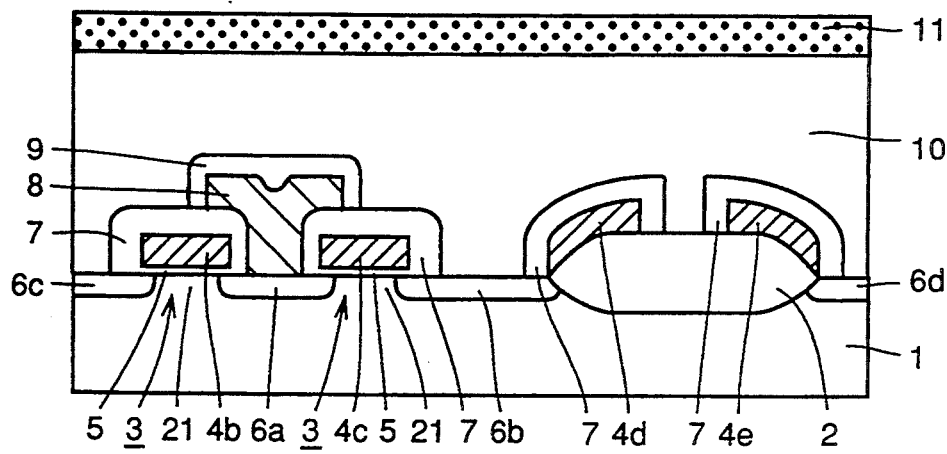
FIGS. 2 to 10 are cross sections showing 1st to 9th steps in process for manufacturing the DRAM of the first embodiment shown in FIG. 1, respectively.

First, as shown in FIG. 2, the element isolating oxide film 2 made of the silicon oxide film is formed at a predetermined region on the main surface of the silicon substrate 1 by the LOCOS method. The gate electrodes 4b and 4c are formed at predetermined regions in the active region surrounded by the element isolating oxide film 2 with the gate oxide film 5 therebetween. The word lines (gate electrodes) 4d and 4e are formed on the element isolating oxide film 2 with the predetermined space between each other. The gate electrodes 4b, 4c, 4d and 4e are covered with the insulating film 7 made of the silicon oxide film. Using the insulating film 7 as a mask, impurity is ion-implanted into the silicon substrate 1 to form the source/drain regions 6a, 6b, 6c and 6d.

Thereafter, the buried bit line 8 which is in direct contact with the source/drain region 6a is formed. The buried bit line 8 is covered with the insulating film 9 made of the silicon oxide film.

The interlayer insulating film 10, which covers the whole surface and is made of the silicon oxide film, is formed to have a thickness of about 5000 to about 15000 Å by the CVD method. The adhesion layer 11 made of the insulating film of, e.g., $TiO_2$, $Al_2O_3$, $Ta_2O_5$, $ZrO_2$ or $Si_3N_4$ is formed to have a thickness of about 50 to about 5000 Å on the interlayer insulating film 10 by the CVD method or sputter method. This adhesion layer 11 is formed at a temperature in a range from the room temperature to 800° C.

Figure 3:
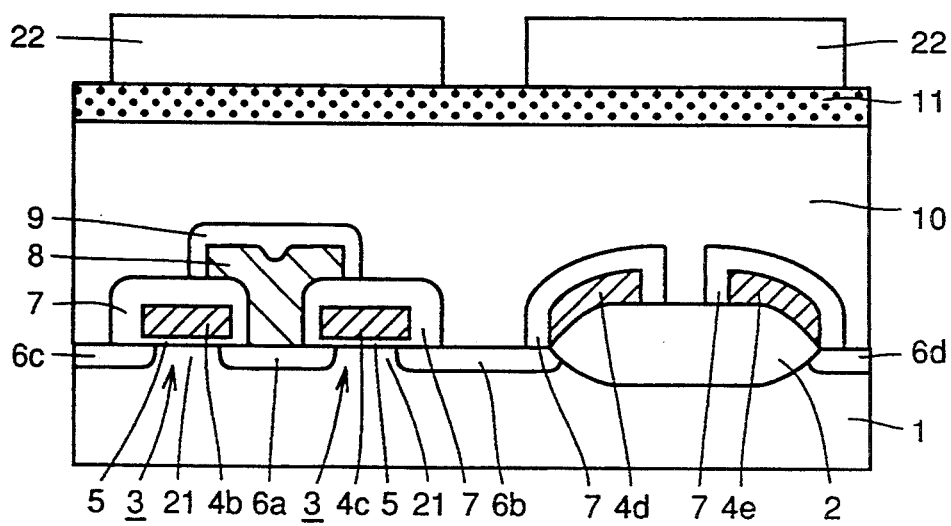
Figure 4:
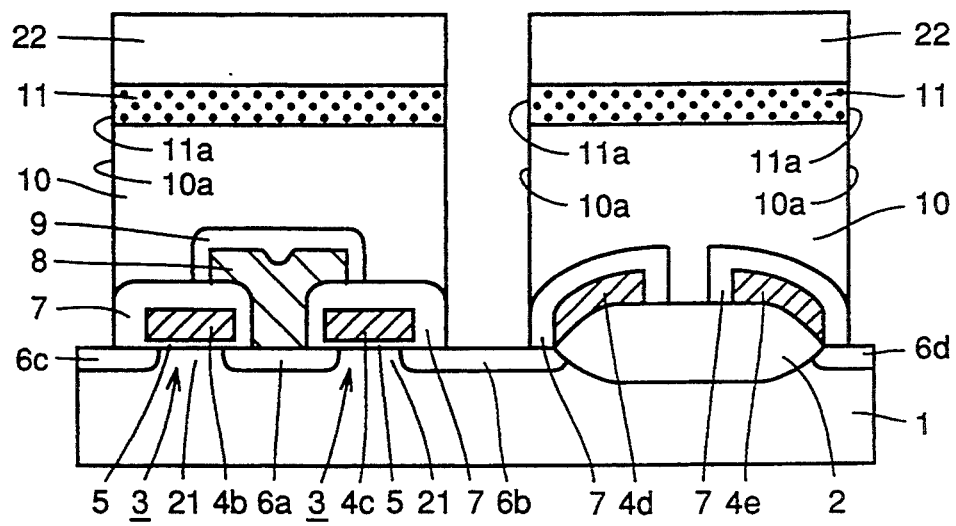

Then, as shown in FIG. 3, a resist 22 is formed in predetermined regions on the adhesion layer 11. Using the resist 22 as a mask, anisotropic etching is effected on the adhesion layer 11 and interlayer insulating film 10. Thereby, the contact holes 10a and 11a extended up to the source/drain regions 6b, 6c and 6d are formed as shown in FIG. 4. Thereafter, the resist 22 is removed.

Figure 5:
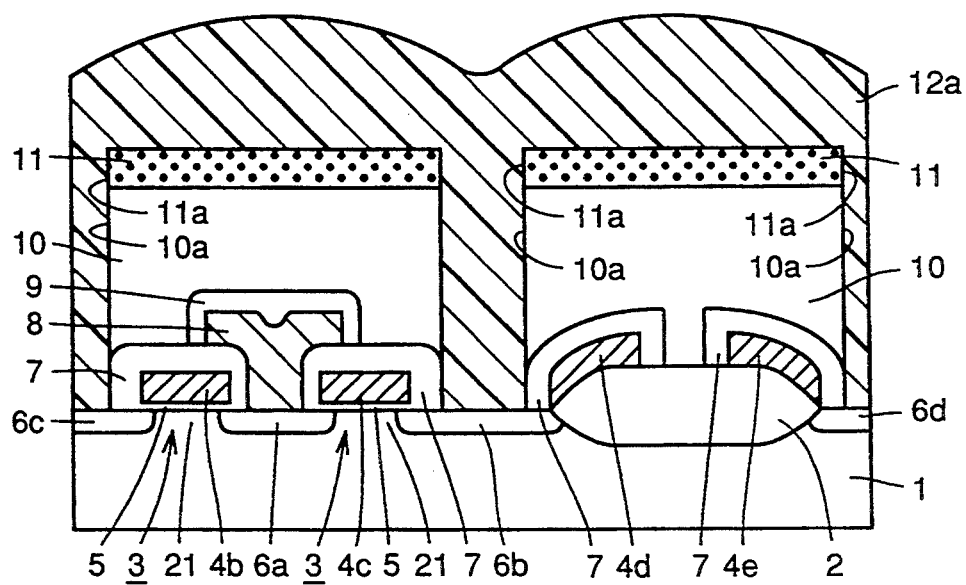
Figure 6:
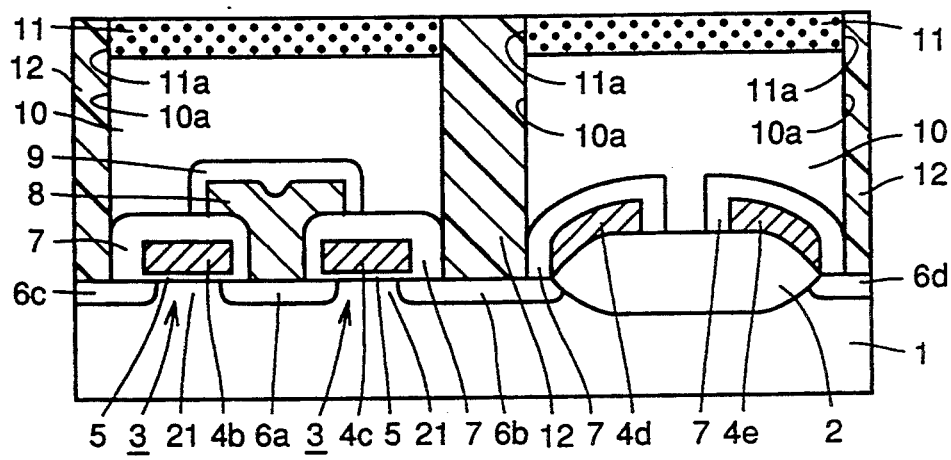

As shown in FIG. 5, a doped polysilicon layer 12a is formed to have a thickness of about 2000 to about 12000 Å. The doped polysilicon layer 12a fills the contact holes 10a and 11a and covers the whole surface. The doped polysilicon layer 12a is formed at a temperature of 600° to 700° C. by the CVD method. A doped amorphous silicon layer may be used instead of the doped polysilicon layer 12a, in which case the CVD method is used at a temperature of 450° to 550° C. Thereafter, etchback is effected on the whole surface of the doped polysilicon layer 12a. Thereby, the polysilicon plugs 12 are formed as shown in FIG. 6.

Figure 7:
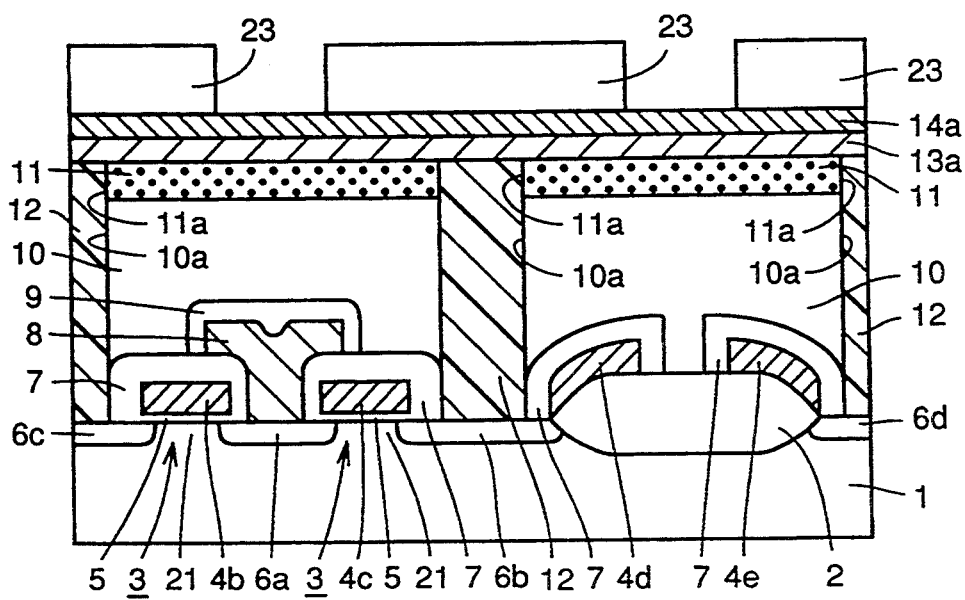
Figure 8:
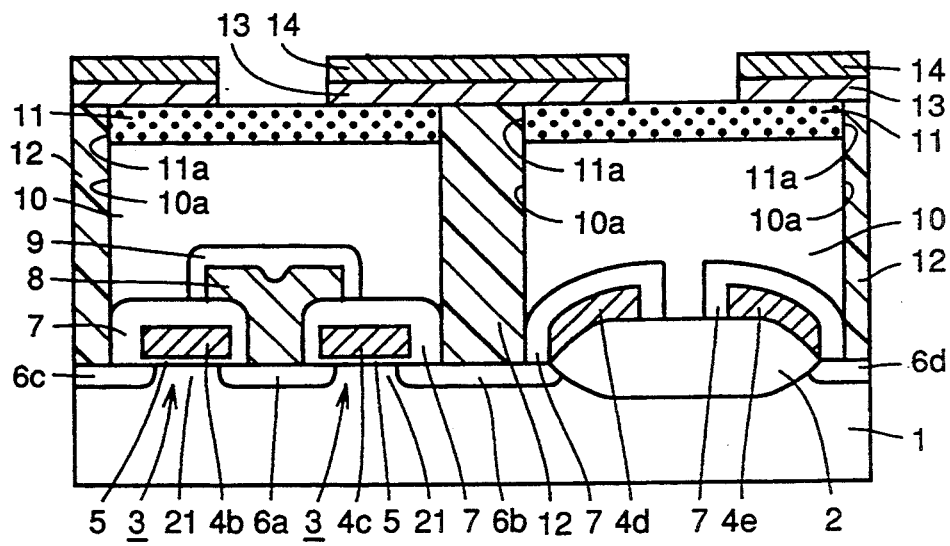

Then, as shown in FIG. 7, the whole surface is covered with a titanium nitride layer or titanium tungsten layer 13a which will form the barrier layers. The titanium nitride layer or tungsten nitride layer is formed to have a thickness of about 50 to 2000 Å by the sputter method at a temperature in a range from the room temperature to 800° C. A platinum layer 14a of a thickness of about 250 to 1500 Å is formed on the titanium nitride layer (or tungsten nitride layer) 13a by the sputter method. A resist 23 is formed in predetermined regions on the platinum layer 14a by photolithography. Using the resist 23 as a mask, dry etching is effected on the platinum layer 14a and titanium nitride layer (tungsten nitride layer) 13a. Thereby, the barrier layers 13 made of the titanium nitride layers (tungsten nitride layers) and the capacitor lower electrode layers 14 made of the platinum layers are completed as shown in FIG. 8.

Figure 9:
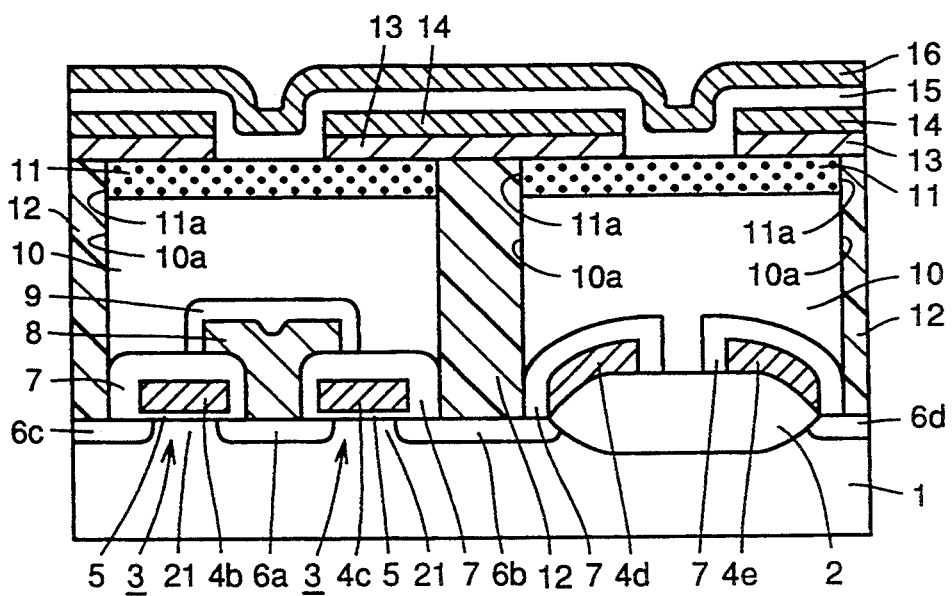

Then, as shown in FIG. 9, the high dielectric film 15, which covers the capacitor lower electrodes 14 and is made of SrTiO₃, (Ba, Sr)TiO₃, Pb(Zr, Ti)O₃, (Pb, La)(Zr, Ti)O₃ or the like, is formed on the capacitor lower electrodes 14 and the adhesion layer 11. The highly dielectric film 15 is formed by the CVD method or sputter method at a temperature of about 300° to about 800° C. Thereafter, the capacitor upper electrode layer 16, which is made of platinum, titanium nitride, aluminum, tungsten, molybdenum or the like and has a thickness of about 1000 to about 2000 Å, is formed on the highly dielectric film 15 by the sputter method.

Figure 10:
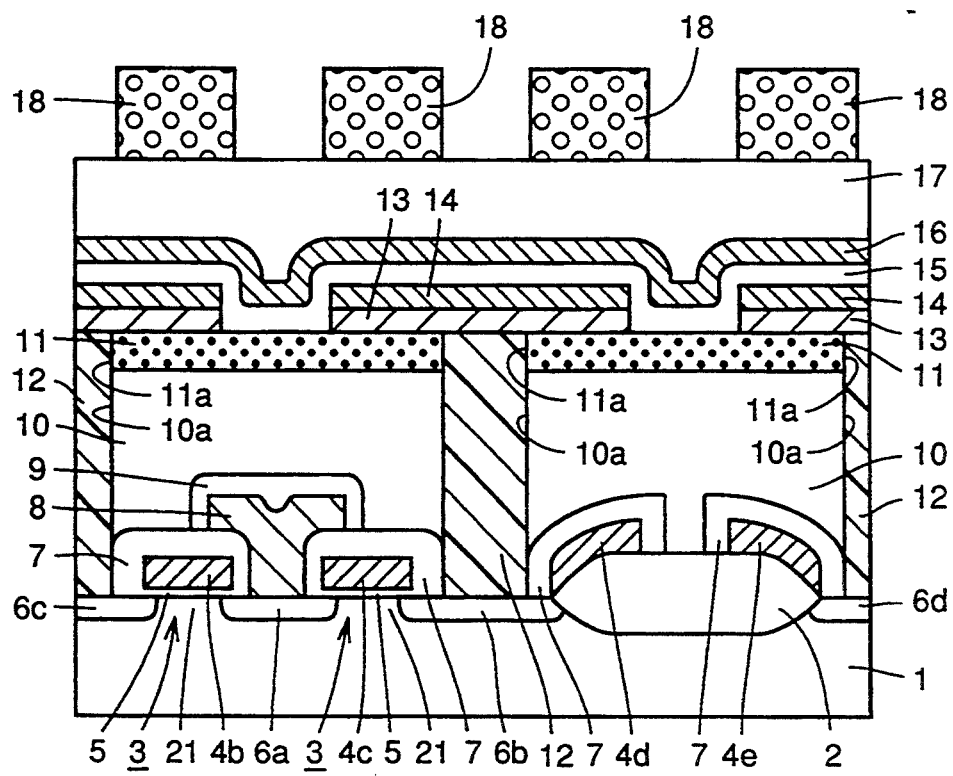

Then, as shown in FIG. 10, the interlayer insulating film 17 covering the capacitor upper electrode layer 16 is formed by the CVD method. The aluminum interconnections 18 corresponding to the gate electrodes 4b, 4c, 4d and 4e are formed on the interlayer insulating film 17 with a predetermined space between each other.

Finally, the protection film 19 covering the aluminum interconnections 18 are formed, and the aluminum interconnection 20 is formed on the protection film 19, as shown in FIG. 1. In this manner, the DRAM of the first embodiment is completed.

Figure 11:
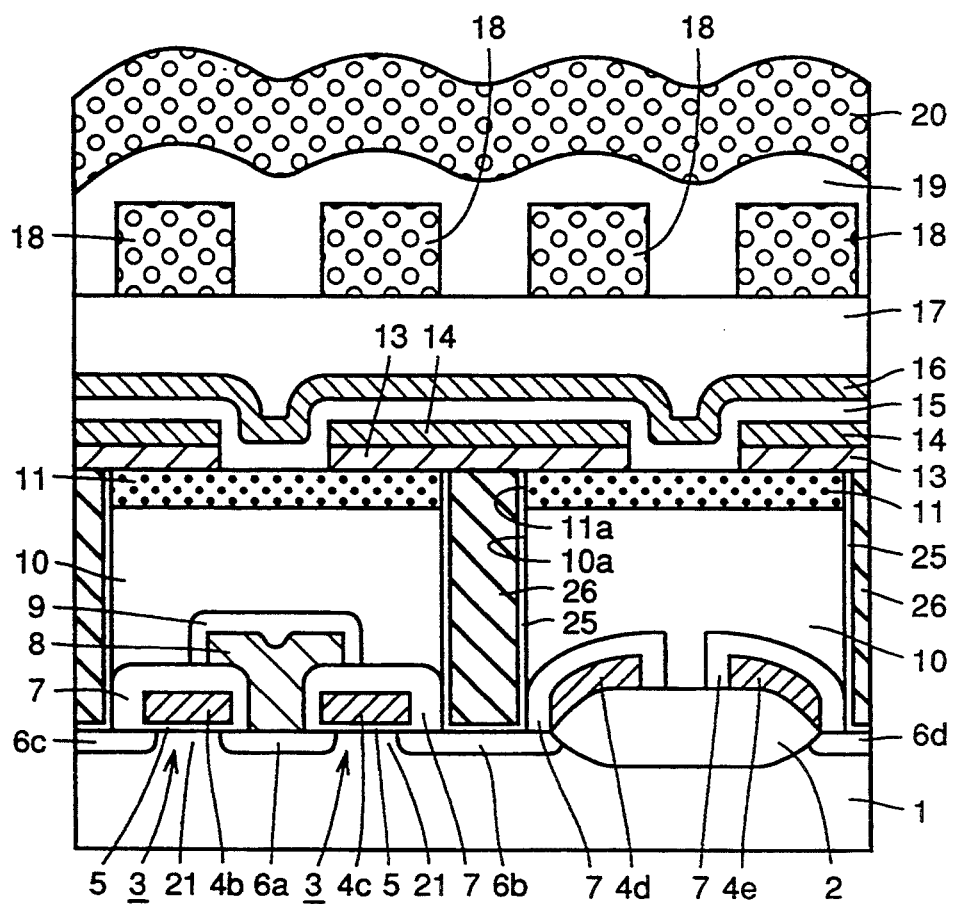
FIG. 11.is a cross section showing a DRAM of a second embodiment of the invention.

Referring now to FIG. 11, a second embodiment differs from the first embodiment shown in FIG. 1 in that the plug electrode is formed of a TiN/Ti layer 25 and a tungsten plug 26.

Figure 12:
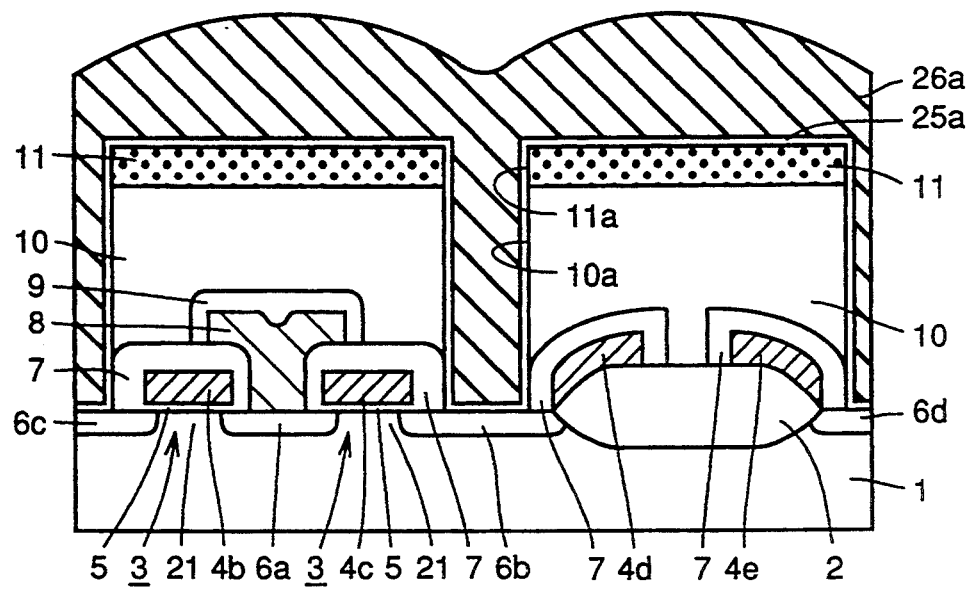
FIGS. 12 and 13 are cross sections showing 1st and 2nd steps in a process for manufacturing the DRAM of the second embodiment shown in FIG. 11, respectively.
Figure 13:
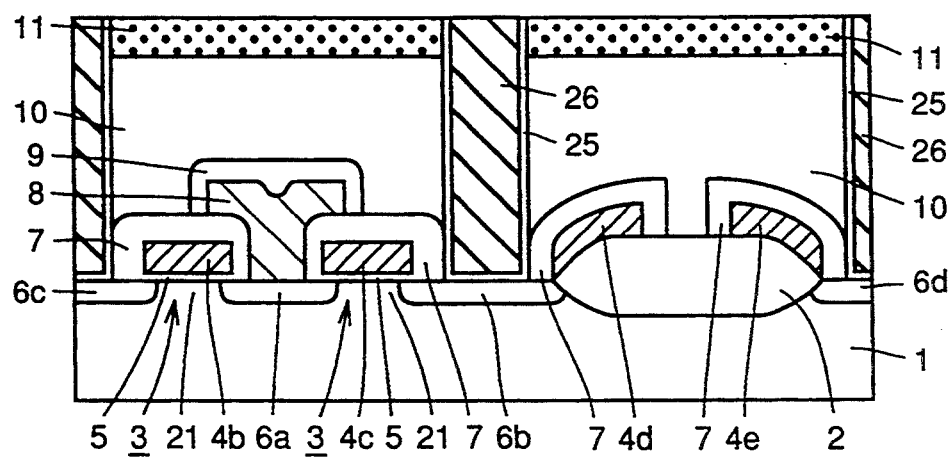

Referring to FIGS. 12 and 13, a process for forming the plug part in the second embodiment will be described below.

As shown in FIG. 12, a TiN/Ti layer 25, which includes a TiN layer of 350 to 3000 Å in thickness and a Ti layer of 50 to 300 Å in thickness, is formed on the inner surfaces of the contact holes 10a and 11a and the top surface of the adhesion layer 11 by the sputter method. Then, a tungsten layer 26a of about 2000 to about 12000 Å in thickness is formed at a temperature of 300° to 900° C. by the CVD method. Dry etching is effected on the whole surface to form the plug electrodes 26 made of the TiN/Ti layers 25 and the tungsten plugs 26 as shown in FIG. 13. The tungsten plugs 26 may be replaced with plugs made of platinum or molybdenum.

Figure 14:
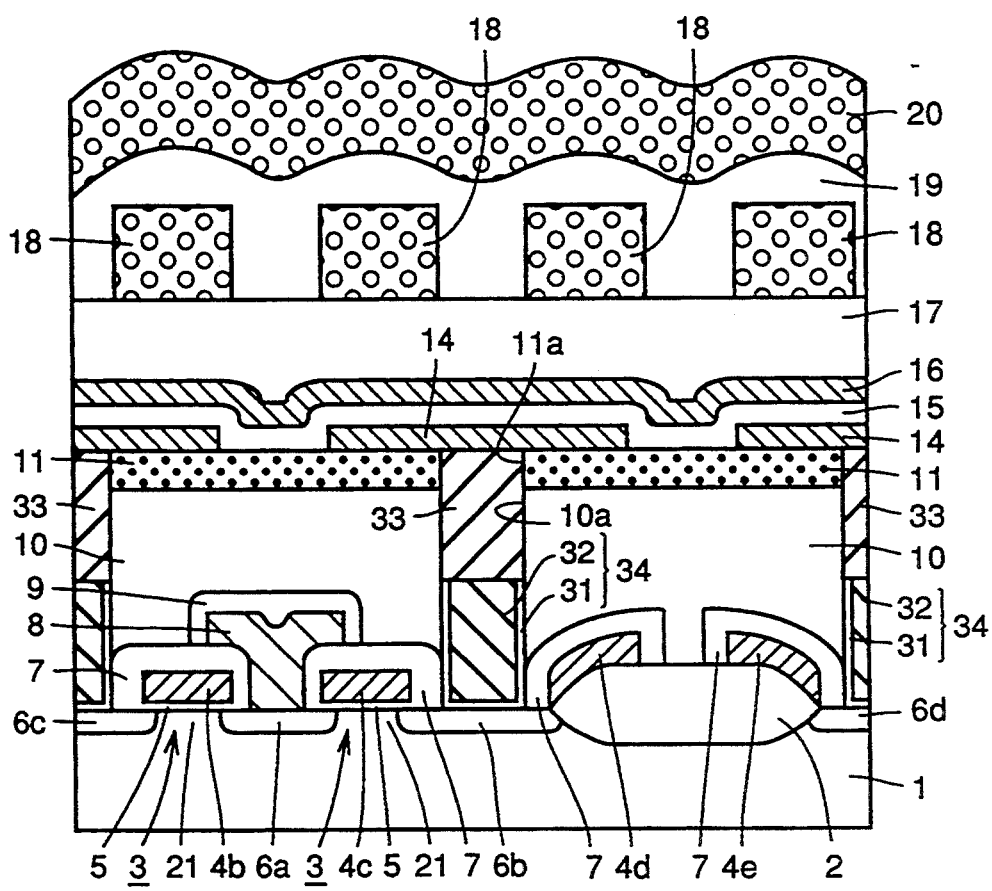
FIG. 14 is a cross section showing a DRAM of a third embodiment of the invention.

Referring to FIG. 14, a DRAM of a third embodiment differs form the first and second embodiments in that the plug electrode is formed of a contact plug 34, which is formed of a TiN/Ti layer 31 and a tungsten plug 32, and a barrier plug 33 made of TiN. In this third embodiment, the plug electrode is partially formed of the barrier plug 33, so that the barrier layer 13 which is required in the first and second embodiments is not required. As a result, a difference in level at the region including the capacitor lower electrode layer 14 can be effectively reduced.

Referring to FIGS. 15–20, a process for manufacturing the third embodiment will be described below.

Figure 15:
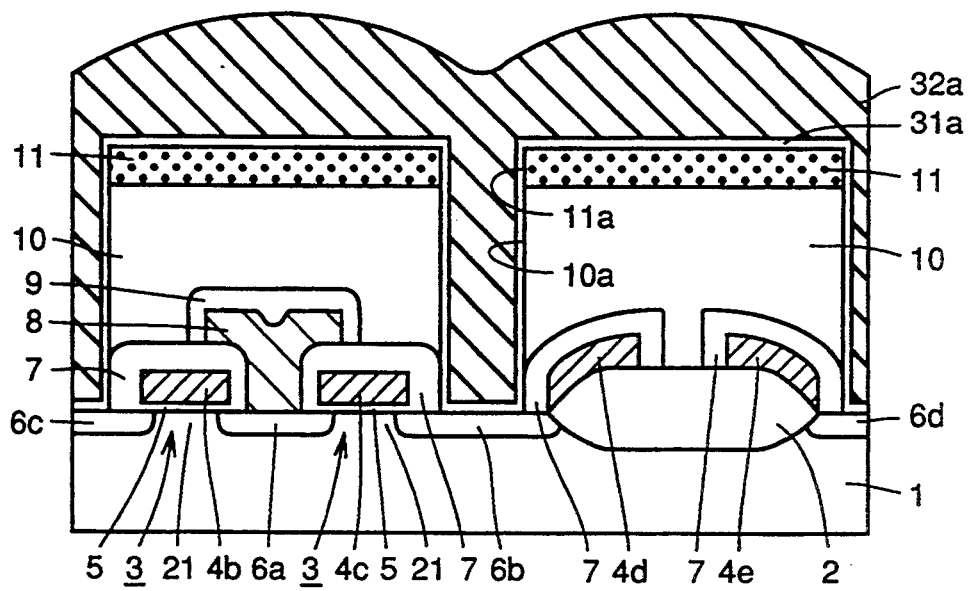
FIGS. 15 to 20 are cross sections showing 1st to 6th steps in a process for manufacturing the DRAM of the third embodiment shown in FIG. 14, respectively.
Figure 16:
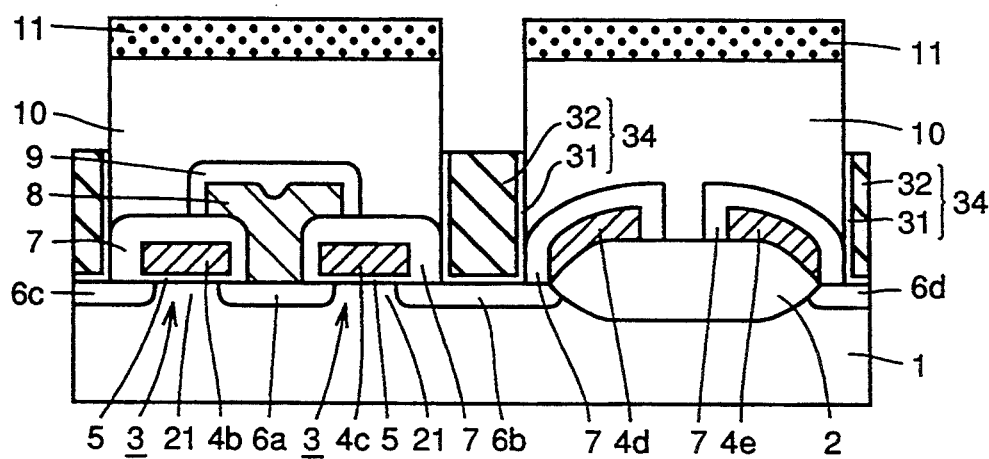

A manufacturing process from the start to the step of forming the contact holes 10a and 11a is the same as that of the manufacturing process of the first embodiment shown in FIGS. 2–4. Then, as shown in FIG. 15, a TiN/Ti layer 31a is formed on inner surfaces of the contact holes 10a and 11a and the top surface of the adhesion layer 11 by the sputter method. A layer of Ti is about 50 to about 300 Å in thickness, and a layer of TiN is about 350 and about 3000 Å in thickness. Thereafter, a tungsten layer 32a of about 2000 to about 12000 Å in thickness is formed at a temperature of 300° to 900° C. by the CVD method. Etchback is effected on the whole surface by the dry etching method to form the contact plugs 34 formed of the TiN/Ti layers 31 and tungsten plugs 32 as shown in FIG. 16. The contact plugs 34 thus formed have a thickness of about 50 to about 10000 Å.

Figure 17:
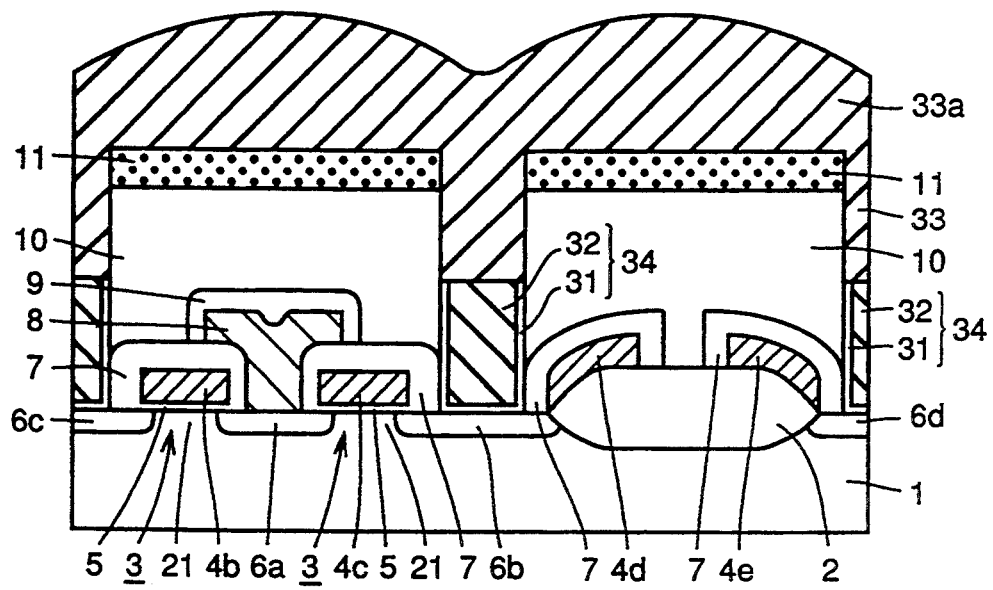
Figure 18:
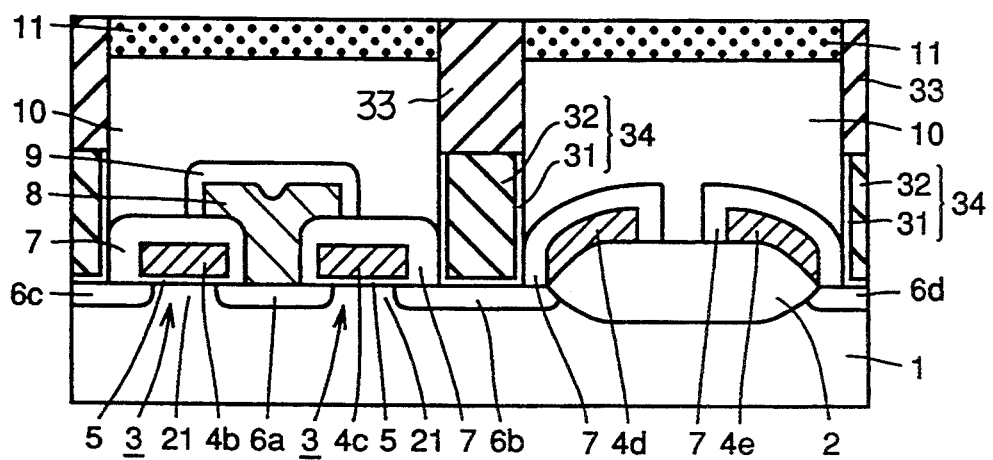

Referring to FIG. 17, a TiN layer 33a having a thickness of about 2000 to about 12000 Å is formed on the whole surface by the CVD method at a temperature of 350° to 800° C. Etchback is effected on the whole surface to form the barrier plugs 33 made of TiN as shown in FIG. 18.

Figure 19:
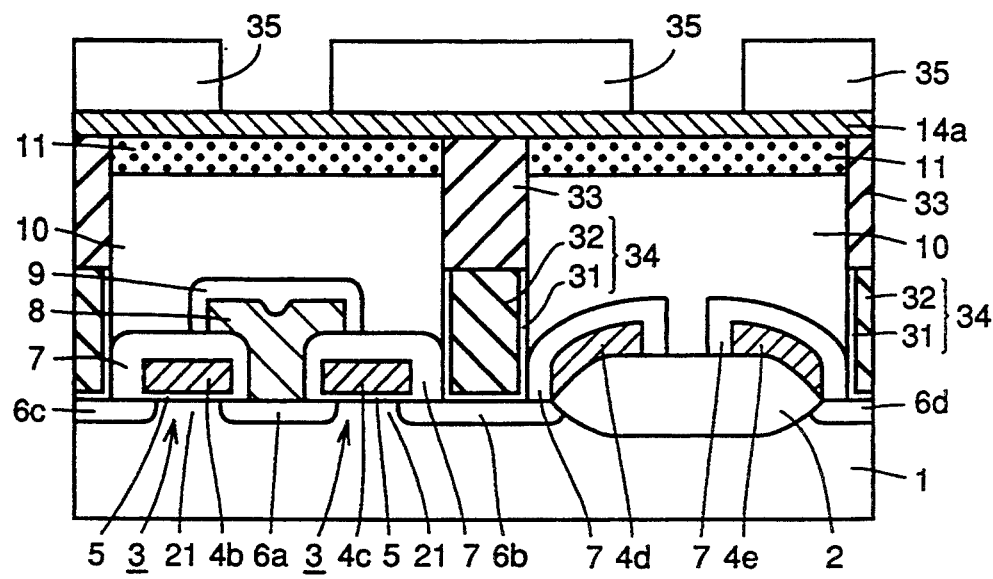
Figure 20:
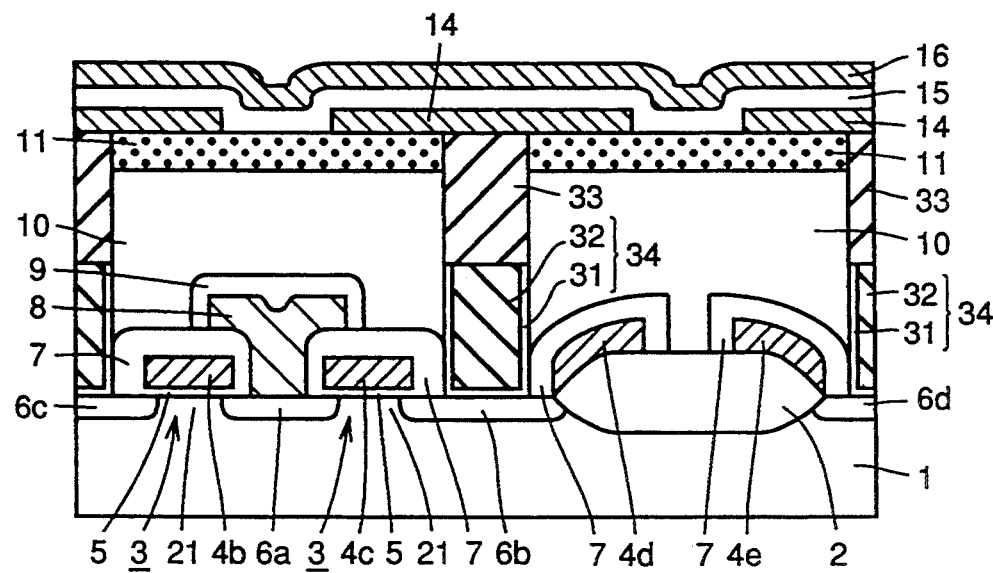

Then, as shown in FIG. 19, the platinum layer 14a having a thickness of about 250 to about 1500 Å is formed by the sputter method at a temperature in a range from the room temperature to 800° C. A resist 35 is formed in predetermined regions on the platinum layer 14a by photolithography. Dry etching with the resist 35 is effected on the platinum layer 14a to pattern the same. Thereby, the capacitor lower electrode layers 14 made of platinum layers are completed as shown in FIG. 20. The highly dielectric film 15 is formed on the capacitor lower electrode layers 14 and adhesion layer 11 by the sputter method or CVD method at a temperature of 300° to 800° C. The capacitor upper electrode layer 16, which is made of platinum, titanium nitride, aluminum, tungsten, molybdenum or the like and has a thickness of about 1000 to about 2000 Å, is formed on the high dielectric film 15 by the sputter method.

Finally, as shown in FIG. 14, the interlayer insulating film 17, aluminum interconnections 18, protection film 19 and aluminum interconnection 20 are formed. In this manner, the DRAM of the third embodiment is completed.

Figure 21:
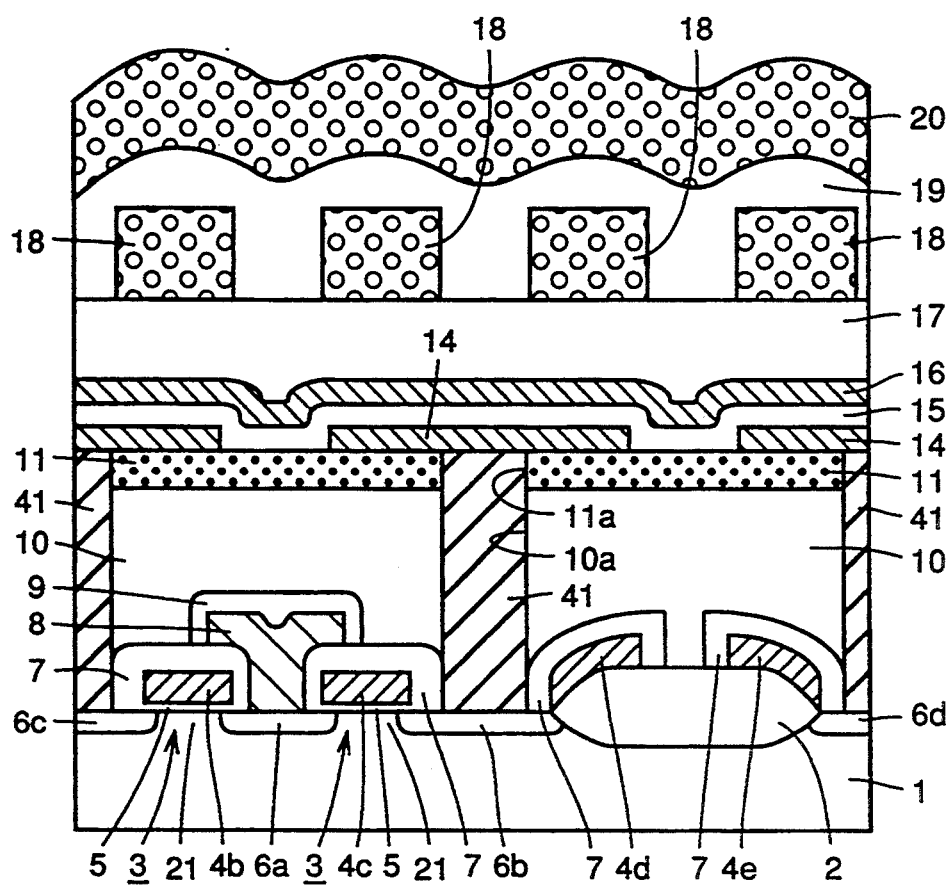
FIG. 21 is a cross section showing a DRAM of a fourth embodiment of the invention.

In a fourth embodiment shown in FIG. 21, a plug electrode is formed only of a barrier plug 41 made of TiN. Thereby, the barrier plug 41 can be made longer than that in the third embodiment shown in FIG. 14, so that the barrier function can be improved. As a result, it is possible to effectively prevent a silicide reaction between the capacitor lower electrode layer 14 made of the platinum layer and the silicon substrate 1.

Figure 22:
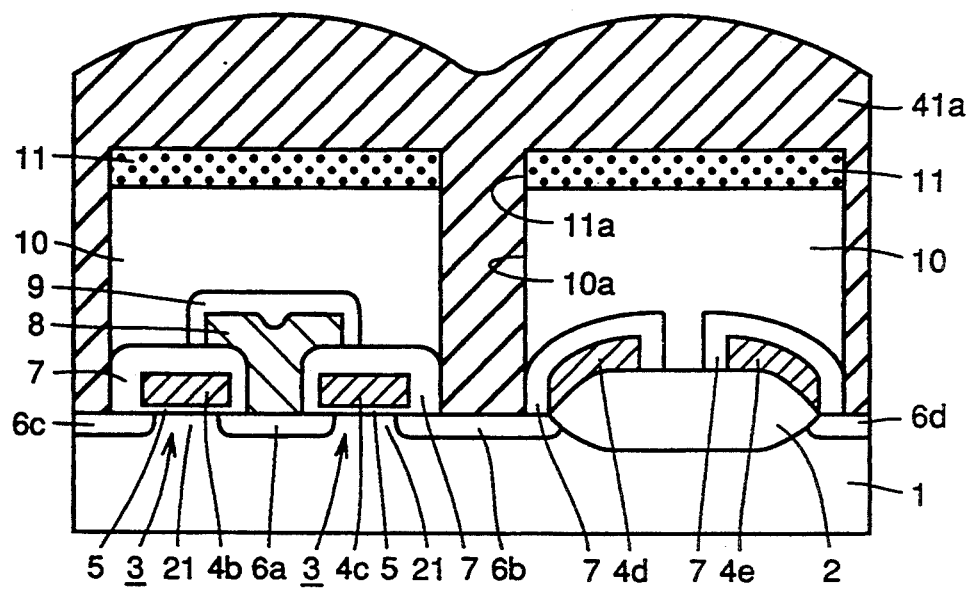
FIGS. 22 and 23 are cross sections showing 1st and 2nd steps in a process for manufacturing the DRAM of the fourth embodiment shown in FIG. 21, respectively.
Figure 23:
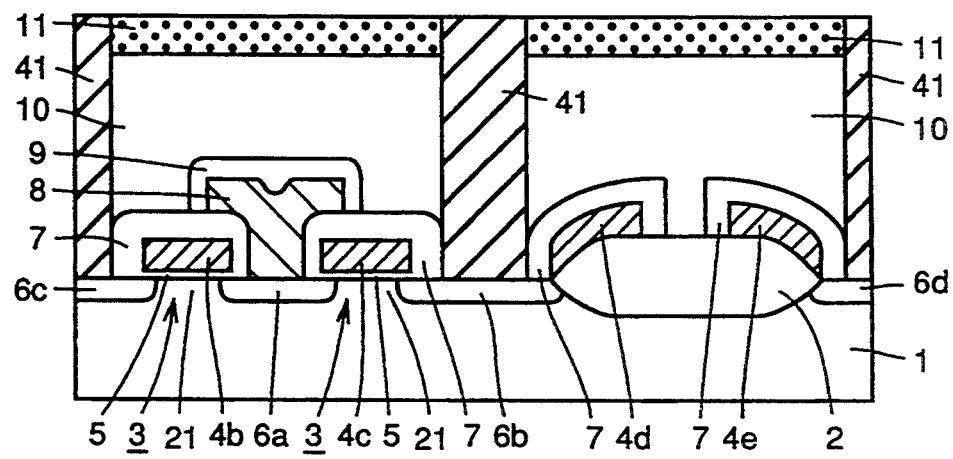

Referring to FIGS. 22 and 23, the barrier plug 41 of the fourth embodiment is formed as described below.

As shown in FIG. 22, a TiN layer 41a having a thickness of about 2000 to about 12000 Å is formed by the CVD method at a temperature of 350° to 800° C. Etchback is effected on the TiN layer 41a to form the barrier plugs 41 made of TiN as shown in FIG. 23. In this manner, the barrier plugs 41 of the fourth embodiment are completed.

Figure 24:
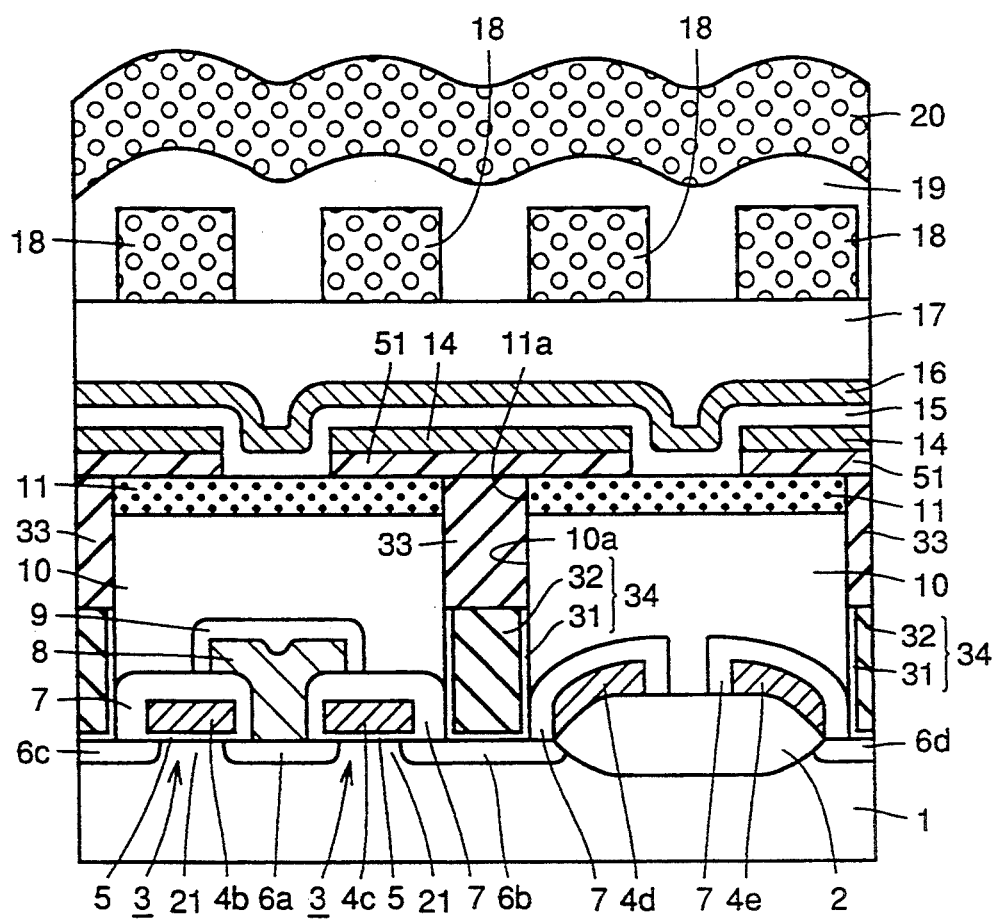
FIG. 24 is a cross section showing a DRAM of a fifth embodiment of he invention.

Referring to FIG. 24, a fifth embodiment includes structures of the third embodiment shown in FIG. 14 and additionally includes adhesion layers 51 made of Ti, Zr, Al or Ta. The adhesion layer 51 is effective in such a case that the adhesion layer 11 is made of material of which adhesion property is good with respect to the high dielectric film 15 but is bad with respect to the capacitor lower electrode layer 14. In this fifth embodiment, the adhesion between the interlayer insulating film 10 and the high dielectric film 15 is improved by the adhesion layer 11, and the adhesion between the interlayer insulating film 10 and the capacitor lower electrode layer 14 is improved by the adhesion layers 11 and 51.

Figure 25:
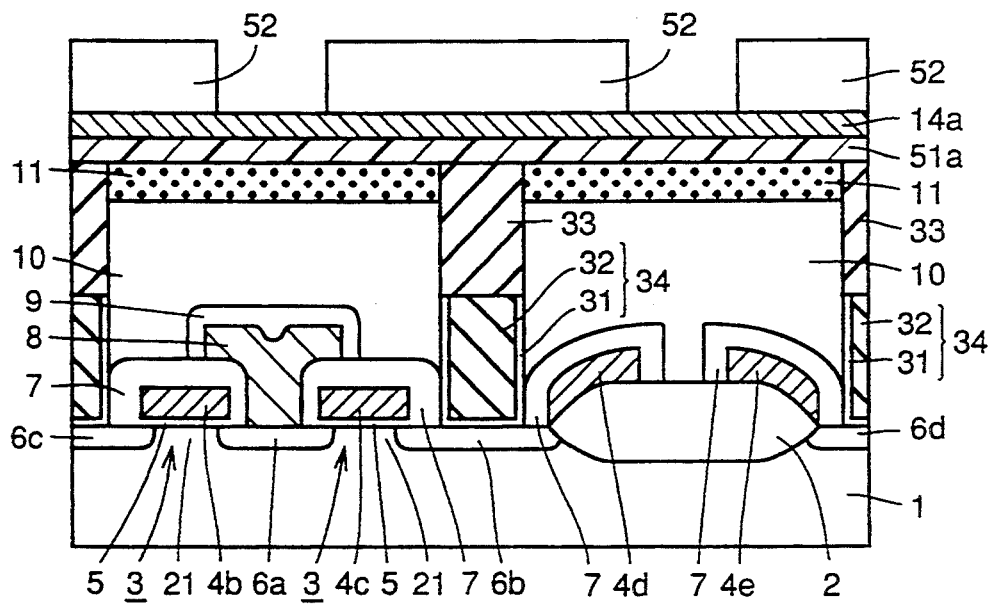
FIGS. 25 and 26 are cross sections showing 1st and 2nd steps in a process for manufacturing the DRAM of the fifth embodiment shown in FIG. 24, respectively.
Figure 26:
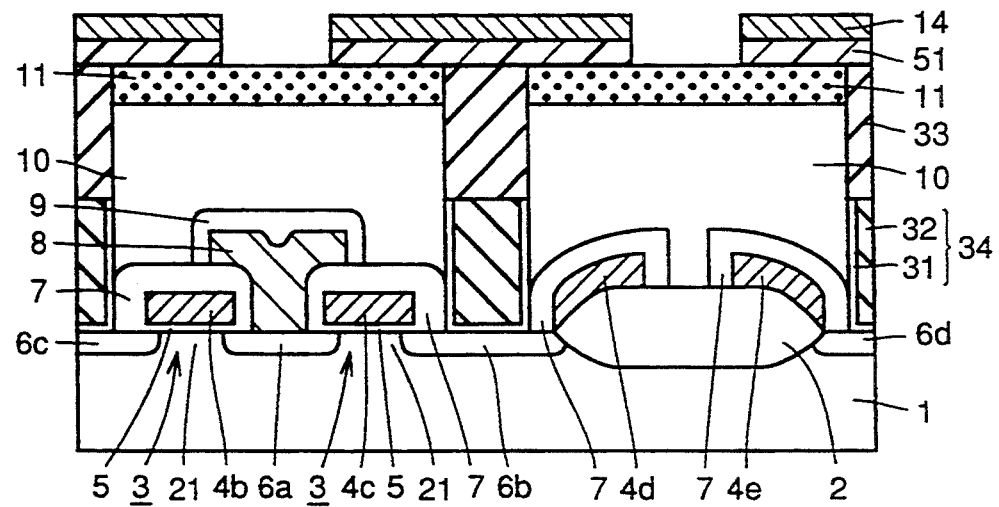

Referring to FIGS. 25 and 26, the adhesion layer 51 of the fifth embodiment is formed as described below.

As shown in FIG. 25, an adhesion layer 51a made of Ti, Al, Zr or Ta and having a thickness of about 50 to about 2000 Å is formed on the adhesion layer 11 and barrier plugs 33. A platinum layer 14a having a thickness of about 250 to 1500 Å is formed on the adhesion layer 51a by the sputter method. A resist 52 is formed in predetermined regions on the platinum layer 14a by photolithography. Using the resist 52 as a mask, dry etching is effected on the platinum layer 14a and adhesion layer 51a. Thereby, the capacitor lower electrode layers 14, i.e., patterned platinum layers and the patterned adhesion layers 51 are completed as shown in FIG. 26. In this manner, the adhesion layers 51 of the fifth embodiment are formed.

Figure 27:
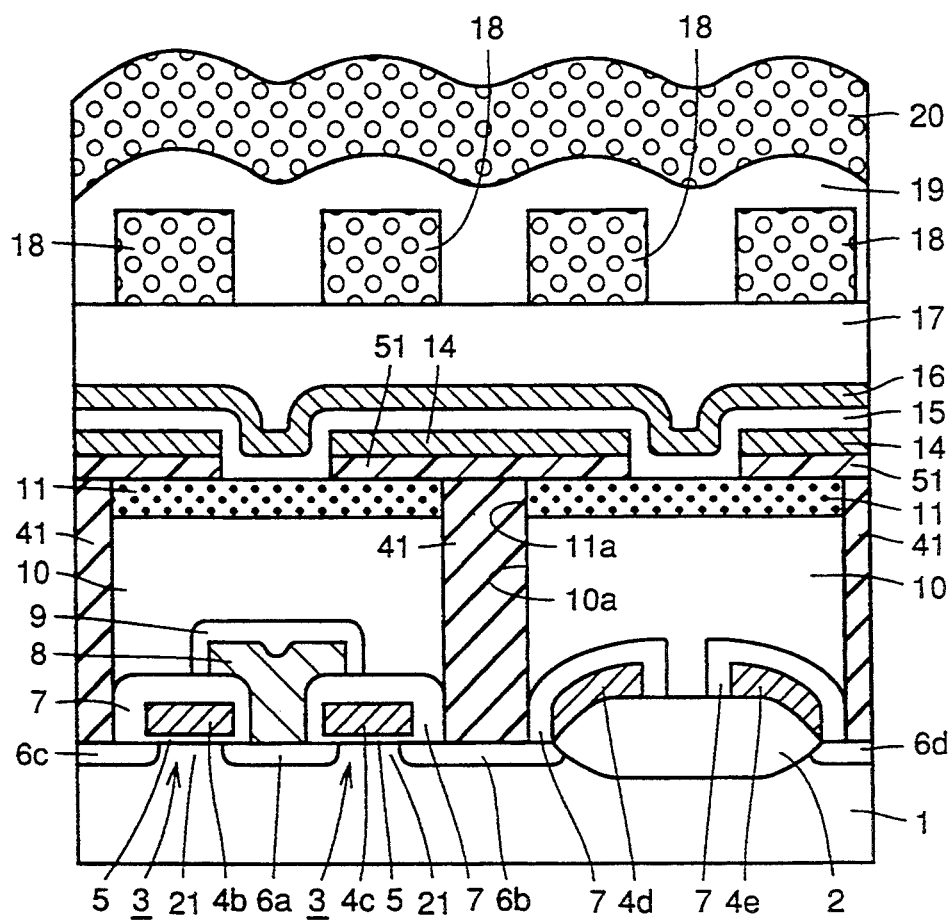
FIG. 27 is a cross section showing a DRAM of a sixth embodiment of the invention.

Referring to FIG. 27, a sixth embodiment differs from the fifth embodiment shown in FIG. 24 in that the plug electrode part is formed only of the barrier plug 41. Other structures are similar to those of the fifth embodiment shown in FIG. 24. In this sixth embodiment, since the plug electrode part is formed only of the barrier plug 41, the barrier plug 41 can be made longer than that in the fifth embodiment shown in FIG. 24. Therefore, the barrier function of the barrier plug 41 is improved compared with the fifth embodiment. As a result, silicide reaction which may occur between the capacitor lower electrode layer 14 made of the platinum layer and the silicon substrate 1 is prevented more effectively. Compared with the fifth embodiment, the process for manufacturing the plug electrode part can be facilitated. More specifically, the sixth embodiment does not require the process for manufacturing the contact plugs 34 made of the TiN/Ti layers 31 and tungsten plugs 32, which is required in the fifth embodiment. Therefore, the manufacturing process can be simplified.

Figure 28:
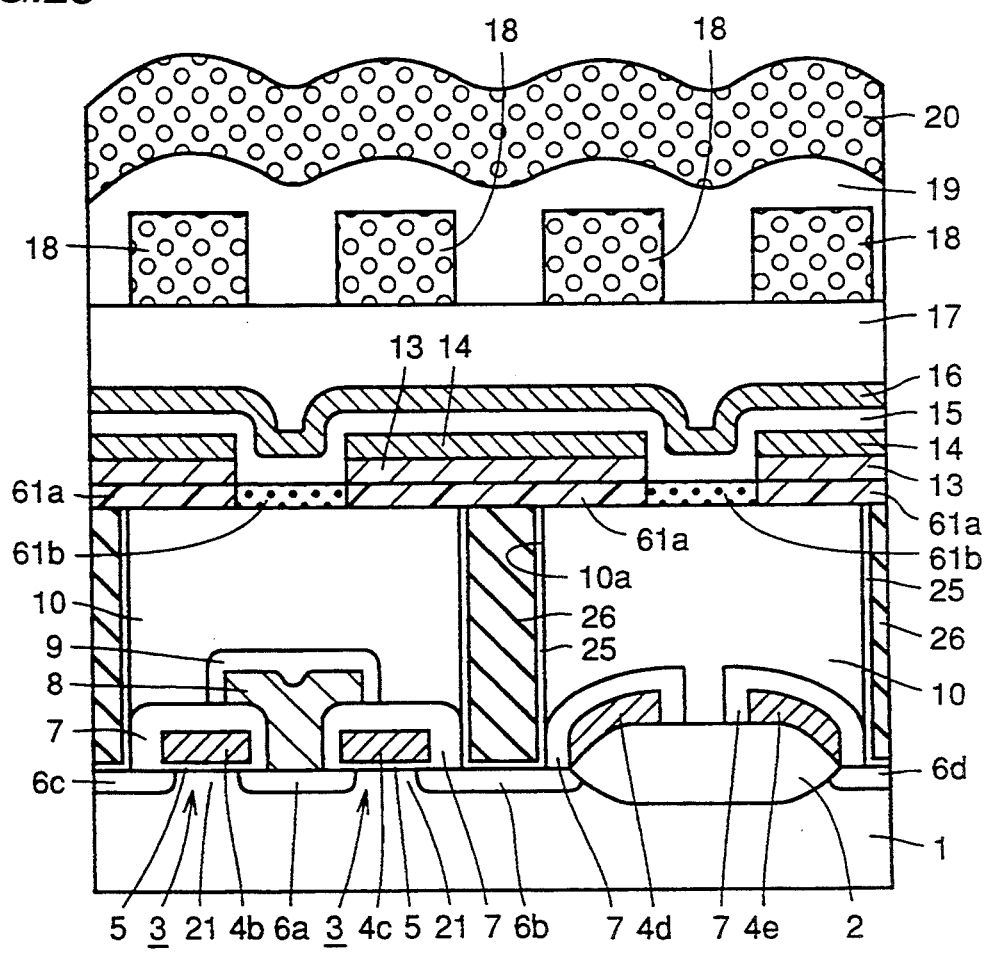
FIG. 28 is a cross section showing a DRAM of a seventh embodiment of the invention.

Referring to FIG. 28, a DRAM of a seventh embodiment differs from the first to sixth embodiments described before in that the interlayer insulating film 10 is covered not entirely but partially by adhesion layers 61b made of insulating material, i.e., $TiO_2$, $ZrO_2$, $Al_2O_3$, $Ta_2O_5$ or $Si_3N_4$. More specifically, the adhesion layers 61b are located only in regions through which the high dielectric film 15 is opposed to the interlayer insulating film 10. Adhesion layers 61a made of Ti, Al, Zr, Ta or Si are formed between the capacitor lower electrode layers 14 and the interlayer insulating film 10. The capacitor lower electrode layers 14 are formed on the adhesion layers 61a with the barrier layers 13 of TiN therebetween. The capacitor lower electrode layers 14 and the adhesion layers 61b are covered with the highly dielectric film 15, on which the capacitor upper electrode layer 16 made of platinum or the like is formed. In this seventh embodiment, the plug electrodes are formed of the TiN/Ti layers 25 and the tungsten plugs 26.

In this seventh embodiment, the adhesion layer 61b can achieve good adhesion between the highly dielectric film 15 and the interlayer insulating film 10, i.e., silicon oxide film. Also, the adhesion layer 61a can achieve good adhesion between the capacitor lower electrode layer 14 and the interlayer insulating film 10. The plug electrode may be formed of a polysilicon plug, in which case a similar effect can be obtained.

Referring to FIGS. 29–32, an example of a process for manufacturing the DRAM of the seventh embodiment will be described below.

Figure 29:
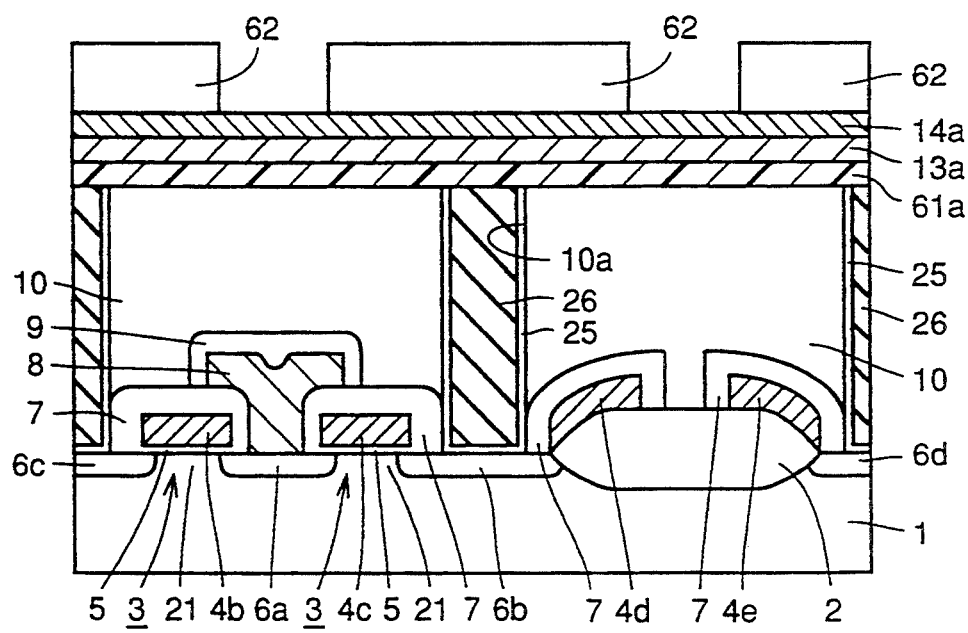
FIGS. 29 to 32 are cross sections showing 1st to 4th steps in a process for manufacturing the DRAM of the seventh embodiment shown in FIG. 28, respectively.

As can be understood from FIG. 29, the manufacturing process from the start to the formation of the TiN/Ti layers 25 and the tungsten plugs 26 are the same as those of the embodiments already described. Specifically, after forming the gate electrodes 4b–4e, buried bit line 8 and others, the interlayer insulating film 10 made of the silicon oxide film and having a thickness of about 8000 to about 15000 Å is formed on the whole surface by the CVD method at a temperature of about 400° to 900° C. Thereafter, photolithography and dry etching are effected to form the contact holes 10a in the interlayer insulating film 10. The TiN/Ti layers 25 and the tungsten plugs 26 are formed in the contact holes 10a using the same manufacturing process as the second embodiment shown in FIGS. 12 and 13.

Then, the adhesion layer 61a made of Ti, Al, Zr, Ta or Si are formed on the interlayer insulating film 10, TiN/Ti layers 25 and tungsten plugs 26 by the sputter method. The adhesion layer 61a has a thickness of about 30 to 300 Å and is formed at a temperature in a range from the room temperature to 800° C. Thereafter, the TiN layer 13a having a thickness of about 50 to 2000 Å is formed on the adhesion layer 61a by the sputter method at a temperature in a range from the room temperature to 800° C. A WN layer may be used instead of the TiN layer 13a.

Figure 30:
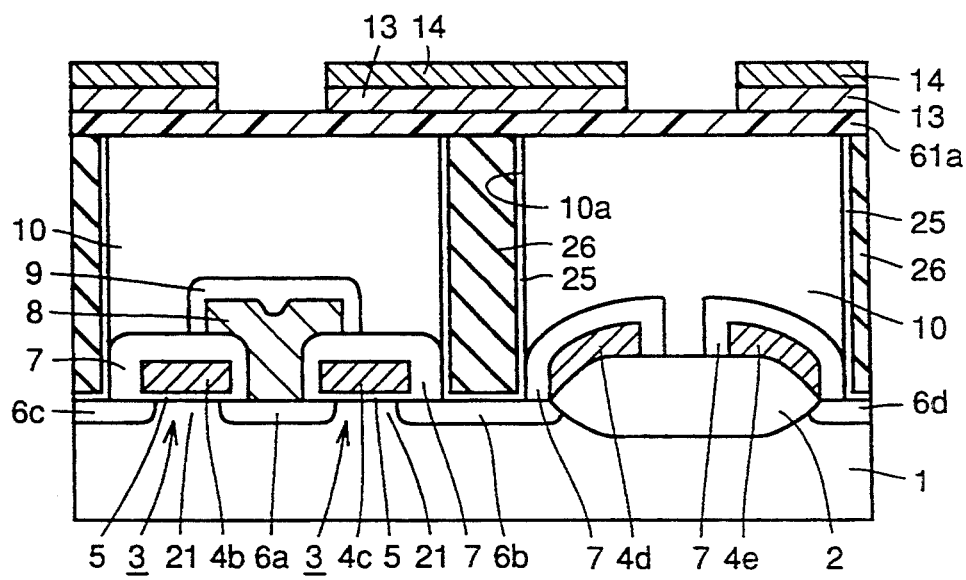

The platinum layer 14a having a thickness of about 250 to 1500Å is formed on the TiN layer 13a by the sputter method at a temperature in a range from the room temperature to 800° C. A resist 62 is formed in predetermined regions on the platinum layer 14a by the photolithography. Using the resist 62 as a mask, anisotropic etching is effected on only the two layers, i.e., the platinum layer 14a and the TiN layer 13a. Thereby, the capacitor lower electrode layers 14 and barrier layers 13 which are patterned as shown in FIG. 30 are completed.

Figure 31:
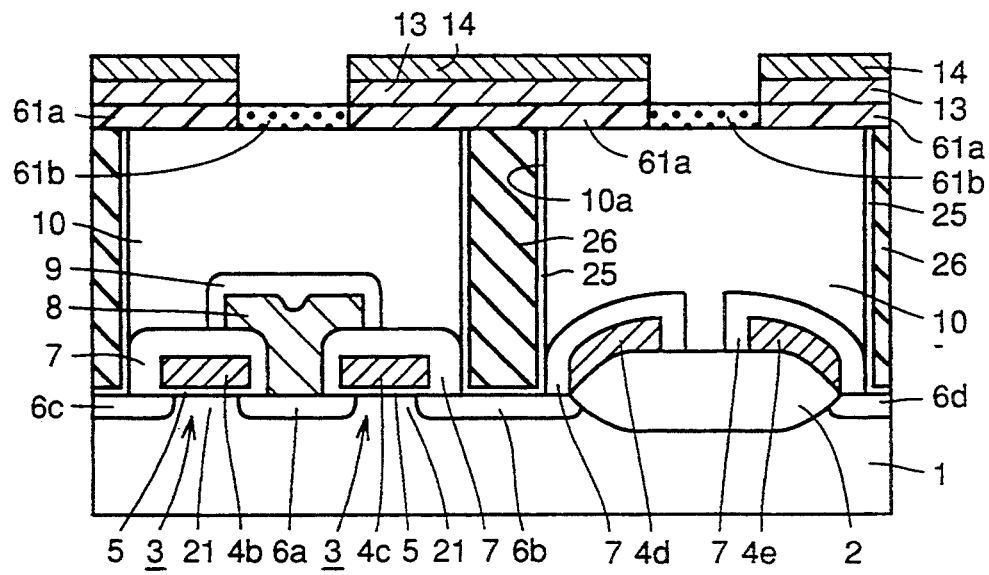

Using the capacitor lower electrode layers 14 as a mask, the adhesion layer 61a made of Ti is oxidized at a temperature of 200 to 800° C. Thereby, the adhesion layers 61b made of $TiO_2$ are formed as shown in FIG. 31. If the adhesion layer 61a is made of Al, Zr or Ta, oxidation can be carried out under the same oxidizing conditions to form the adhesion layers 61b made of oxide of the above material. If the adhesion layer 61a is made of Si, it is nitrided at a temperature of 600 ° to 1000° C., so that the adhesion layers 61b made of $Si_3N_4$ are obtained. Thus, the adhesion layers 61b are made of oxide or nitride of the adhesion layer 61a in this manufacturing process.

Figure 32:
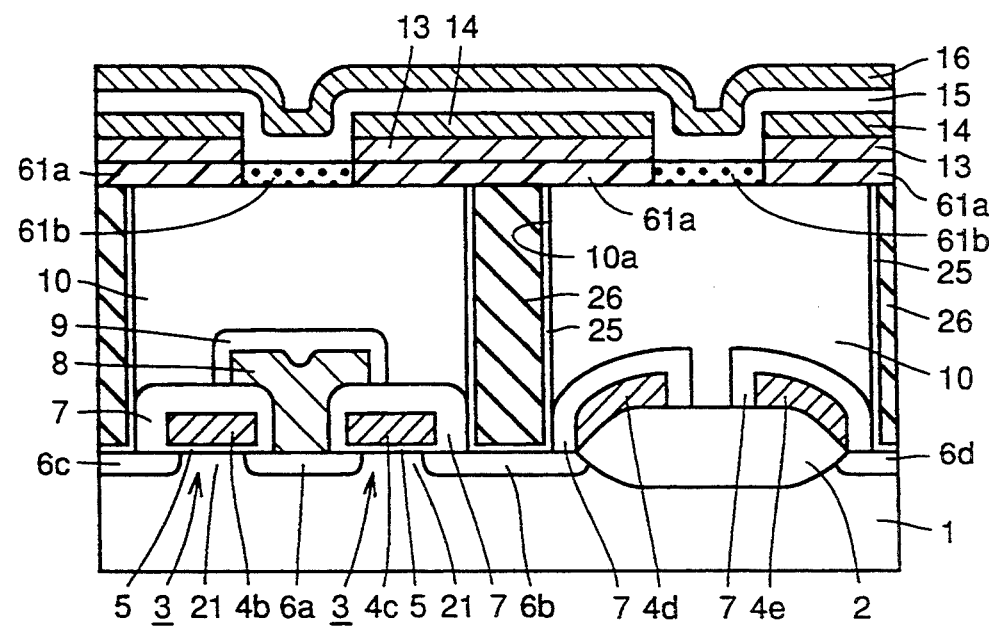

Then, as shown in FIG. 32, the highly dielectric film 15 made of (Ba, Sr)$TiO_3$ having a thickness of about 500 to about 1500 Å is formed by the sputter method or CVD method at a temperature of 300° to 800° C. Instead of the above material, the highly dielectric film 15 may be made of $SrTiO_3$, Pb(Zr, Ti)$O_3$, (Pb, La)(Zr, Ti)$O_3$, $BaTiO_3$, (Pb, Ba)(Zr, Ti)$O_3$, (Pb, Sr)(Zr, Ti)$O_3$ or the like. Thereafter, the platinum layer, i.e., the capacitor upper electrode layer 16 having a thickness of about 1000 to 2000 Å is formed on the high dielectric film 15 by the sputter method. Instead of the platinum, the capacitor upper electrode layer 16 may be made of TiN, Al, W or Mo.

Finally, as shown in FIG. 28, the interlayer insulating film 17 is formed on the capacitor upper electrode layer 16. The aluminum interconnections 18, which correspond to the gate electrodes 4b, 4c, 4d and 4e and are spaced by a predetermined distance from each other, are formed on the interlayer insulating film 17. After forming the protection film 19 on the aluminum interconnections 18, the aluminum interconnection 20 is formed on the protection film 19. In this manner, the DRAM of the seventh embodiment is completed.

Figure 33:
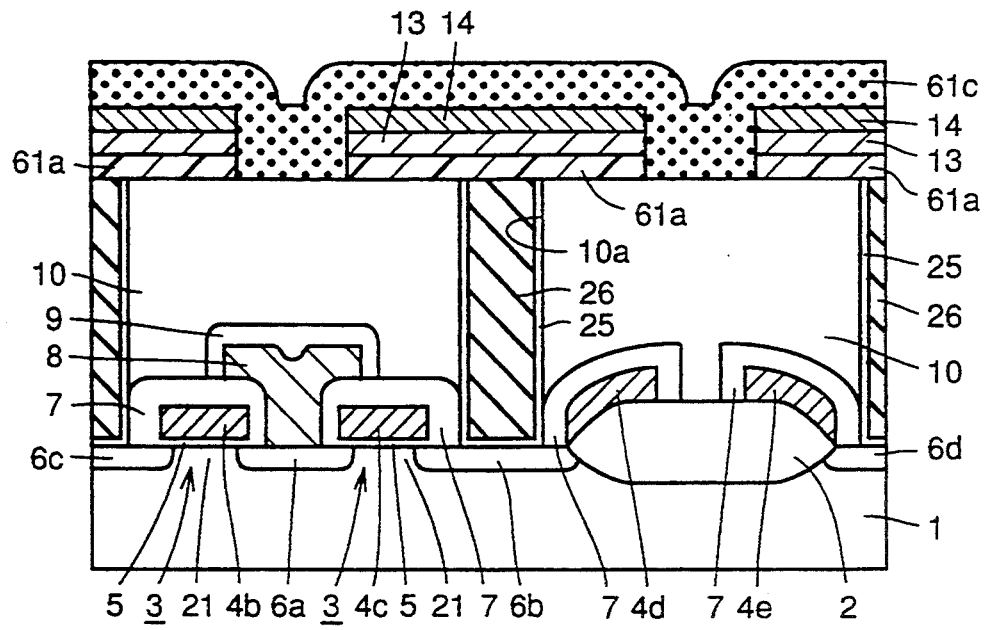
FIGS. 33 and 34 are cross sections showing 1st and 2nd steps in another process for manufacturing the DRAM of the seventh embodiment shown in FIG. 28, respectively.
Figure 34:
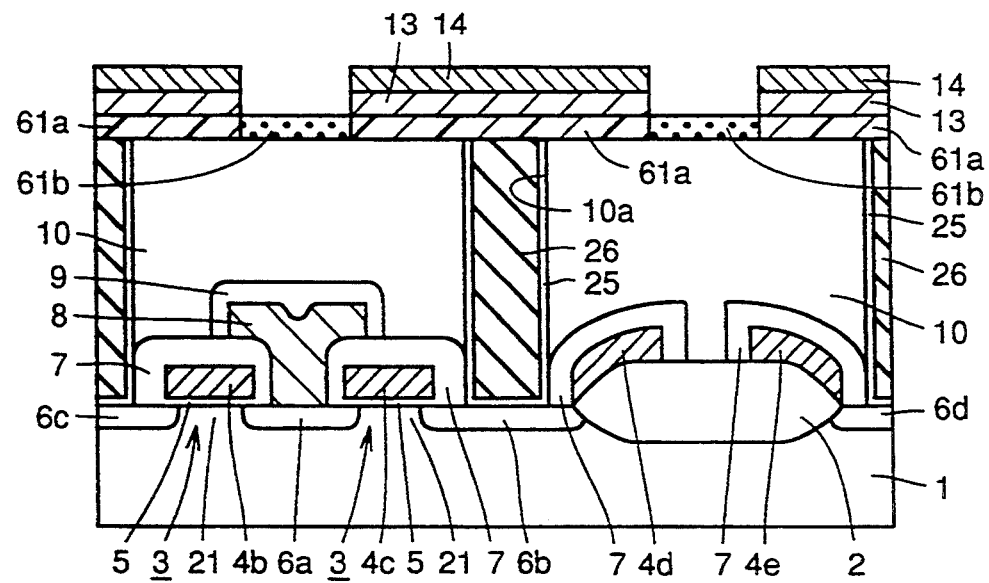

Referring to FIGS. 33 and 34, another example of the process of manufacturing the DRAM of the seventh embodiment will be described below. In the step shown in FIG. 29, dry etching is effected on all the platinum player 14a, TiN layer 13a and adhesion layer 61a using the resist 62 as a mask. Thereafter, the CVD method or sputter method is effected to form an adhesion layer 61c made of $TiO_2$, $Al_2O_3$, $ZrO_2$, $Ta_2O_5$ or $Si_3N_4$ and covering the whole surface. The adhesion layer 61c is formed at a temperature in a range from the room temperature to 870° C. to have a thickness of about 300 to about 6000 Å. Then, etchback is effected on the adhesion layer 61c to form the adhesion layers 61b as shown in FIG. 34. The adhesion layers 61b may be formed in this manner.

Figure 35:
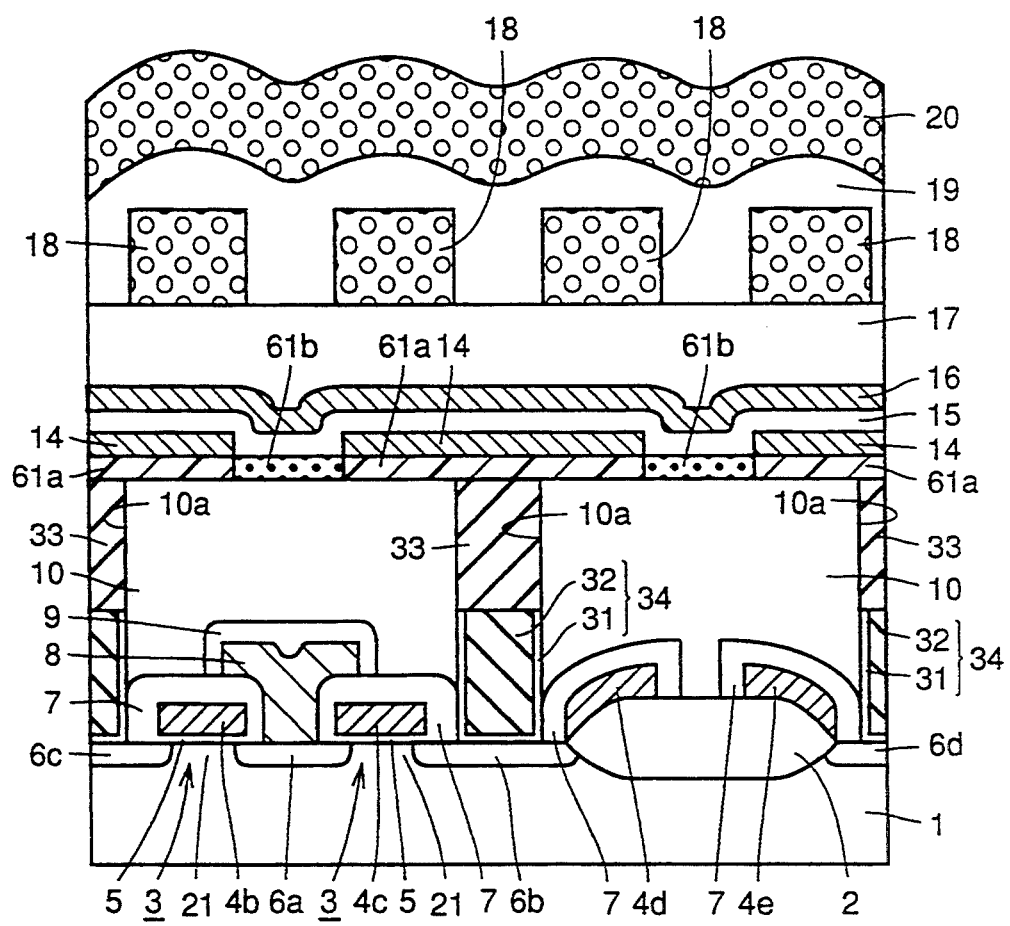
FIG. 35 is a cross section showing a DRAM of an eighth embodiment of the invention.

Referring to FIG. 35, an eighth embodiment differs from the seventh embodiment in that the plug electrode is formed of the contact plug 34, which consists of the TiN/Ti layer 31 and the tungsten plug 32, and the barrier plug 33 made of TiN. Since the barrier plug 33 is used as a part of the plug electrode, the barrier layer 33 in the seventh embodiment shown in FIG. 28 is not required. Therefore, the eighth embodiment can reduce a difference in level at the region including the capacitor lower electrode layer 14, as compared with the seventh embodiment. Other structures and features of the eighth embodiment are similar to those of the seventh embodiment.

Figure 36:
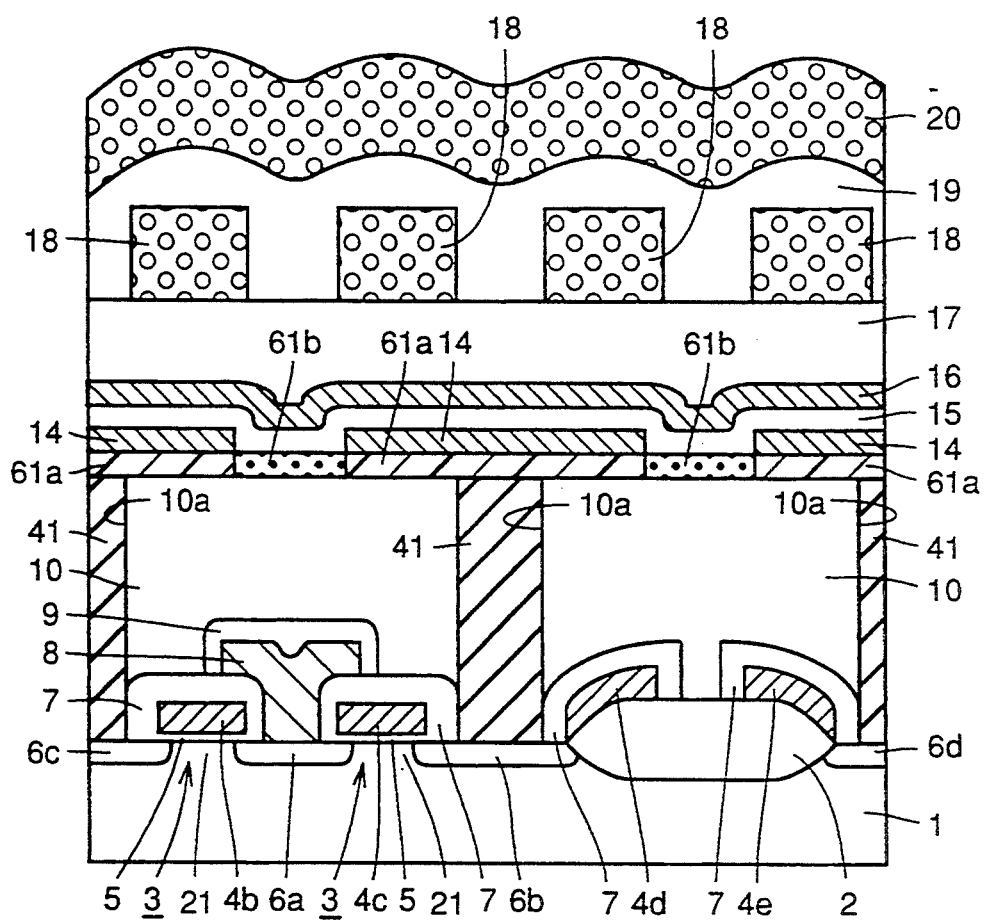
FIG. 36 is a cross section showing a DRAM of a ninth embodiment of the invention.

Referring to FIG. 36, a ninth embodiment includes the plug electrode which is formed only of the barrier plug 41 made of TiN. Thereby, the barrier layer 13 in FIG. 28 disposed under the capacitor lower electrode layer 14 is not required, which is similar to the eighth embodiment. As a result, a difference in level at a region including the capacitor lower electrode layer 14 can be reduced. In this ninth embodiment, since all the plug electrodes are formed of the barrier plugs 41, the barrier plugs 41 are longer than the barrier plugs 33 in the eighth embodiment shown in FIG. 35. This further improves the barrier function of the barrier plugs 41. As a result, it is possible to prevent more effectively the silicide reaction between the silicon substrate 1 and the capacitor lower electrode layers 14 made of platinum layers.

Figure 37:
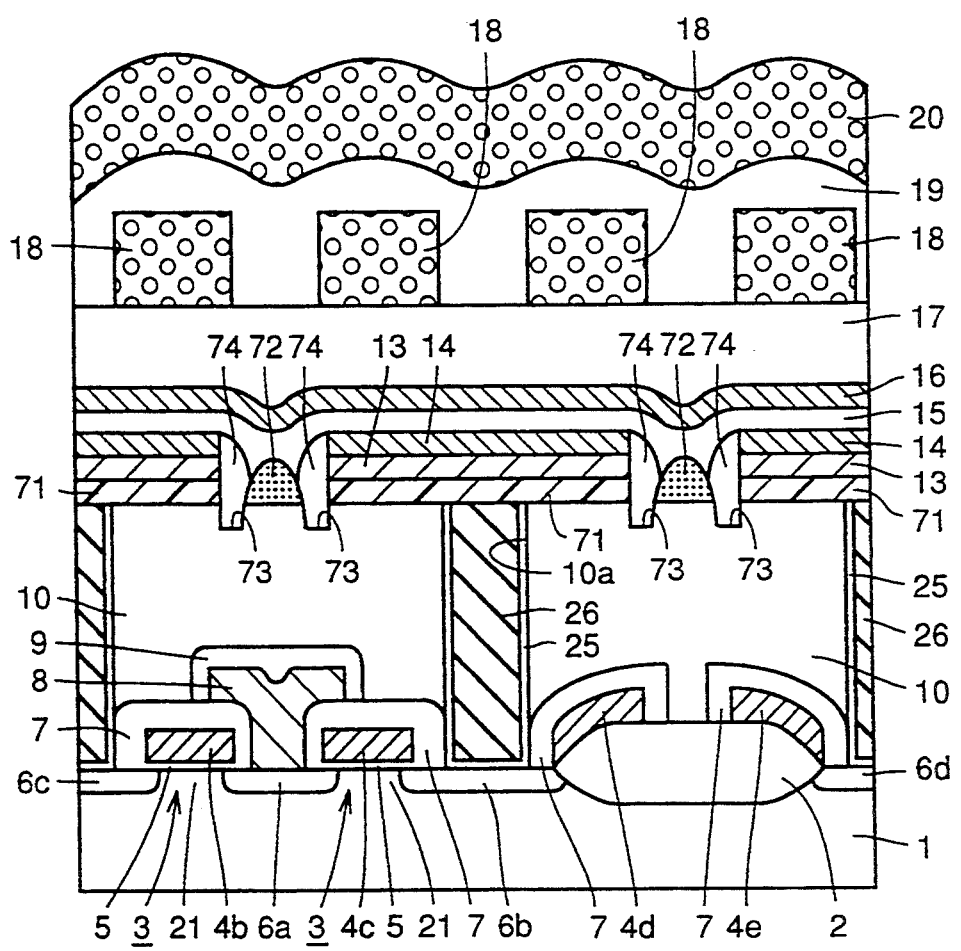
FIG. 37 is a cross section showing a DRAM of a tenth embodiment of the invention.

Referring to FIG. 37, a tenth embodiment includes adhesion layers 72 which are disposed between the interlayer insulating film 10 made of the silicon oxide film and the high dielectric film 15 and are made of $TiO_2$, $ZrO_2$, $Al_2O_3$, $Ta_2O_5$ or $Si_3N_4$. Further, adhesion layers 71 made of Ti, Al, Zr, Ta or Si are formed between the capacitor lower electrode layers 14 made of platinum layers and the interlayer insulating film 10. The interlayer insulating film 10 is provided with isolating trenches 73 which are located between the adhesion layers 71 and 72. The isolating trenches 73 are filled with side wall oxide films 74 which are made of silicon oxide films and are located on the side walls of the capacitor lower electrode layers 14, barrier layers 13 and adhesion layers 71.

In this tenth embodiment, the adhesion layers 71 and 72 can be isolated completely owing to provision of the isolating trenches 73. Thereby, it is possible to effectively prevent leak of the electric charges accumulated in the capacitor lower electrode layer 14 to an adjacent capacitor through the adhesion layers 71 and 72. More specifically, the adhesion layer 72 is formed by oxidizing or nitriding the adhesion layer 71 as will be described later. However, the adhesion layer 72 may not be oxidized or nitrided completely, in which case the adhesion layer 72 does not have a complete insulating property. In this case, if the adhesion layers 71 and 72 were continuous to each other, such electric charges accumulated in the capacitor lower electrode layer 14 might leak to an adjacent capacitor through the adhesion layers 71 and 72.

In view of the above, this embodiment is provided with the isolating trenches 73 between the adhesion layers 71 and 72. Thereby, the adhesion layers 71 and 72 can be isolated completely from each other, so that leak of the charges from the capacitor lower electrode layer 14 can be effectively prevented. Further, this embodiment is provided with the side wall oxide films 74 which are made of the silicon oxide films and filling the isolating trenches 73, so that the adhesion layers 71 and 72 can be isolated more completely from each other.

Also in this tenth embodiment, the adhesion layer 72 can achieve good adhesion between the high dielectric film 15 and the interlayer insulating film 10, similarly to the first to ninth embodiments described before. Further, the adhesion layer 71 can achieve good adhesion between the capacitor lower electrode layer 14 and the interlayer insulating film 10.

Referring to FIGS. 38 to 43, a process for manufacturing the DRAM of the tenth embodiment will be described below.

Figure 38:
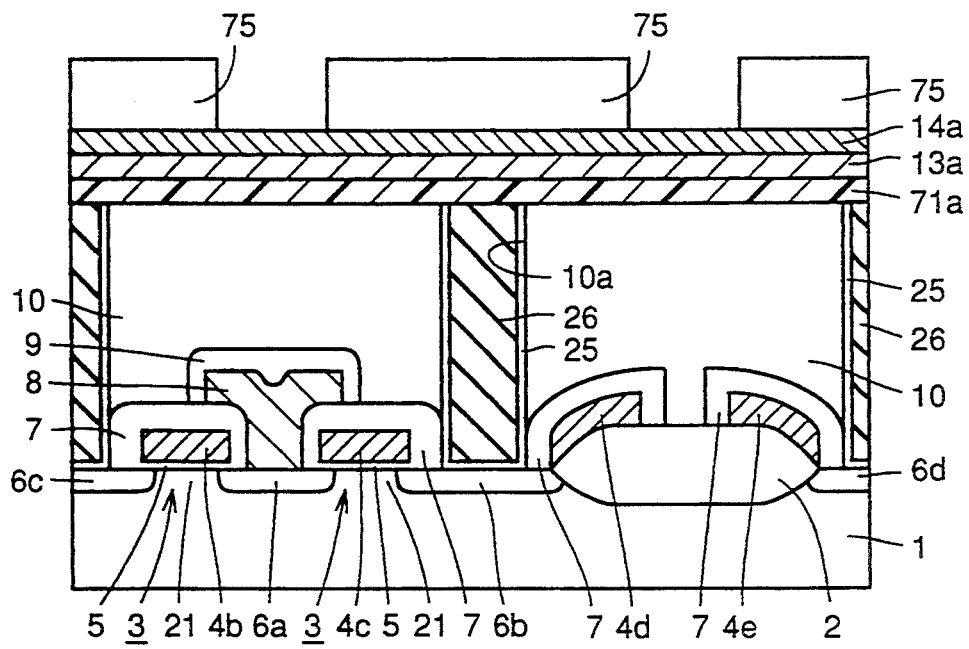
FIGS. 38 to 43 are cross sections showing 1st to 6th steps in a process for manufacturing the DRAM of the tenth embodiment shown in FIG. 37, respectively.

Referring to FIG. 38, a titanium layer 71a, a TiN layer 13a and a platinum layer 14a, which will form the adhesion layers, barrier layers and capacitor lower electrode layers, respectively, are formed on the interlayer insulating film 10, TiN/Ti layers 25 and tungsten plugs 26 by a process similar to the manufacturing process of the seventh embodiment shown in FIG. 29. The titanium layer 71a has a thickness of about 50 to about 500 Å, the TiN layer 13a has a thickness of about 50 to about 500 Å, and the platinum layer 14a has a thickness of about 250 to about 1500 Å. The titanium layer 71a, TiN layer 13a and platinum layer 14a are formed by the sputter method at a temperature in a range from the room temperature to 800° C. Thereafter, a resist 75 is formed in predetermined regions on the platinum layer 14a by the photolithography.

Figure 39:
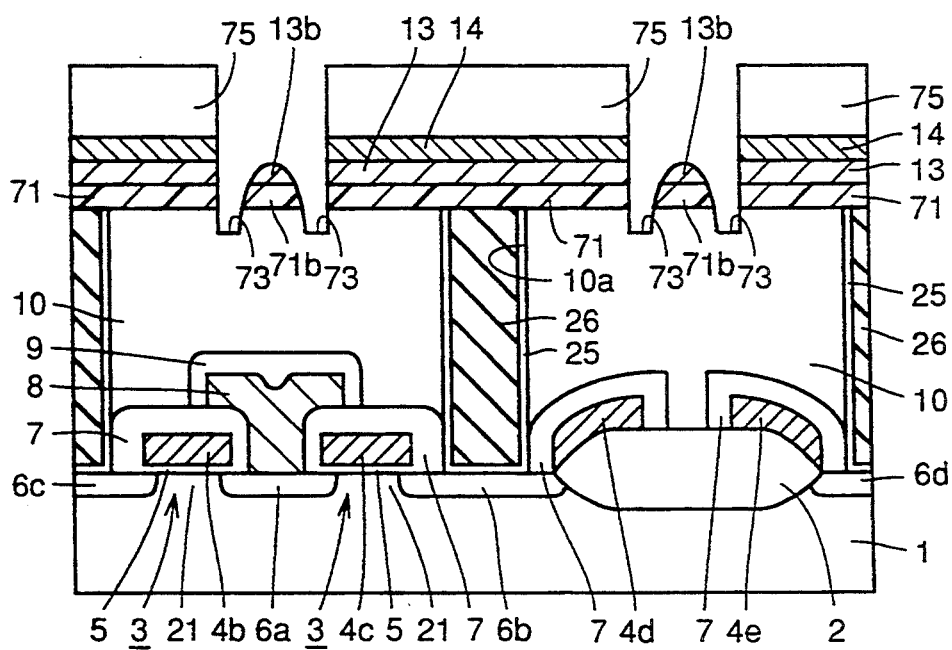

Using the resist 75 as a mask, the sputter etching is effected with inert gas such as Ar. Thereby, a structure shown in FIG. 39 is obtained. According to the sputter etching with the inert gas such as Ar, portions beside the resist 75 are etched at an etching rate which is about two to four times as high as that of the other portions. This is disclosed, for example, in 1985 DRY PROCESS SYMPOSIUM IV-4 "ETCHED SHAPE CONTROL OF SINGLE CRYSTALLINE CHLORINE" pp 102–107. Therefore, by the sputter etching with the resist 75 shown in FIG. 39 and the inert gas, the isolating trenches 73 can be formed only at portions beside the resist 75 without removing Ti layers 71b and TiN layers 13b. More specifically, the sputter etching is carried out with an RIE device of a parallel plate type and Ar gas under the conditions of a pressure of 0.2 mTorr, a power of 300 W, and an etching rate of 300 Å/min for seven to eight minutes, whereby the isolating trenches 73 having a depth of about 1000 Å from the top surface of the interlayer insulating film 10 and a width of about 2000 Å is formed.

Figure 40:
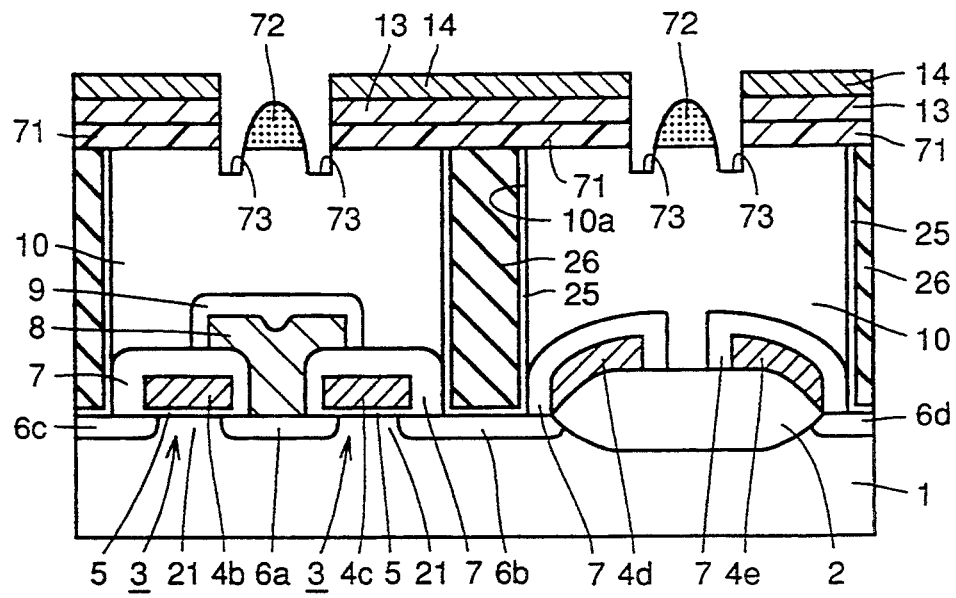

By this sputter etching, the TiN layers 13b may be removed and only the Ti layers 71b may be left. Further, the sputter etching described above produces the capacitor lower electrode layers 14 made of platinum layers, the barrier layers 13 made of TiN and adhesion layers 71 made of Ti. Thereafter, the resist 75 is removed. Thereafter, oxidation is effected on the TiN layers 13b and the Ti layers 71b in oxygen atmosphere for about 10 to about 60 minutes at a temperature of 350° to 700° C. using the capacitor lower electrode layers 14 made of platinum layers as a mask. Thereby, the adhesion layers 72 made of $TiO_2$ are completed as shown in FIG. 40.

Figure 41:
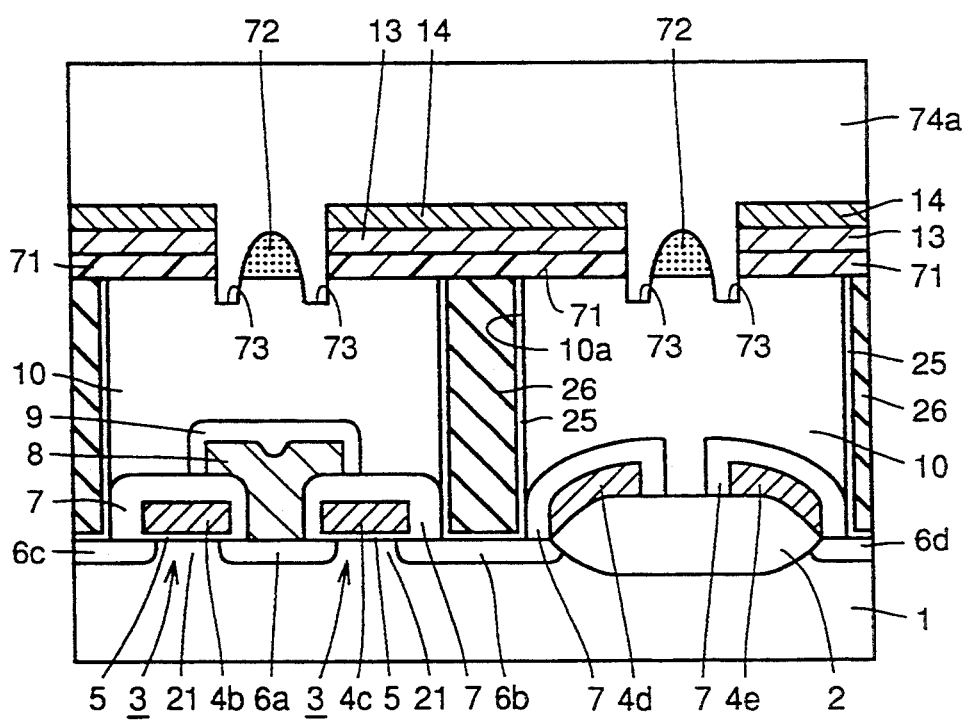
Figure 42:
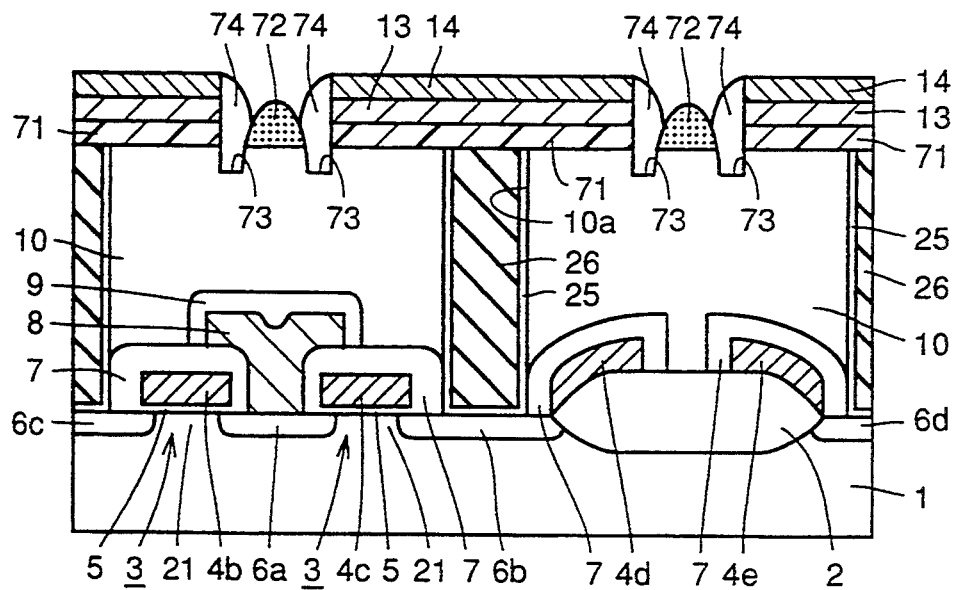

Then, as shown in FIG. 41, a silicon oxide film 74a having a thickness of about 500 to about 5000 Å is formed on the whole surface by the CVD method at a temperature of 400° to 900° C. Anisotropic etching is effected on the whole surface of the silicon oxide film 74a to form side wall oxide films 74 as shown in FIG. 42. The side wall oxide films 74 are located on the side walls of the adhesion layers 71, barrier layers 13 and capacitor lower electrode layers 14, and fill the isolating trenches 73. Thereby, the adhesion layers 71 and 72 are isolated more completely from each other.

Figure 43:
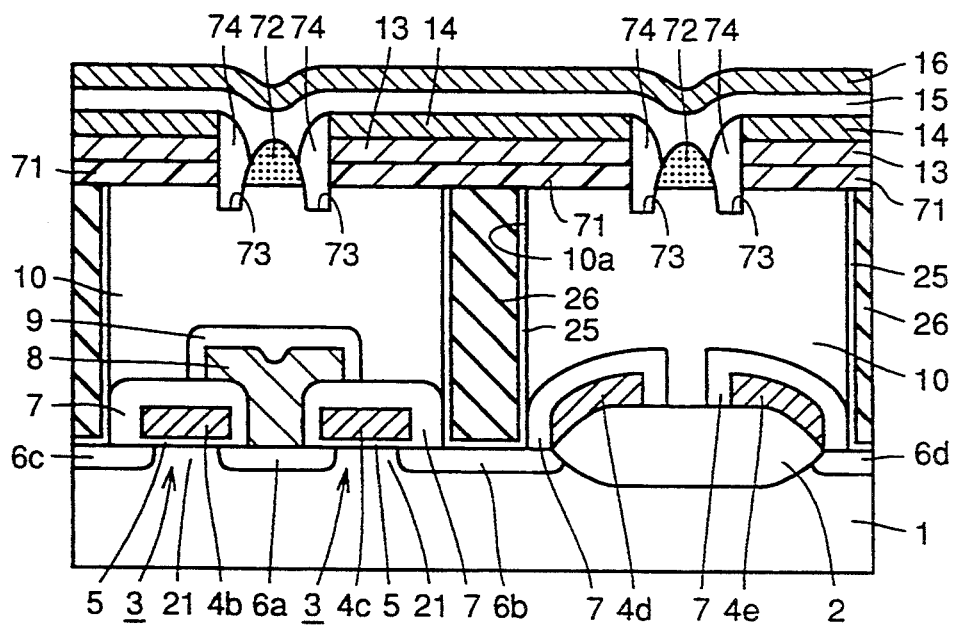

As shown in FIG. 43, the high dielectric film 15 which has a thickness of about 300 to about 1500 Å and is made of $(Ba, Sr)TiO_3$ is formed by the sputter method or CVD method at a temperature of 300° to 800° C. The capacitor upper electrode layer 16 made of the platinum layer and having a thickness of about 300 to 1500 Å is formed on the high dielectric film 15 at a temperature of 300° to 800° C.

After patterning the capacitor upper electrode layer 16 into a predetermined configuration (not shown), the interlayer insulating film 17 made of the silicon oxide film is finally formed by the CVD method as shown in FIG. 37. The interlayer insulating film 17 is formed at a temperature in a range from the room temperature to 450° C. to have a thickness of about 5000 to about 15000 Å. The aluminum interconnections 18 corresponding to the gate electrodes 4b, 4c, 4d and 4e are formed on the interlayer insulating film 17 with a predetermined space between each other. After forming the protection film 19 covering the aluminum interconnections 18, the aluminum interconnection 20 is formed on the protection film 19. In this manner, the DRAM of the tenth embodiment is completed.

Figure 44:
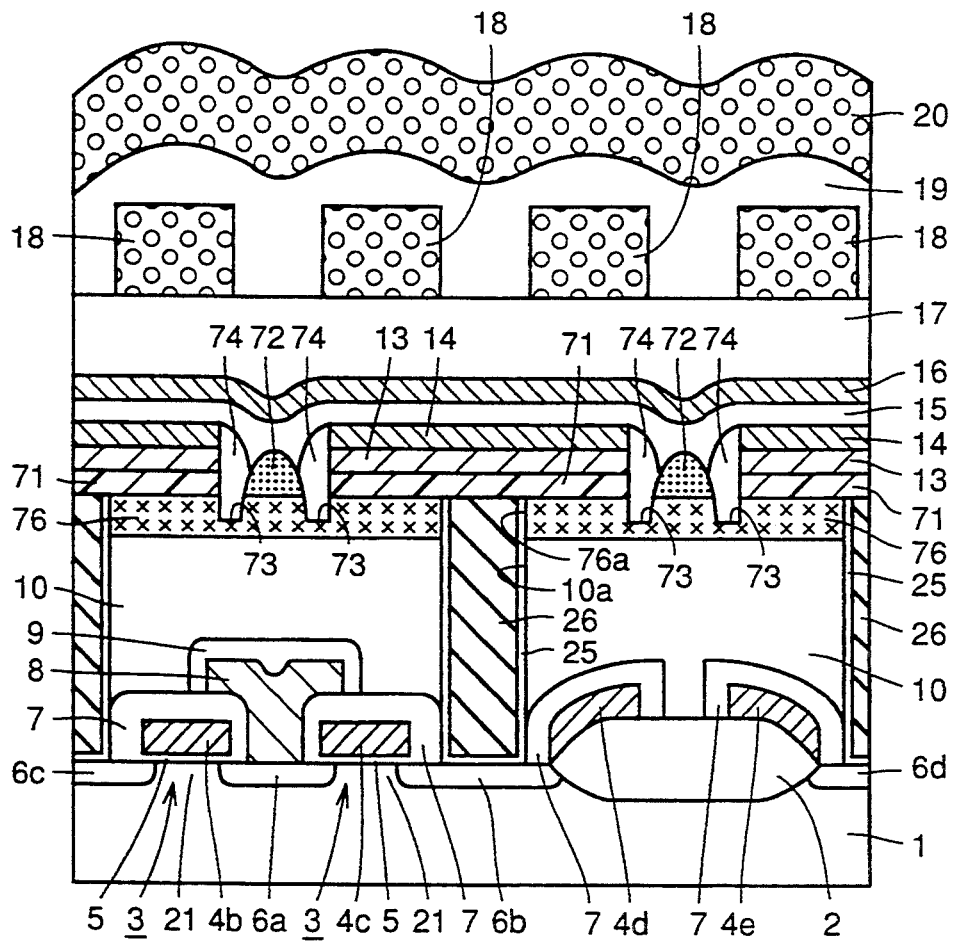
FIG. 44 is a cross section showing a DRAM of an eleventh embodiment of the invention.

Referring to FIG. 44, an eleventh embodiment includes the structures of the tenth embodiment shown in FIG. 37, and additionally includes a diffusion preventing layer 76 made of $Si_3N_4$ for preventing diffusion of the high dielectric film 15. More specifically, barium (Ba) and strontium (Sr) contained in the high dielectric film 15 tends to diffuse into the transfer transistor 3 at a lower position through the adhesion layer 72 and the interlayer insulating film 10. If alkaline metal such as Ba or Sr contained in the high dielectric film 15 entered the transfer gate transistor 3 in the lower position, characteristics of the transistor would be adversely affected. In view of this, the eleventh embodiment is provided with the diffusion preventing layer 76 made of $Si_3N_4$ between the adhesion layer 72 which is in contact with the high dielectric film 15 and the interlayer insulating film 10. According to the eleventh embodiment thus constructed, the alkaline metal such as Ba and Sr in the high dielectric film 15 is effectively prevented from diffusing into the transistors at the lower position. The diffusion preventing layer 76 may be made of $TiO_2$, $ZrO_2$, $Al_2O_3$, $Ta_2O_5$ or the like.

Figure 45:
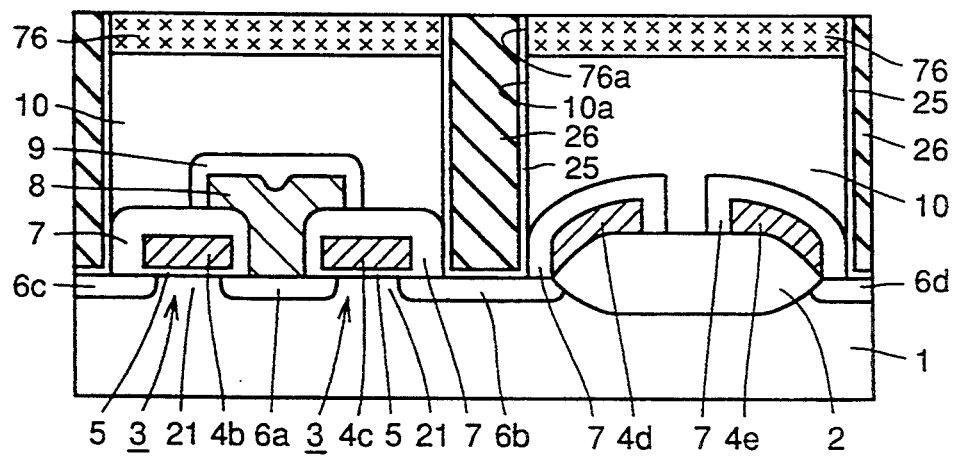
FIGS. 45 to 47 are cross sections showing 1st to 3rd steps in a process for manufacturing the DRAM of the eleventh embodiment shown in FIG. 44, respectively.
Figure 46:
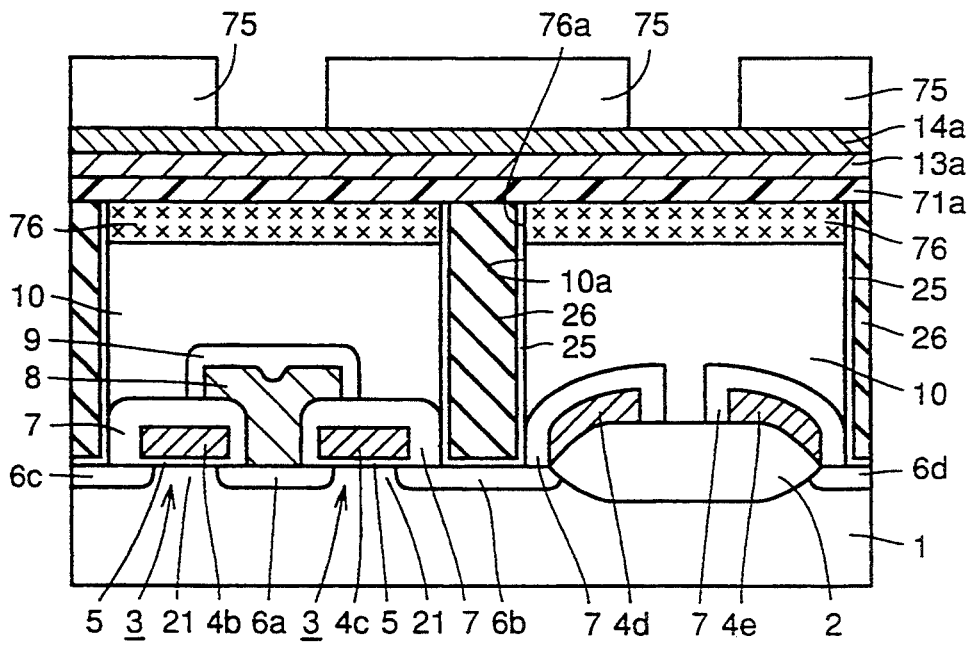
Figure 47:
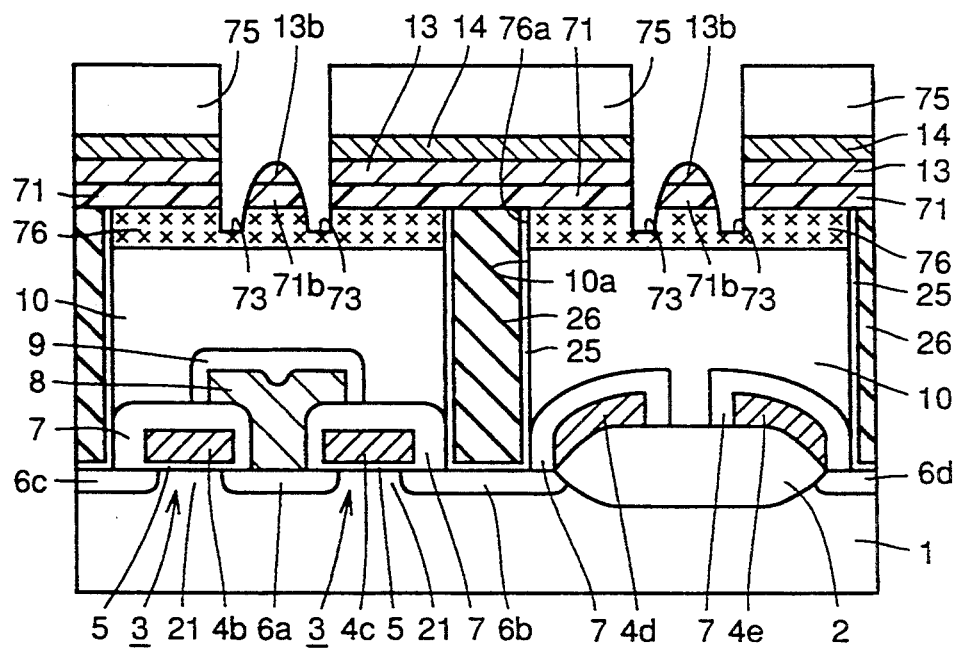

Referring to FIGS. 45 to 47, a process for manufacturing the eleventh embodiment will be described below.

As shown in FIG. 45, the element isolating oxide film 2, gate electrodes 4b–4e and buried bit line 8 are formed on the silicon substrate, and then the interlayer insulating film made of the silicon oxide film is formed by the CVD method to have a thickness of about 5000 to about 15000 Å. The diffusion preventing layer 76 made of $Si_3N_4$ and having a thickness of about 300 to about 5000 Å is formed on the interlayer insulating film 10 by the CVD method. Contact holes 76a and 10a are formed in the diffusion preventing layer 76 and the interlayer insulating film 10. The TiN/Ti layers 25 and the tungsten plugs 26 are formed by the process similar to the manufacturing process of the second embodiment shown in FIGS. 12 and 13.

Referring to FIG. 46, the Ti layer 71a, TiN layer 14a and platinum layer 15a are formed by the sputter method, and then the resist 75 is formed in predetermined regions on the platinum layer 15a. Using the resist 75 as a mask, the sputter etching is effected with inert gas such as Ar to form the isolating trenches 73 as shown in FIG. 47. Then, the resist 75 is removed, and oxidation is effected on the TiN layers 14b and Ti layers 71b using the capacitor lower electrode layers 15 as a mask. Thereby, the high dielectric film 15 and the capacitor upper electrode layer 16 are formed, and then the interlayer insulating film 17 is formed on the capacitor upper electrode layer 16. The aluminum interconnections 18 are formed on the interlayer insulating film 17 with a predetermined space between each other. After forming the protection film 19 on the aluminum interconnections 18, the aluminum interconnection 20 is formed. In this manner, the DRAM of the eleventh embodiment is completed.

Figure 48:
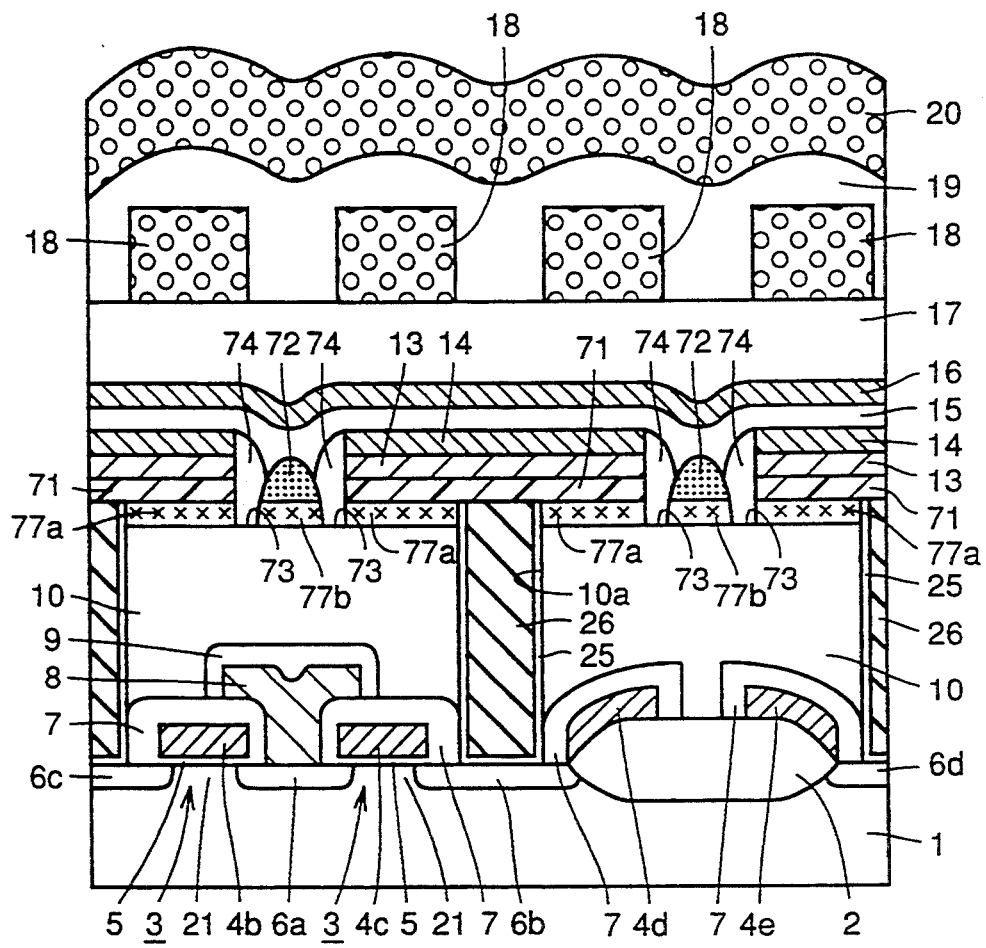
FIG. 48 is a cross section showing a DRAM of a twelfth embodiment of he invention.

Referring to FIG. 48, a twelfth embodiment includes diffusion preventing layers 77a and 77b made of $Si_3N_4$ on the interlayer insulating film 10, which is similar to the eleventh embodiment to some extent. The twelfth embodiment, however, differs from the eleventh embodiment in that the diffusion preventing layer 77b located under the adhesion layer 72 is completely isolated from the diffusion preventing layer 77a located under the adhesion layer 71 by the isolating trench 73. This structure can also achieve an effect similar to the eleventh embodiment. More specifically, since the diffusion preventing layer 77b is interposed between the adhesion layer 72 which is in contact with the high dielectric film 15 and the interlayer insulating film 10, the alkaline metal in the high dielectric film 15 can be effectively prevented from entering the transistor at the lower position through the adhesion layer 72.

Figure 49:
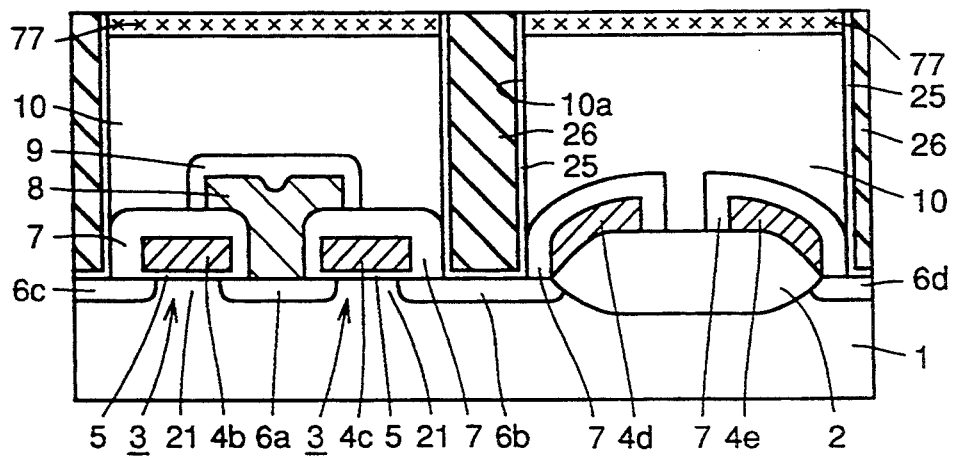
FIGS. 49 to 51 are cross sections showing 1st to 3rd steps in a process for manufacturing the DRAM of the twelfth embodiment shown in FIG. 48, respectively.
Figure 50:
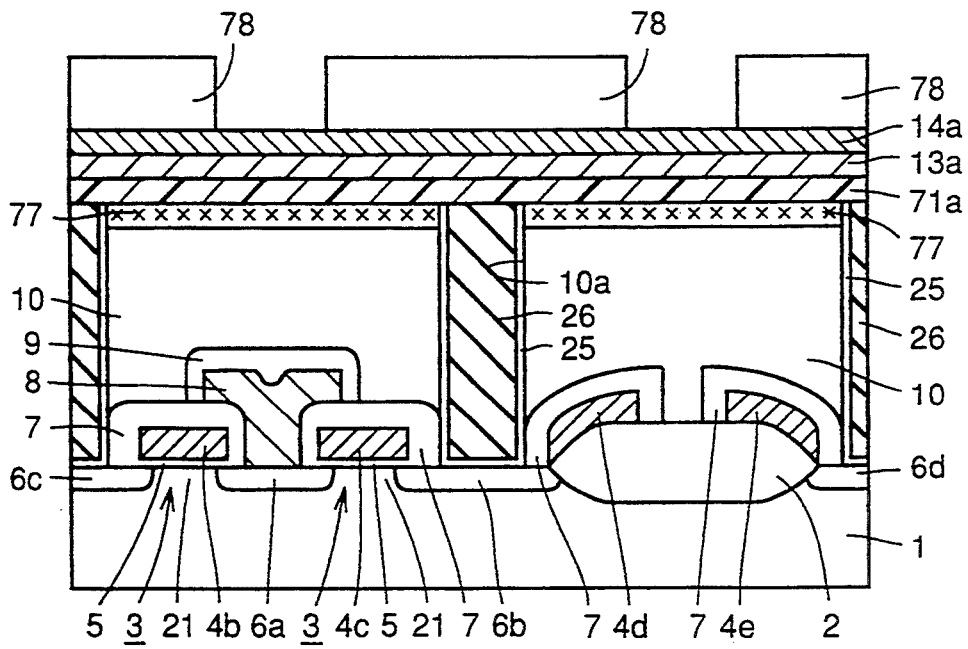
Figure 51:
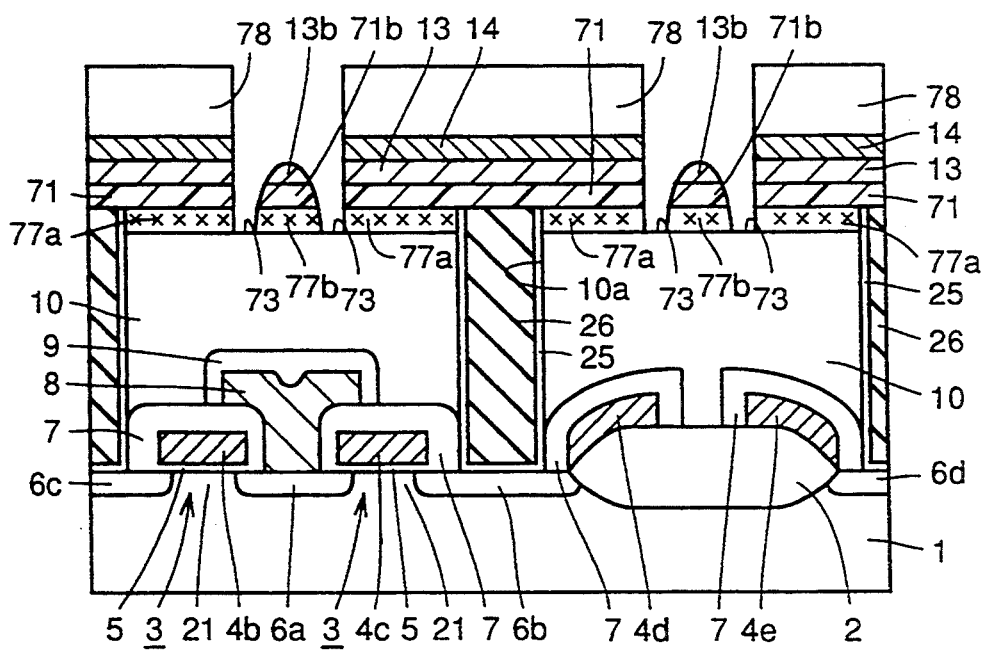

Referring to FIGS. 49–51, a process for manufacturing the DRAM of the twelfth embodiment will be described below.

As shown in FIG. 49, the interlayer insulating film 10, which has a thickness of about 5000 to about 15000 Å and is made of the silicon oxide film, and the diffusion preventing layer 77, which has a thickness of about 150 to about 2500 Å and is made of $Si_3N_4$, are formed by the manufacturing process similar to that already described with reference to FIG. 45. After forming the contact holes in the diffusion preventing film 77 and the interlayer insulating film 10, the TiN/Ti layers 25 and the tungsten plugs 26 are formed in the contact holes.

Then, as shown in FIG. 50, the Ti layer 71a, TiN layer 14a and platinum layer 15a are formed on the diffusion preventing layer 77, TiN/Ti layers 25 and tungsten plugs 26 by the sputter method. A resist 78 is formed in predetermined regions on the platinum layer 15a by the photolithography.

Using the resist 78 as a mask, the sputter etching is carried out with insert gas such as Ar to form structures shown in FIG. 51. Thus, the capacitor lower electrode layers 15, barrier layers 14 and adhesion layers 71, which are patterned, are obtained, and the isolating trenches 73 which completely isolate the diffusion preventing layers 77a and 77b from each other are formed. After removing the resist 78, the TiN layers 14b and the Ti Layers 71b are oxidized using the capacitor lower electrode layers 15 made of platinum layers as a mask. Thereby, the adhesion layers 72 made of TiO$_2$ are completed as shown in FIG. 48. Thereafter, the high dielectric film 15, capacitor upper electrode layer 16 and interlayer insulating film 17 are formed. The aluminum interconnections 18, protection film 19 and aluminum interconnection 20 are formed on the interlayer insulating film 17. In this manner, the DRAM of the twelfth embodiment is completed.

Figure 52:
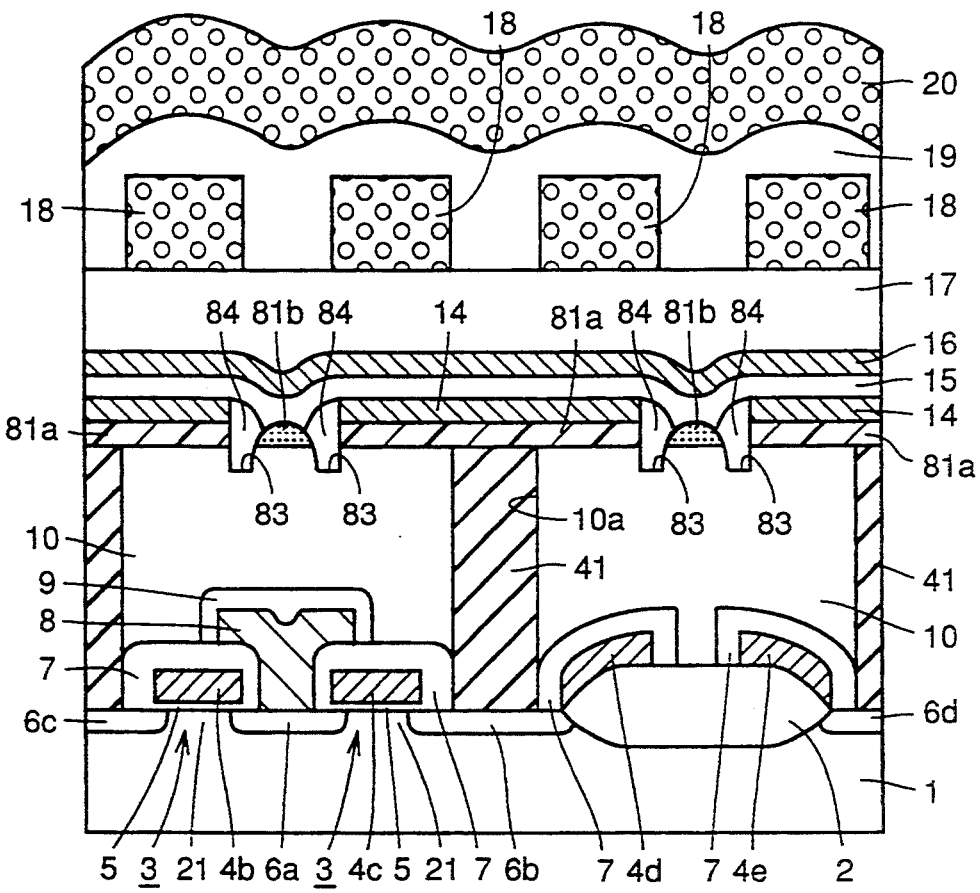
FIG. 52 is a cross section showing a DRAM of a thirteenth embodiment of the invention.

Referring to FIG. 52, a thirteenth embodiment is a modification of the tenth embodiment shown in FIG. 37. This thirteenth embodiment differs from the tenth embodiment in that the plug electrode is formed only of the barrier plug 41 made of TiN. Thereby, the barrier layer 13 in the eleventh embodiment (FIG. 37) is not required, and thus a difference in level at a region including the capacitor lower electrode layer 14 can be reduced compared with the tenth embodiment. Similarly to the tenth embodiment, the thirteenth embodiment includes isolating trenches 83 which completely isolate adhesion layers 81b made of TiO$_2$ and adhesion layers 81a made of Ti from each other. The isolating trenches 83 are filled with side wall oxide films 84 made of silicon oxide films. Thereby, the adhesion layers 81a and 81b can be isolated completely from each other. As a result, electric charges accumulated in the capacitor lower electrode layer 14 are effectively prevented from leaking to an adjacent capacitor through the adhesion layers 81a and 81b.

Referring to FIGS. 53 to 57, a process of manufacturing the thirteenth embodiment will be described below.

Figure 53:
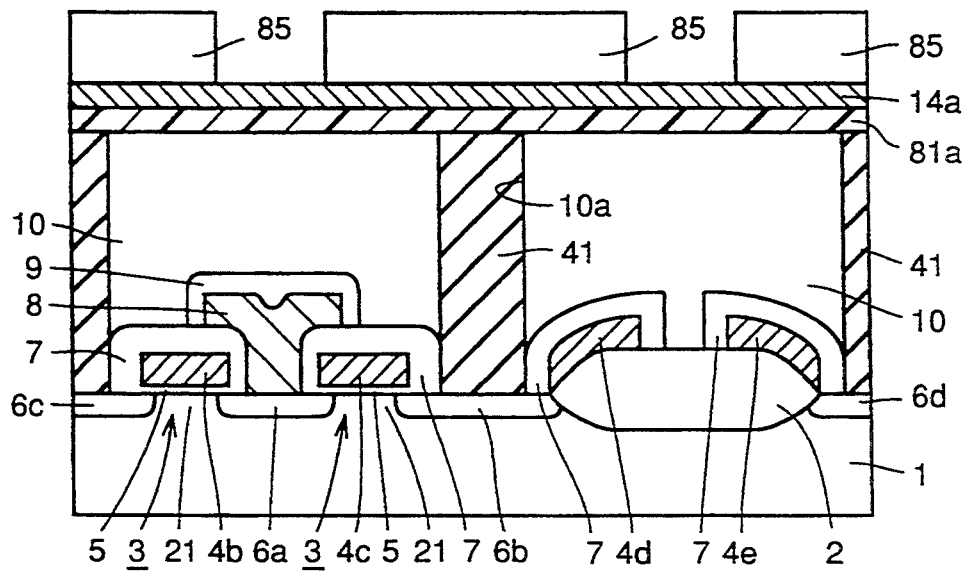
FIGS. 53 to 57 are cross sections showing 1st to 5th steps in a process for manufacturing the DRAM of the thirteenth embodiment shown in FIG. 52, respectively.
Figure 54:
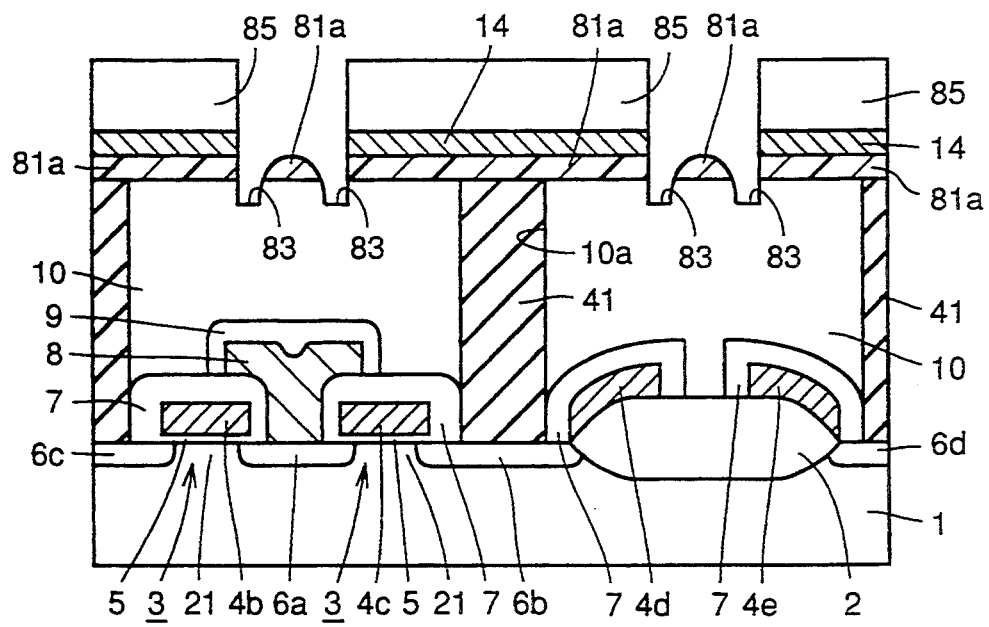
Figure 55:
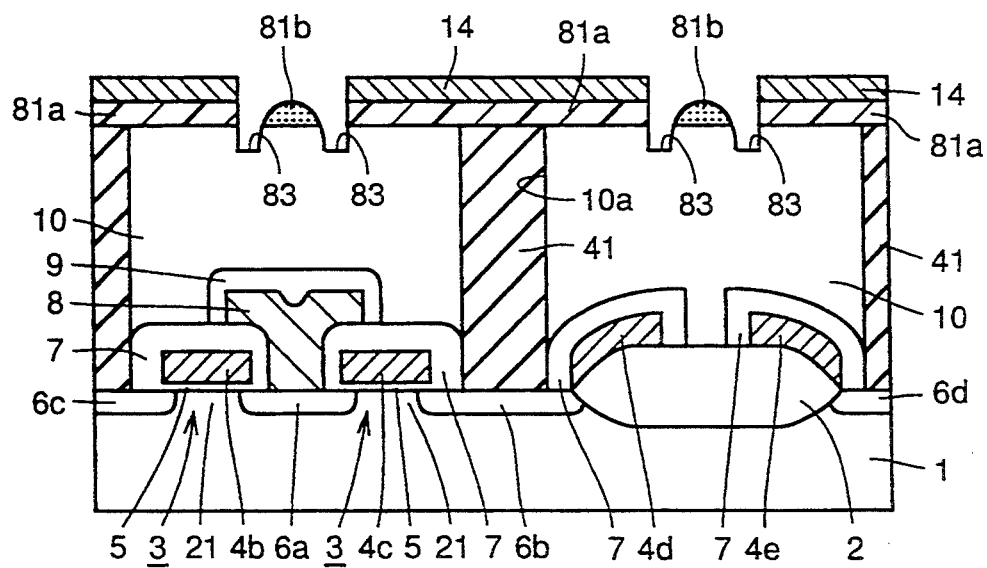

As shown in FIG. 53, the element isolating oxide film 2, gate electrodes 4b–4e, buried bit line 8 and others are formed on the silicon substrate 1, and then the CVD method is used to form the interlayer insulating film 10 having a thickness of about 5000 to about 15000 Å and made of the silicon oxide film. After forming the contact holes 10a at predetermined regions in the interlayer insulating film 10, the barrier plugs 41 made of TiN and filling the contact holes 10a are formed. An adhesion layer 81a having a thickness of about 50 to about 500 Å and made of Ti is formed on the interlayer insulating film 10 and the barrier plugs 41 by the sputter method. The platinum layer 14a having a thickness of about 250 to about 1500 Å is formed on the adhesion layer 81a by the sputter method. A resist 85 is formed in predetermined regions on the platinum layer 14a by the photolithography. Using the resist 85 as a mask, sputter etching is carried out with insert gas such as Ar to form the structure shown in FIG. 54, in which the isolating trenches 83 are formed at portions beside the resist 85 and the Ti layers 81a remain on other portions. Thereafter, the resist 85 is removed. Using the capacitor lower electrode layers 14 made of platinum layers as a mask, oxidation is carried out at a temperature from 350° to 700° C. for 10 to 60 minutes in an oxygen atmosphere. Thereby, the adhesion layers 81b made of TiO$_2$ are formed as shown in FIG. 55.

Figure 56:
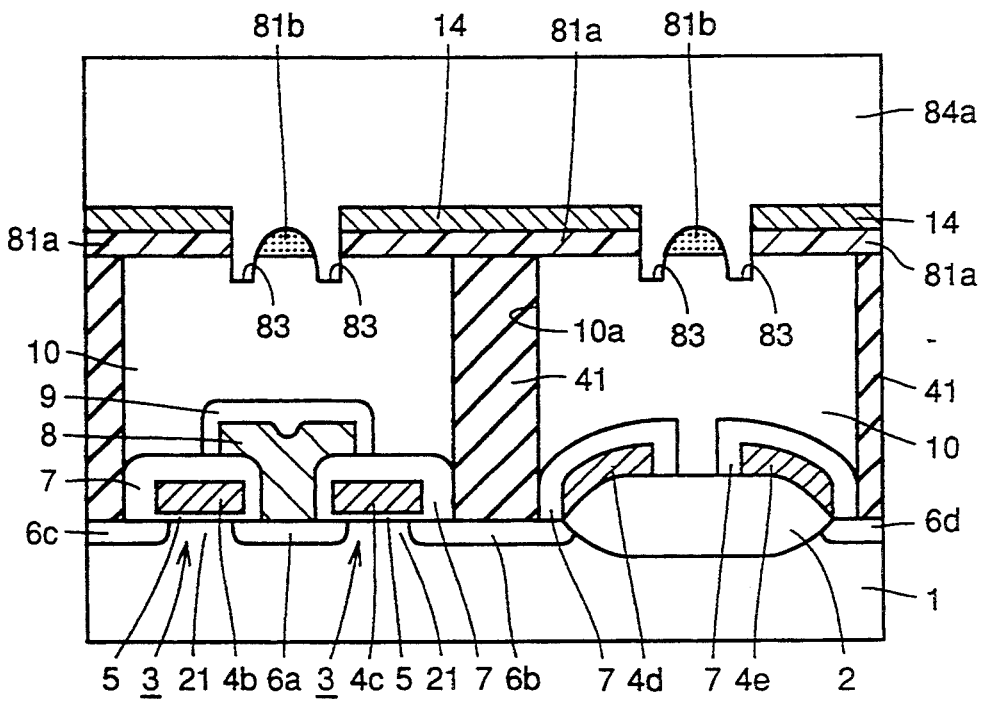
Figure 57:
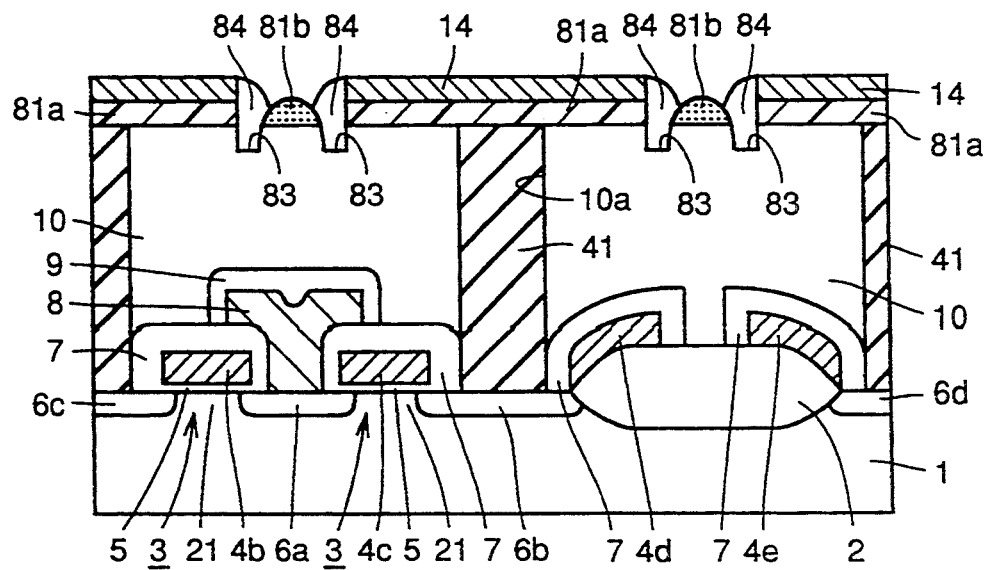

Then, as shown in FIG. 56, a silicon oxide film 84a having a thickness of about 500 to about 5000 Å is formed by the CVD method at a temperature of 400° to 900° C. Anisotropic etching is effected on the whole surface of the silicon oxide film 84a to form the side wall oxide films 84 as shown in FIG. 57. The side wall oxide films 84 are located on the side walls of the adhesion layers 81a and capacitor lower electrode layers 14 and fill the isolating trenches 83. In this manner, the adhesion layers 81a made of Ti and the adhesion layers 81b made of TiO$_2$ are formed in a completely isolated form.

Finally, as shown in FIG. 52, one forms the highly dielectric film 15, capacitor upper electrode layer 16, interlayer insulating film 17, aluminum interconnections 18, protection film 19 and aluminum interconnection 20. Thereby, the DRAM of the thirteenth embodiment is completed.

Figure 58:
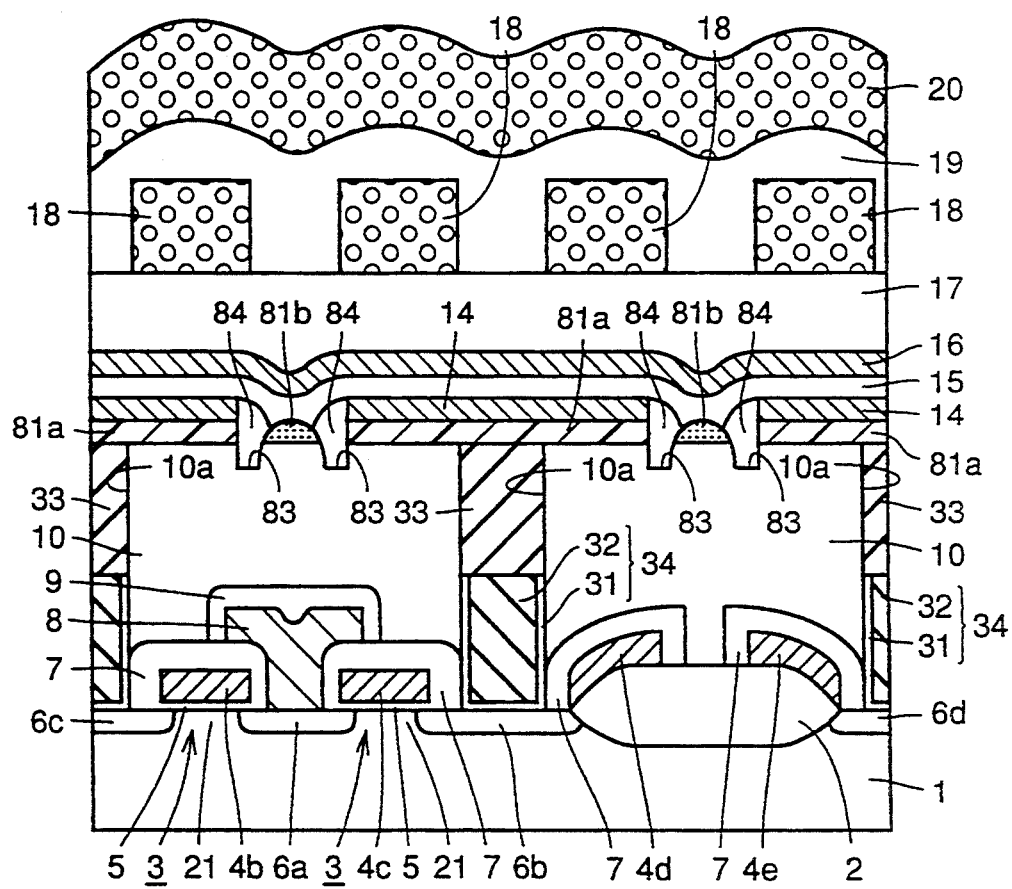
FIG. 58 is a cross section showing a DRAM of a fourteenth embodiment of the invention.

Referring to FIG. 58, a fourteenth embodiment is a modification of a plug electrode part of the DRAM of the thirteenth embodiment shown in FIG. 52. In this fourteenth embodiment, the plug electrode is formed of the contact plug 34, which is formed of the TiN/Ti layer 31 and the tungsten plug 32, and the barrier plug 33 made of TiN. This structure can also achieve an effect similar to that of the thirteenth embodiment shown in FIG. 52.

Figure 59:
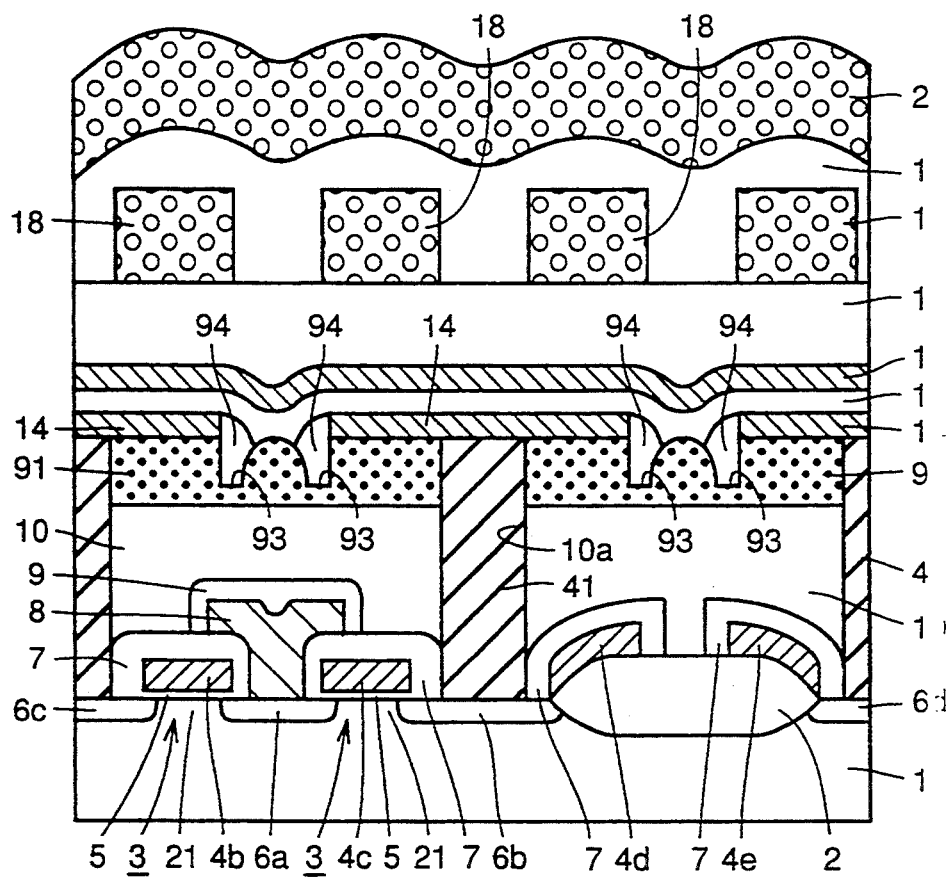
FIG. 59 is a cross section showing a DRAM of a fifteenth embodiment of the invention.

Referring to FIG. 59, a fifteenth embodiment includes the structures of the fourth embodiment shown in FIG. 21, and additionally includes isolating trenches 93 and side wall oxide films 94. In this fifteenth embodiment, an adhesion layer 91 made of TiO$_2$, ZrO$_2$, Al$_2$O$_3$, Ta$_2$O$_5$ or Si$_3$N$_4$ is formed on the interlayer insulating film 10 made of the silicon oxide film, and the isolating trenches 93 are formed in the adhesion layer 91. The side wall oxide films 94 which fill the isolating trenches 93 are formed on the side walls of the capacitor lower electrode layers 14. In this fifteenth embodiment, since the adhesion layer 91 is formed by the CVD method and has a completely insulating property, it is not necessary to isolate completely the adhesion layer 91 by the isolating trenches 93. Formation of such isolating trenches 93, however, increases a length of a surface portion of the adhesion layer 91 located between the adjacent capacitor lower electrode layers 14. Thereby, electric charges accumulated in the capacitor lower electrode layers 14 are effectively prevented from leaking into the adjacent capacitors through the surface of the adhesion layer 91.

Referring to FIGS. 60 to 63, a process of manufacturing the fifth embodiment will be described below.

Figure 60:
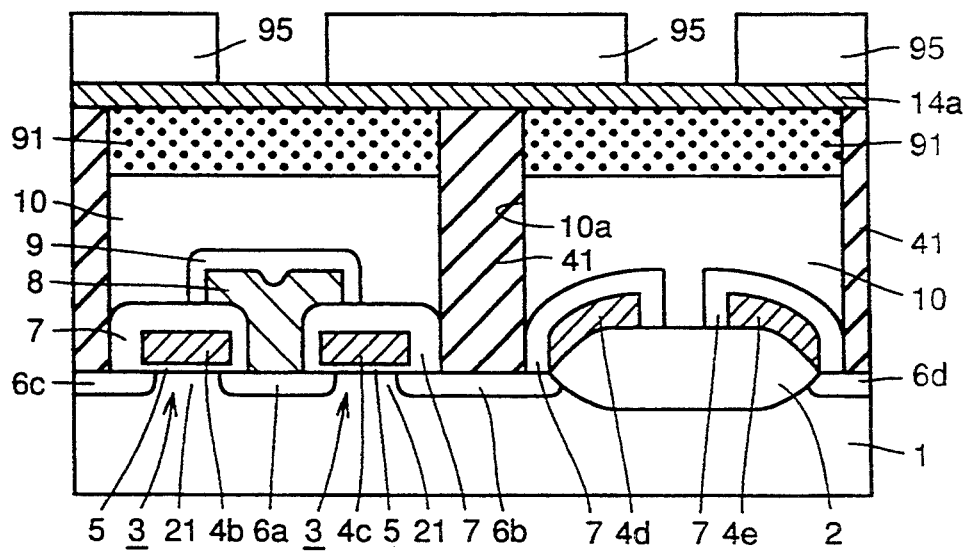
FIGS. 60 to 63 are cross sections showing 1st to 4th steps in a process for manufacturing the DRAM of the fifteenth embodiment shown in FIG. 59, respectively.
Figure 61:
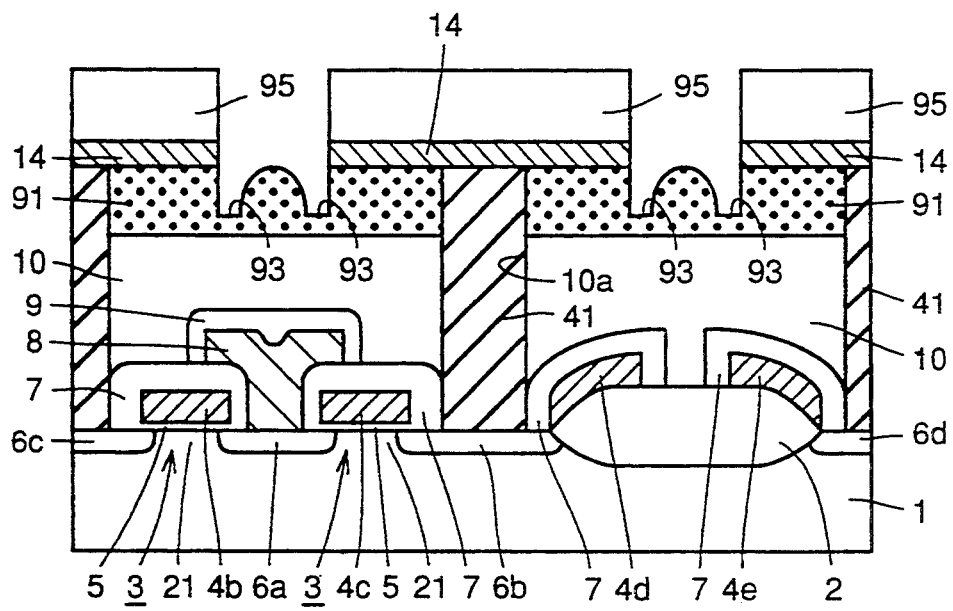

As shown in FIG. 60, a process similar to the manufacturing process of the fourth embodiment shown in FIGS. 22 and 23 are carried out to form the adhesion layer 91 having a thickness of about 300 to about 5000 Å and the barrier plugs 41. Thereafter, the platinum layer 14a having a thickness of about 250 to about 1500 Å is formed by the sputter method. A resist 95 is formed in predetermined regions on the platinum layer 14a by the photolithography. Using the resist 95 as a mask, sputter etching is carried out with Ar to form the isolating trenches 93 as shown in FIG. 61. The sputter etching may be carried out to form deep isolating trenches 93 which completely separate the adhesion layer 91 into several portions. Thereafter, the resist 95 is removed.

Figure 62:
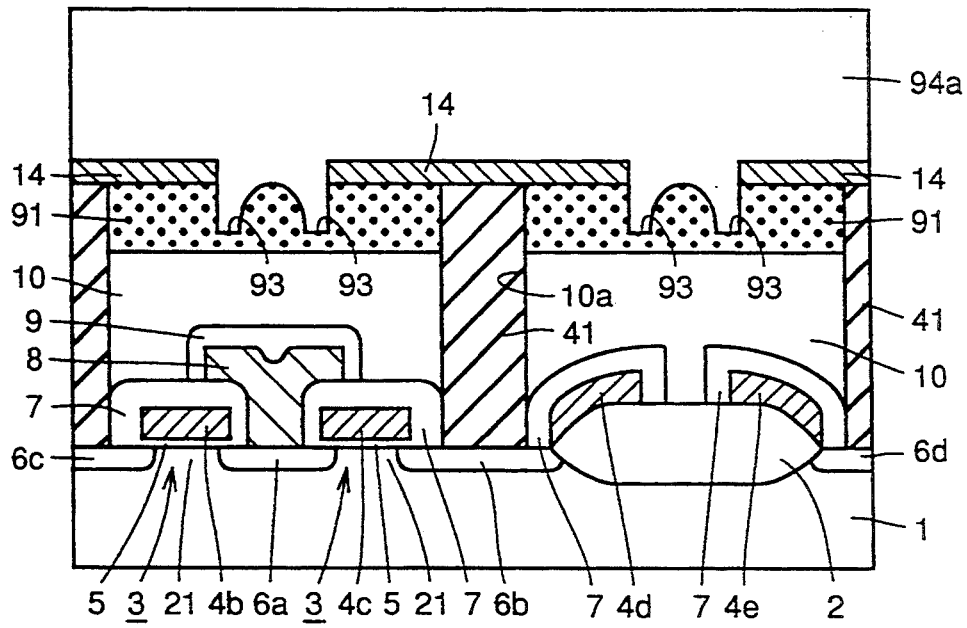
Figure 63:
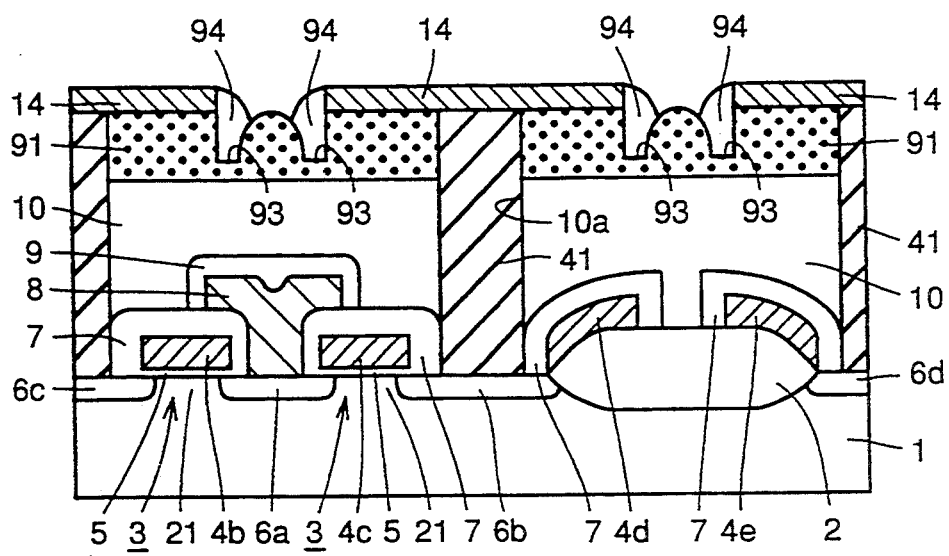

As shown in FIG. 62, a silicon oxide film 94a having a thickness of about 500 to about 5000 Å is formed at a temperature of 400° to 900° C. by the CVD method. Anisotropic etching is effected on the silicon oxide film 94a to form the side wall oxide films 94 as shown in FIG. 63.

Finally, as shown in FIG. 59, the highly dielectric film 15, capacitor upper electrode layer 16, interlayer insulating film 17, aluminum interconnections 18, protection film 19 and aluminum interconnection 20 are formed. Thereby, the DRAM of the fifteenth embodiment is completed.

Figure 64:
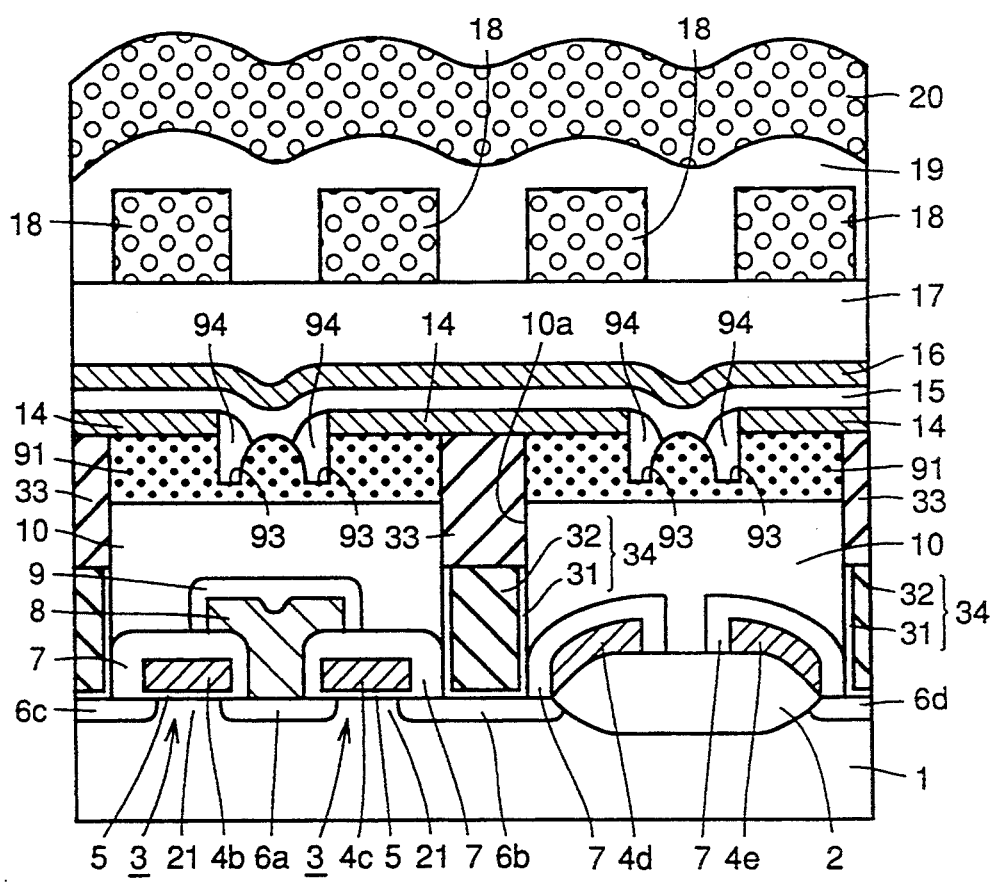
FIG. 64 is a cross section showing a DRAM of a sixteenth embodiment of the invention.

Referring to FIG. 64, a sixteenth embodiment is a modification of a plug electrode part of the DRAM of the fifteenth embodiment shown in FIG. 59. In this sixteenth embodiment, the plug electrode is formed of the contact plug 34, which is formed of the TiN/Ti layer 31 and the tungsten plug 32, and the barrier plug 33 made of TiN. This structure can also achieve an effect similar to that of the fifteenth embodiment.

Figure 65:
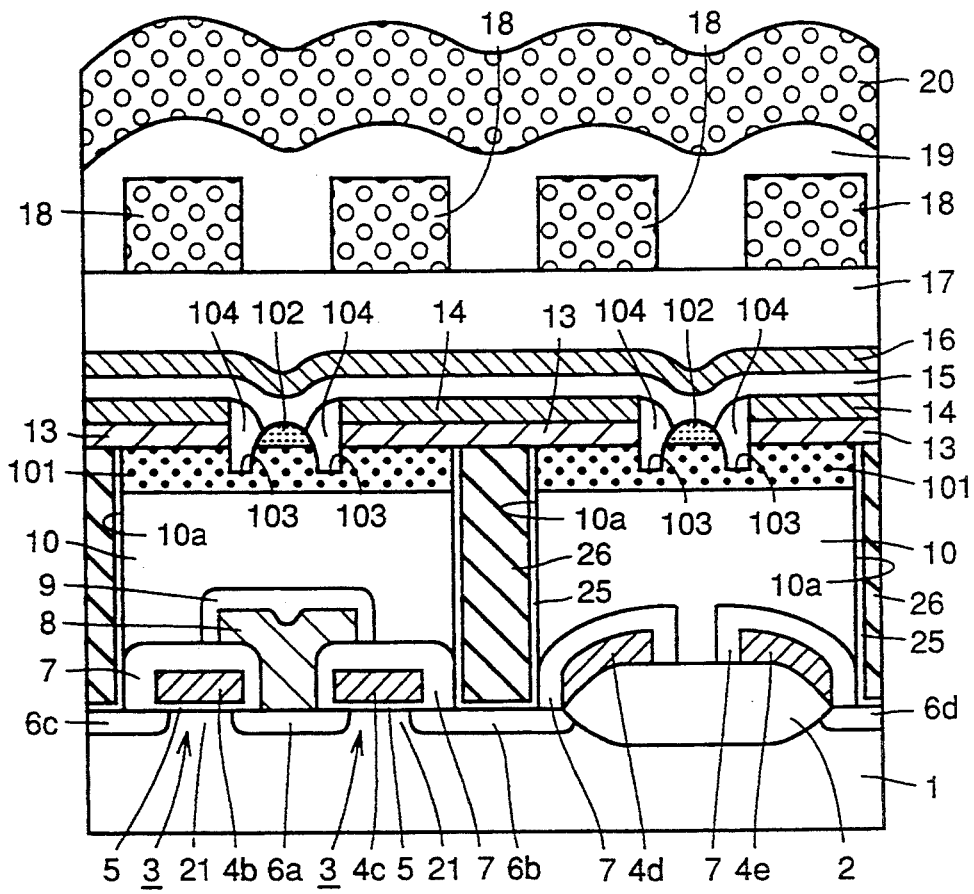
FIG. 65 is a cross section showing a DRAM of a seventeenth embodiment of the invention.

Referring to FIG. 65, a seventeenth embodiment differs from the fifteenth and sixteenth embodiments in that the plug electrode part is not provided with the barrier plug. Therefore, the barrier layers 13 made of TiN are required, which is different from the fifteenth and sixteenth embodiments. The seventeenth embodiment further includes adhesion layers 102 made of $TiO_2$ and interposed between an adhesion layer 101 and the highly dielectric film 15. The adhesion layer 102 is completely isolated by isolating trenches 103, which are filled with side wall oxide films 104 made of silicon oxide films.

In this seventeenth embodiment, since the adhesion layer 102 may not have a completely insulating property by a reason relating to the manufacturing process, it is necessary to isolate completely the adhesion layer 102 and the barrier layer 13 from each other by the isolating trench 103. Meanwhile, the adhesion layer 101, which is manufactured by the CVD method, has a completely insulating property, so that it is not necessary to isolate completely the adhesion layer 101 by the isolating trench 103. This embodiment having the above structures can effectively prevent the leak of electric charges accumulated in the capacitor lower electrode layer 14 to an adjacent capacitor through the barrier layer 13 and adhesion layers 101 and 102.

Also in this seventeenth embodiment, adhesion between the high dielectric film 15 and the interlayer insulating film 10 made of the silicon oxide film is improved owing to provision of the adhesion layers 102 and 101. Further, the adhesion layer 101 improves the adhesion between the capacitor lower electrode layers 14 and the interlayer insulating film 10.

Referring to FIGS. 66 to 70, a process of manufacturing the DRAM of the seventeenth embodiment will be described below.

Figure 66:
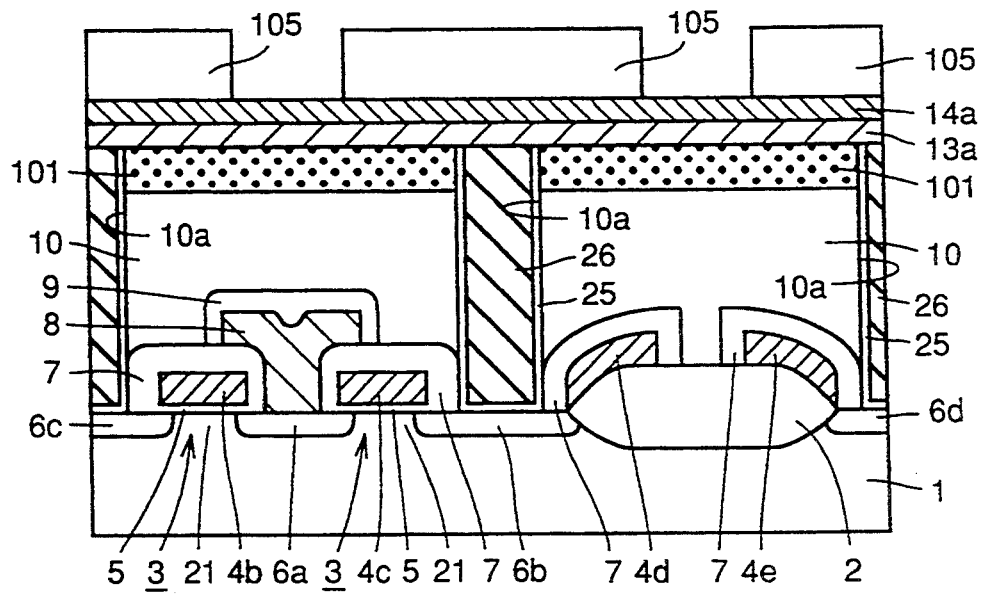
FIGS. 66 to 70 are cross sections showing 1st to 5th steps in a process for manufacturing the DRAM of the seventeenth embodiment shown in FIG. 65, respectively.

As shown in FIG. 66, a process similar to that of manufacturing the DRAM of the second embodiment shown in FIGS. 12 and 13 is carried out to from the adhesion layer 101 having a thickness of about 300 to about 5000 Å and made of $TiO_2$ as well as the TiN/Ti layers 25 and the tungsten plugs 26. The TiN layer 13a having a thickness of about 50 to about 500 Å is formed by the sputter method at a temperature in a range from the room temperature to 800° C. The platinum layer 14a having a thickness of about 250 to about 1500 Å is formed on the TiN layer 13a by the sputter method at a temperature in a range from the room temperature to 800° C. A resist 105 is formed in predetermined regions on the platinum layer 14a by photolithography.

Figure 67:
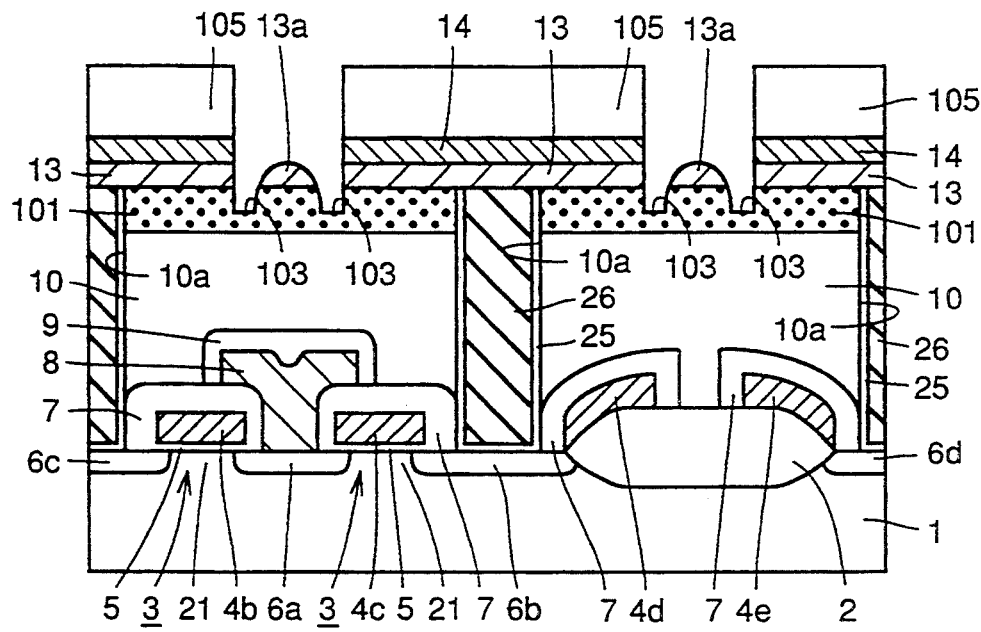

Sputter etching is carried out with insert gas such as Ar using the resist 105 as a mask, whereby a configuration shown in FIG. 67 is obtained. Thus, the isolating trenches 103 and the TiN layers 13a left between the isolating trenches 103 are obtained by the sputter etching with the inert gas. Thereafter, the resist 105 is removed.

Figure 68:
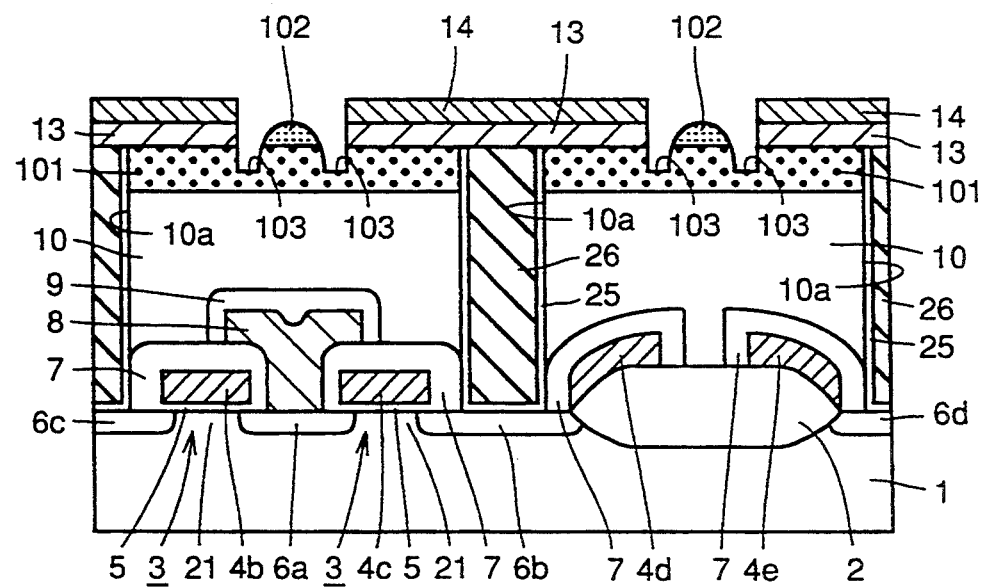

As shown in FIG. 68, using the capacitor lower electrode layers 14 made of platinum layers as a mask, the TiN layers 13a (FIG. 67) are oxidized in oxygen atmosphere for 10 to 60 minutes at a temperature from 350° to 700° C., whereby the adhesion layers 102 made of $TiO_2$ are obtained.

Figure 69:
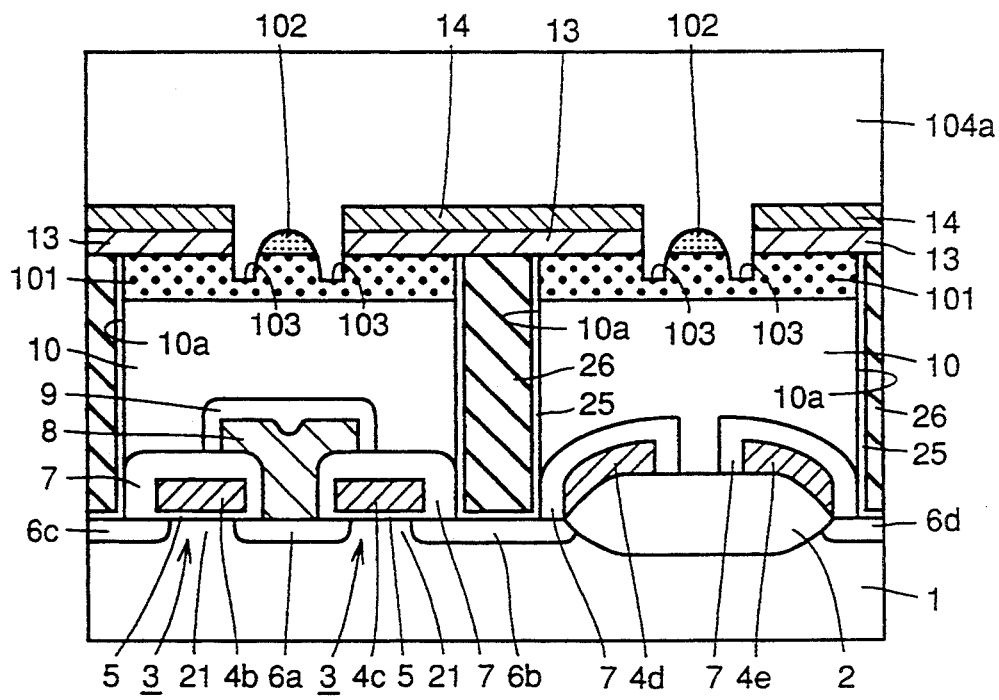
Figure 70:
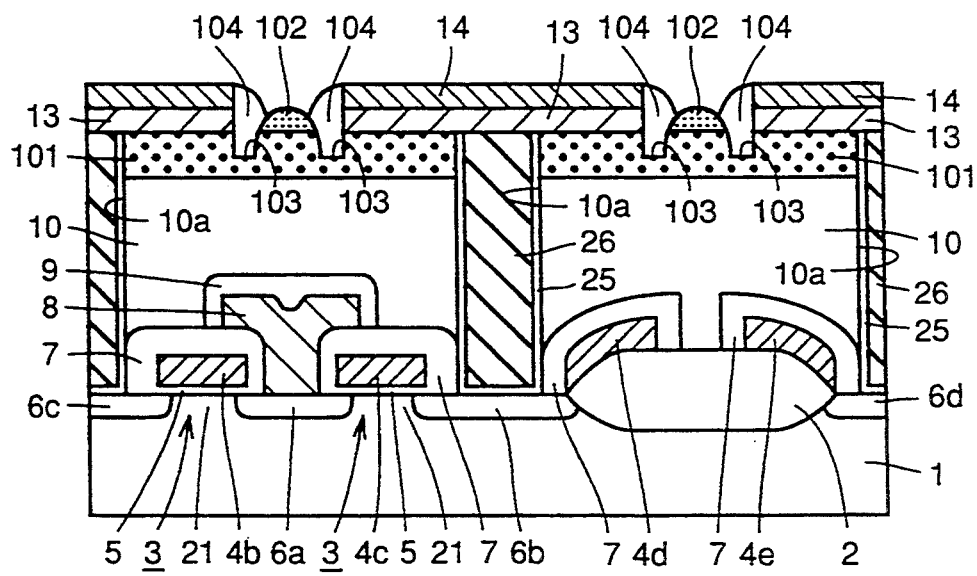
Figure 71:
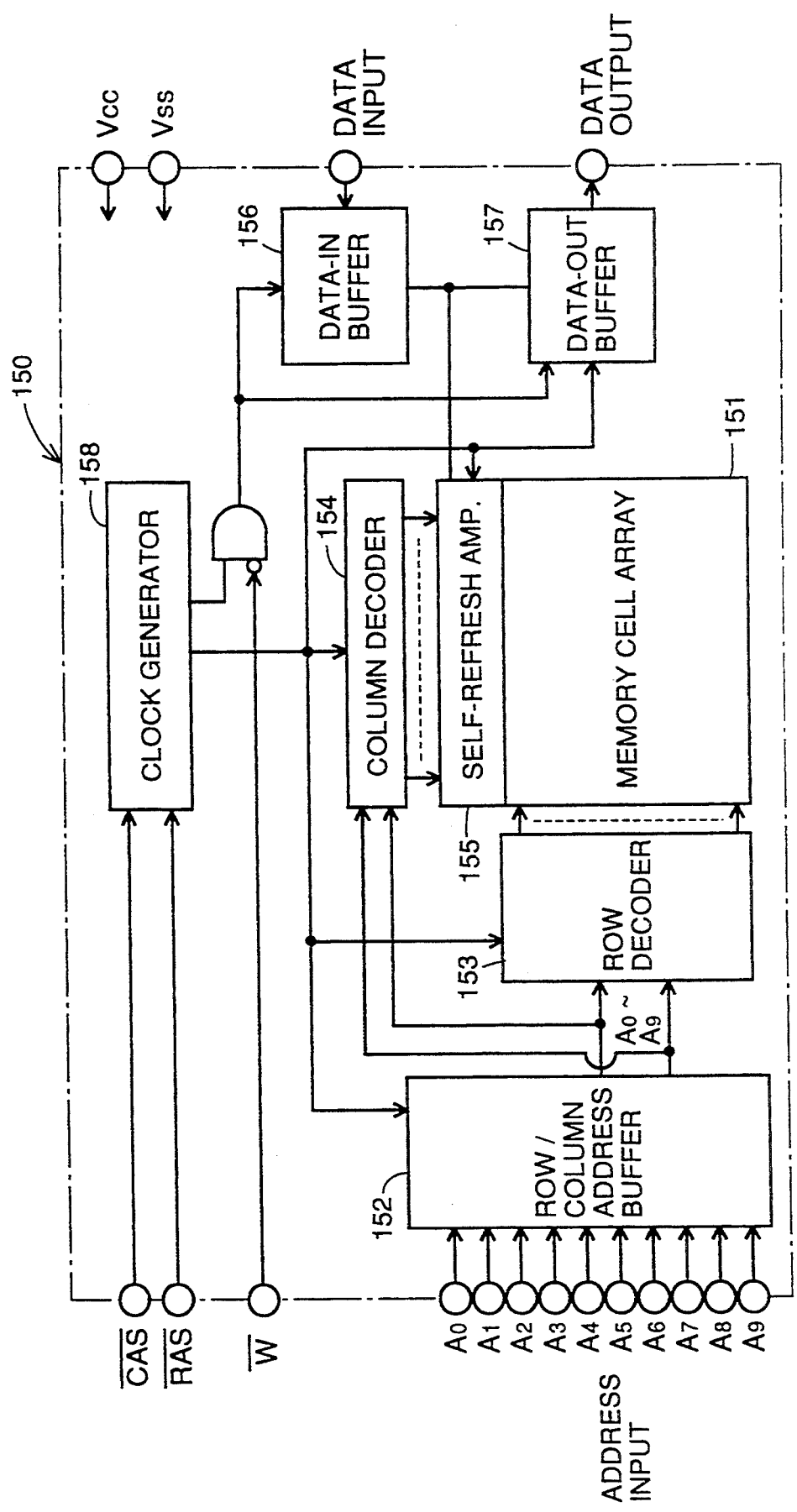
FIG. 71 is block diagram showing a conventional structure of a DRAM in the prior art.
Figure 72:
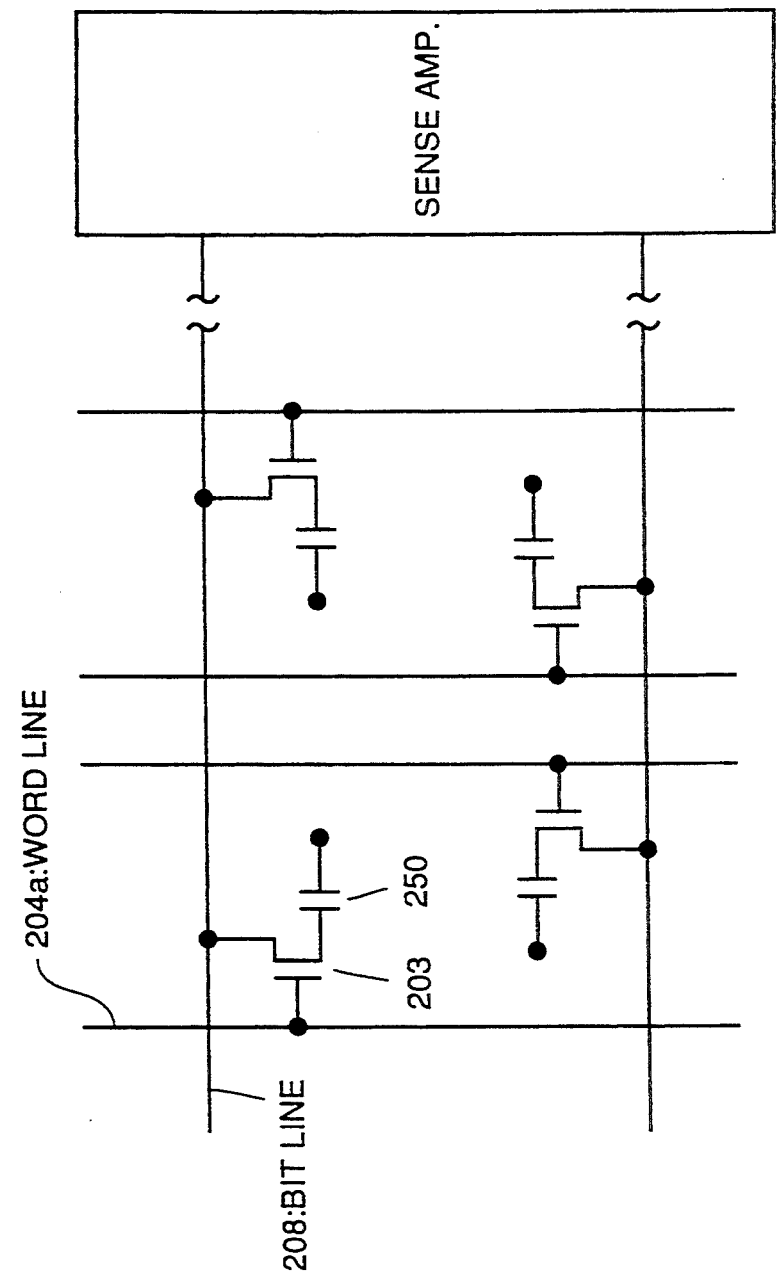
FIG. 72 is an equivalent circuit diagram showing components for four bits in the memory cell array in FIG. 71.

A shown in FIG. 69, a silicon oxide film 104a having a thickness of about 500 to about 5000 Å is formed at a temperature of 400° to 900° C. by the CVD method. Anisotropic etching is effected on the whole surface of the silicon oxide film 104a to form the side wall oxide films 104 as shown in FIG. 70.

Finally, as shown in FIG. 65, the highly dielectric film 15, capacitor upper electrode layer 16, interlayer insulating film 17, aluminum interconnections 18, protection film 19 and aluminum interconnection 20 are formed. Thereby, the DRAM of the seventeenth embodiment is completed.

According to the semiconductor device of an aspect of the invention, as described hereinbefore, the adhesion layer made of material which has a good adhesion property at least with respect to the interlayer insulating film and the capacitor dielectric film is formed at least between the interlayer insulating film and the capacitor dielectric film, whereby good adhesion can be obtained between the interlayer insulating film and the capacitor dielectric film. Thereby, such a disadvantage in the prior art can be prevented that the capacitor dielectric film is isolated from the interlayer insulating film and thus the reliability of the capacitor deteriorates. In the structure in which the above mentioned adhesion layer extends to a position between the interlayer insulating film and the capacitor lower electrode, the adhesion between the capacitor lower electrode and the interlayer insulating film can also be improved. In the structure in which at least a region of the plug electrode located at the side of the capacitor lower electrode contains metal nitride of a high melting point, the barrier layer which is required under the capacitor lower electrode in the prior art can be eliminated. Thereby, a difference in level at a region including the capacitor lower electrode can be reduced as compared with the prior art.

According to the semiconductor device of another aspect, there is provided the isolating trench between the first adhesion layer, which is interposed between the interlayer insulating film and the capacitor dielectric film, and the second adhesion layer, which is interposed between the interlayer insulating film and the capacitor lower electrode. Thereby, it is possible to prevent effectively the leak of electric charges accumulated in the capacitor lower electrode to the adjacent capacitor through the first and second adhesion layers. Also, the first adhesion layer can achieve good adhesion between the capacitor dielectric film and the interlayer insulating film, and the second adhesion layer can achieve the good adhesion between the capacitor lower electrode and the interlayer insulating film. In the structure in which the side wall insulating film filling the isolating trench is formed on the side wall of the capacitor lower electrode, the first and second adhesion layers can be isolated further completely.

According to the method of manufacturing the semiconductor device of an aspect of the invention, the adhesion layer made of the insulating material is formed on the interlayer insulating layer, and the capacitor dielectric film covering the capacitor lower electrode and made of material having a high dielectric constant is formed on the adhesion layer and the capacitor lower electrode. Therefore, good adhesion between the capacitor dielectric film and the interlayer insulating film can be obtained.

According to the method of manufacturing the semiconductor device of another aspect, the first adhesion layer is formed on the interlayer insulating film, the capacitor lower electrode is formed on the first adhesion layer, the second adhesion layer is formed in a region on the interlayer insulating film not bearing the capacitor lower electrode, and the capacitor dielectric film made of material having a high dielectric constant is formed on the second adhesion layer and the capacitor lower electrode. Therefore, the second adhesion layer can improve the adhesion between the capacitor dielectric film and the interlayer insulating film, and the first adhesion layer can improve the adhesion between the capacitor lower electrode and the interlayer insulating film.

According to the method of manufacturing the semiconductor device of still another aspect, the first adhesion layer is formed on the interlayer insulating film, the etching mask is formed in a predetermined region on the first adhesion layer, sputter etching is effected on the first adhesion layer using the above etching mask and insert gas to form the isolating trench between a region of the first adhesion layer bearing the etching mask and a region of the first adhesion layer not bearing the etching mask, and the first adhesion layer in the region not bearing the etching mask is oxidized or nitrided to form the second adhesion layer. Therefore, the semiconductor device in which the first and second adhesion layers are completely isolated by the isolating trench can be manufactured easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate;
   an interlayer insulating film formed entirely directly on said semiconductor substrate and being provided at a predetermined region with an opening reaching said semiconductor substrate;
   a plug electrode making electrical contact in said opening with said semiconductor substrate and filling said opening;
   a capacitor lower electrode formed on said plug electrode and said interlayer insulating film and electrically connected to said plug electrode;
   a capacitor dielectric film made of a material having a high dielectric constant, formed on said capacitor lower electrode and said interlayer insulating film and covering said capacitor lower electrode; and
   a capacitor upper electrode formed on said capacitor dielectric film; wherein
   an adhesion layer is formed at least between said interlayer insulating film and said capacitor dielectric film, said adhesion layer being in direct surface contact with said capacitor dielectric film and made of a material which has a good adhesion property with respect to at least said interlayer insulating film and said capacitor dielectric film, and wherein at least a portion of said adhesion layer extends under a portion of said capacitor lower electrode.

2. The semiconductor device according to claim 1, wherein
   said adhesion layer is extended to a position between said interlayer insulating film and said capacitor lower electrode.

3. The semiconductor device according to claim 1, wherein
   at least a region of said plug electrode at a side of said capacitor lower electrode contains a material selected from the group consisting of a metal having a high melting point and a metal nitride having a high melting point.

4. The semiconductor device according to claim 1, wherein
   said capacitor lower electrode is made of noble metal having a high melting point.

5. The semiconductor device according to claim 1, wherein
   said adhesion layer is formed only of an insulating layer.

6. A semiconductor device comprising:
   a semiconductor substrate;
   an interlayer insulating film formed on said semiconductor substrate and being provided at a predetermined region with an opening reaching said semiconductor substrate;
   a plug electrode making electrical contact in said opening with said semiconductor substrate and filling said opening;
   a capacitor lower electrode formed on said plug electrode and said interlayer insulating film and electrically connected to said plug electrode;
   a capacitor dielectric film made of a material having a high dielectric constant, formed on said capacitor lower electrode and said interlayer insulating film and covering said capacitor lower electrode; and
   a capacitor upper electrode formed on said capacitor dielectric film; wherein
   an adhesion layer is formed at least between said interlayer insulating film and said capacitor dielectric film, said adhesion layer made of a material which has a good adhesion property with respect to at least said interlayer insulating film and said capacitor dielectric film, wherein
   said adhesion layer includes a portion which is located under said capacitor dielectric film and is made of an insulating member, and said adhesion layer further includes a portion which is located under said capacitor lower electrode and is made of an electrically conductive layer.

7. The semiconductor device according to claim 6, wherein
   said insulating member is made of a material selected from the group consisting of an oxide and a nitride of said electrically conductive layer.

8. A semiconductor device comprising:
   a semiconductor substrate;

an interlayer insulating film formed on said semiconductor substrate and provided at a predetermined region with an opening reaching said semiconductor substrate;

a plug electrode making electrical contact in said opening with said semiconductor substrate and filling said opening;

a capacitor lower electrode formed on said plug electrode and said interlayer insulating film and electrically connected to said plug electrode;

a capacitor dielectric film made of a material having a high dielectric constant, formed on said capacitor lower electrode and said interlayer insulating film and covering said capacitor lower electrode;

a capacitor upper electrode formed on said capacitor dielectric film;

a first adhesion layer interposed between said interlayer insulating film and said capacitor dielectric film; and a second adhesion layer interposed between said interlayer insulating film and said capacitor lower electrode; wherein an isolating trench is formed between said first and second adhesion layers.

9. The semiconductor device according to claim 8, wherein a side wall insulating film filling said isolating trench is formed on a side wall of said capacitor lower electrode.

10. The semiconductor device according to claim 8, wherein said first adhesion layer is formed of an insulating member, and said second adhesion layer is formed of an electrically conductive layer.

11. The semiconductor device according to claim 8, wherein a diffusion preventing layer is formed at least between said first adhesion layer and said interlayer insulating film for preventing diffusion of alkaline metal contained in said capacitor dielectric film.

* * * * *